US008487653B2

(12) United States Patent
Tarng et al.

(10) Patent No.: US 8,487,653 B2
(45) Date of Patent: Jul. 16, 2013

(54) SDOC WITH FPHA AND FPXC: SYSTEM DESIGN ON CHIP WITH FIELD PROGRAMMABLE HYBRID ARRAY OF FPAA, FPGA, FPLA, FPMA, FPRA, FPTA AND FREQUENCY PROGRAMMABLE XTALESS CLOCKCHIP WITH TRIMLESS/TRIMFREE SELF-ADAPTIVE BANDGAP REFERENCE XTALESS CLOCKCHIP

(75) Inventors: Min Ming Tarng, San Jose, CA (US); Mei Jech Lin, San Jose, CA (US); Eric Yu-Shiao Tarng, San Jose, CA (US); Alfred Yu-Chi Tarng, San Jose, CA (US); Angela Yu-Shiu Tarng, San Jose, CA (US); Jwu-Ing Tarng, San Jose, CA (US); Huang-Chang Tarng, San Jose, CA (US); Shun-Yu Nieh, San Jose, CA (US)

(73) Assignee: Tang System, San Jose, CA (US)

( * ) Notice: Subject to any disclaimer, the term of this patent is extended or adjusted under 35 U.S.C. 154(b) by 819 days.

(21) Appl. No.: 12/422,719

(22) Filed: Apr. 13, 2009

(65) Prior Publication Data
US 2009/0243732 A1 Oct. 1, 2009

Related U.S. Application Data

(63) Continuation-in-part of application No. 11/500,125, filed on Aug. 5, 2006, now Pat. No. 7,525,392, and a continuation-in-part of application No. 11/593,271, filed on Nov. 6, 2006, now Pat. No. 7,511,589, and a continuation-in-part of application No. 12/291,984, filed on Nov. 14, 2008, now Pat. No. Plant 20,686.

(51) Int. Cl.
*H03K 19/177* (2006.01)
*H01L 25/00* (2006.01)

(52) U.S. Cl.
USPC .................................. 326/41; 326/38; 326/47

(58) Field of Classification Search
USPC .................................................. 326/37–41, 47
See application file for complete search history.

(56) References Cited

U.S. PATENT DOCUMENTS
2002/0019925 A1* 2/2002 Dewhurst et al. ................. 712/9
2004/0242261 A1* 12/2004 Fette .......................... 455/550.1

* cited by examiner

Primary Examiner — Shawki Ismail
Assistant Examiner — Jany Richardson

(57) ABSTRACT

The Anlinx™:LVLP Hybrid Analogic Field Programmable Array of Milinx™:Mixed Signal FPSC™ Field Programmable System Chip™ is constituted of Field Programmable Hybrid Array (FPHA and Frequency Programmable Xtaless Clock (FPXC) being for high-speed and high frequency System-Design-On-Chip(SDOC) embedded in a single chip of Field Programmable System Chip(FPSC™). The FPXC adopts the Self-Adaptive Process & Temperature Compensation Bandgap Reference Generator, the Gain-Boost Amplitude Control LC VCO and inverter type flash memory. The FPHA adopts the two-way flash switch and inverter type flash memory Look-Up-Table(LUT). The FPXC adopts the inverter type flash memory as the Non-Volatile Memory (NVM) to keep the setup data in the field frequency programming. The flash technology of FPHA and FPXC are compatible that the FPHA has the FPXC capability. The PLLess CDR(PLL free Clock Data Recovery) is based on the FPXC capability for the SerDes high frequency application. The PLLess CDR and pipeline ADC are for the analog front high frequency application. With the SDOC on FPHA, the Automobile Infotainment Center(MIC) is reduced to be Mobile Infotainment Center(MIC). The (1) Capacitorless Low Drop Voltage (Capless LDVR) (2) Inductor less Switch Mode Power Supply (Indless SMPS) (3) Resistorless Current Sensor (Resless CS), (4) Saw Filter Less Low Noise Amplifier (Sawless LNA), (5) Diode Less True Random Number Generator (Dioless TRNG), (6) Crystal Less Clock (Xtaless Clock), (7) PLL Less Clock and Data Recovery (PLLess CDR) and (8) Filmless Touching Screen (FLTS) constitutes the most advanced System Design On Chip (SDOC) on Field Programmable Hybrid Array (FPHA) for Mobile Infotainment Center (MIC).

20 Claims, 49 Drawing Sheets

FPHA/FPSC

FIG. 2A
FIG. 2B
FIG. 2C
Time Domain Pipeline
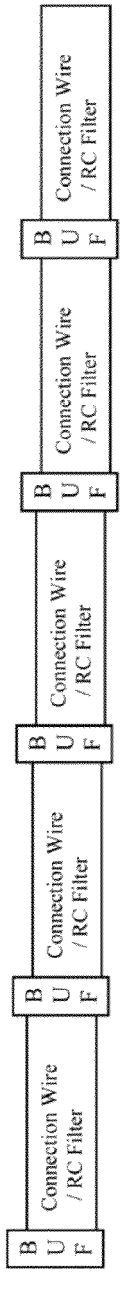
FIG. 2D
Frequency Domain Pipeline
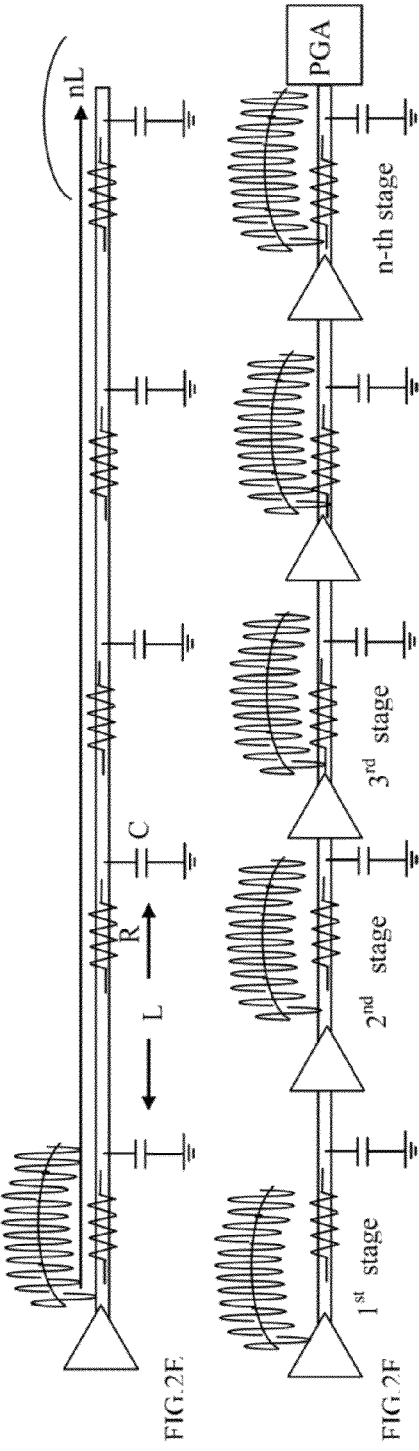
FIG. 2E
FIG. 2F

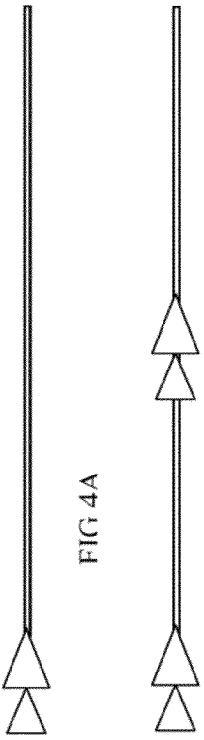
FIG. 4A
FIG. 4B
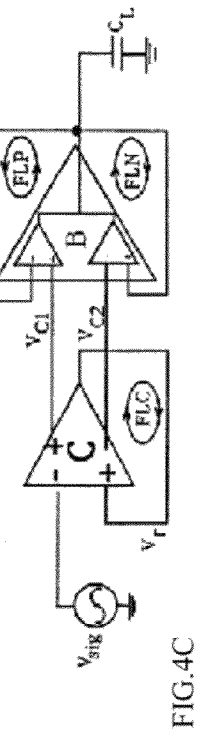
FIG. 4C
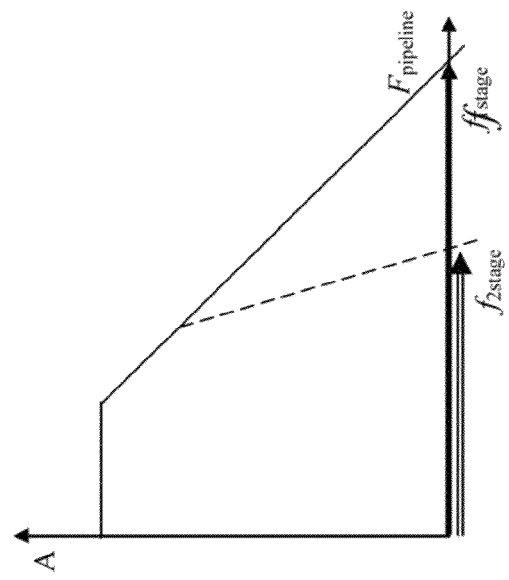
FIG. 4E
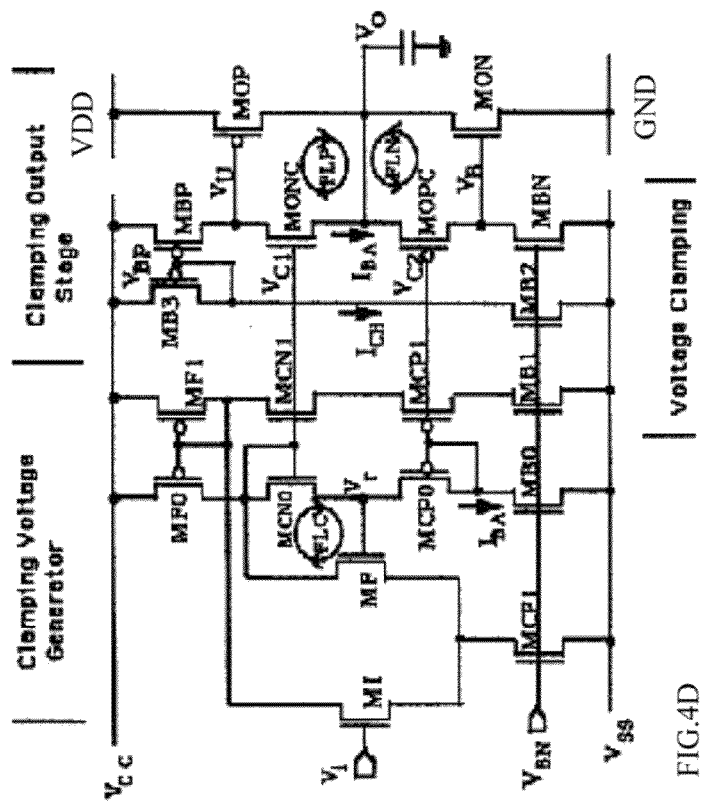
FIG. 4D

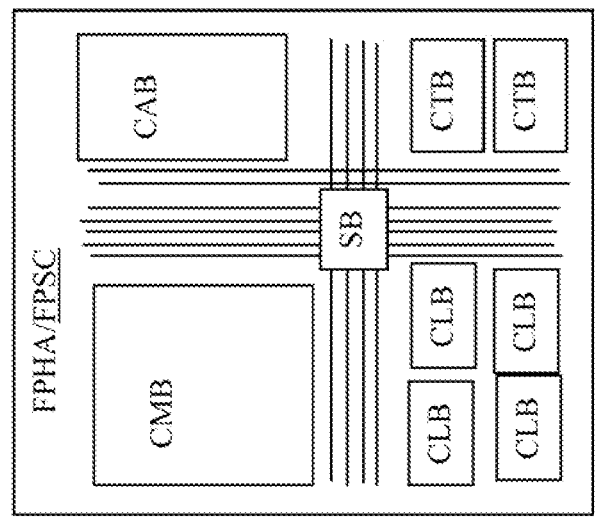
FIG.5E
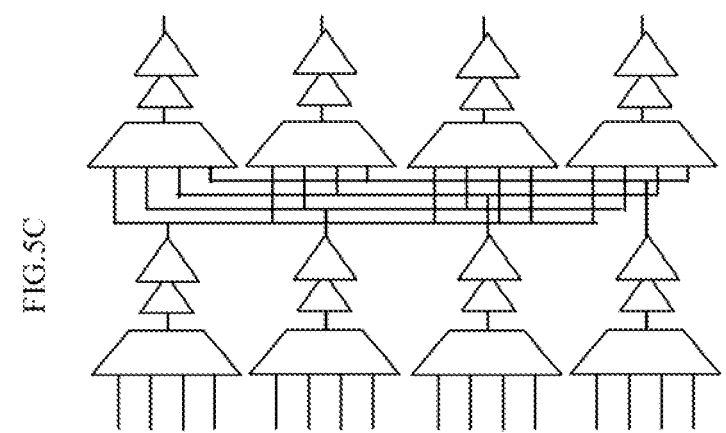
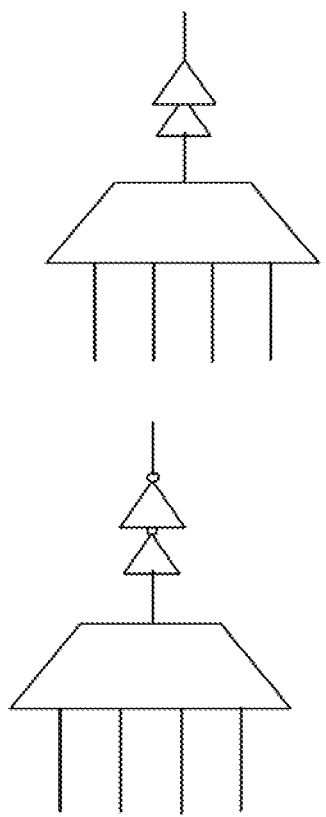
FIG.5C
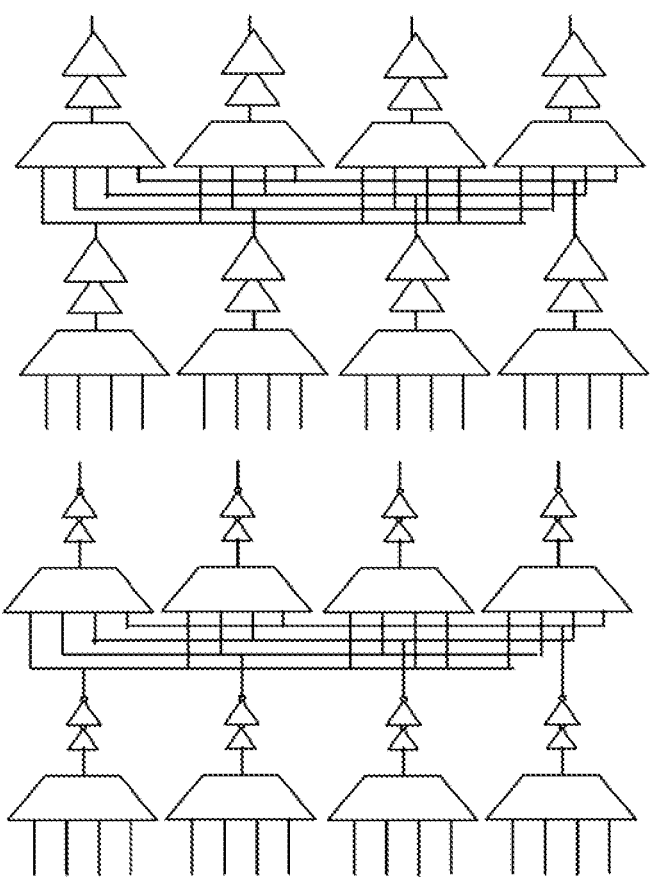
FIG.5A  FIG.5D  FIG.5B

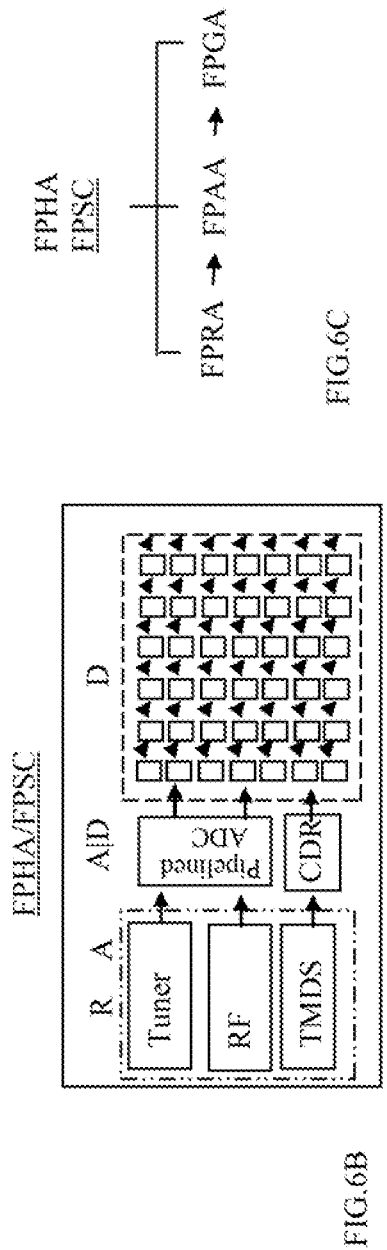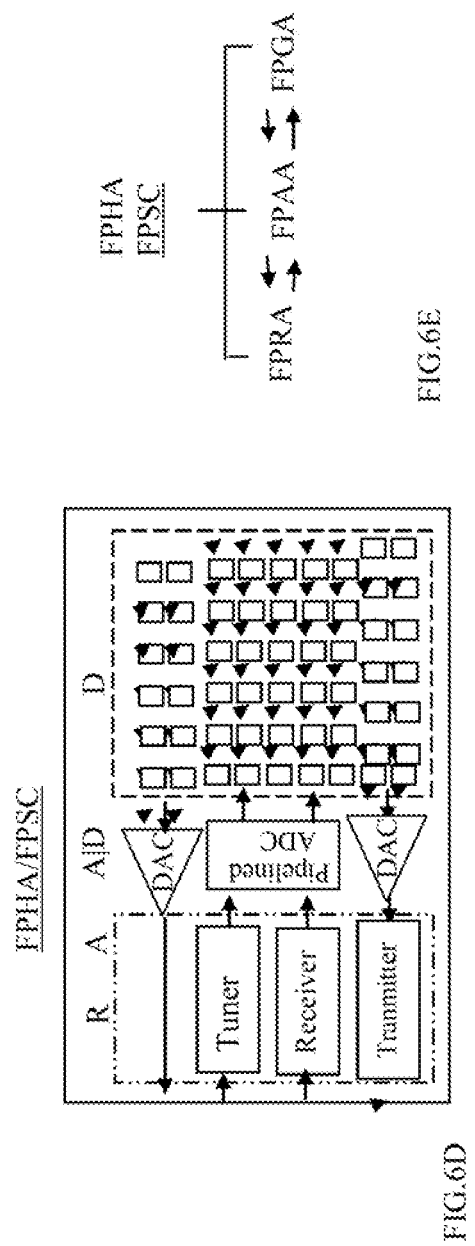

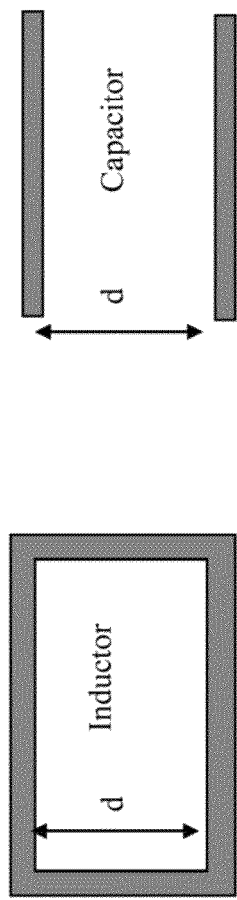
FIG.11A
FIG.11B
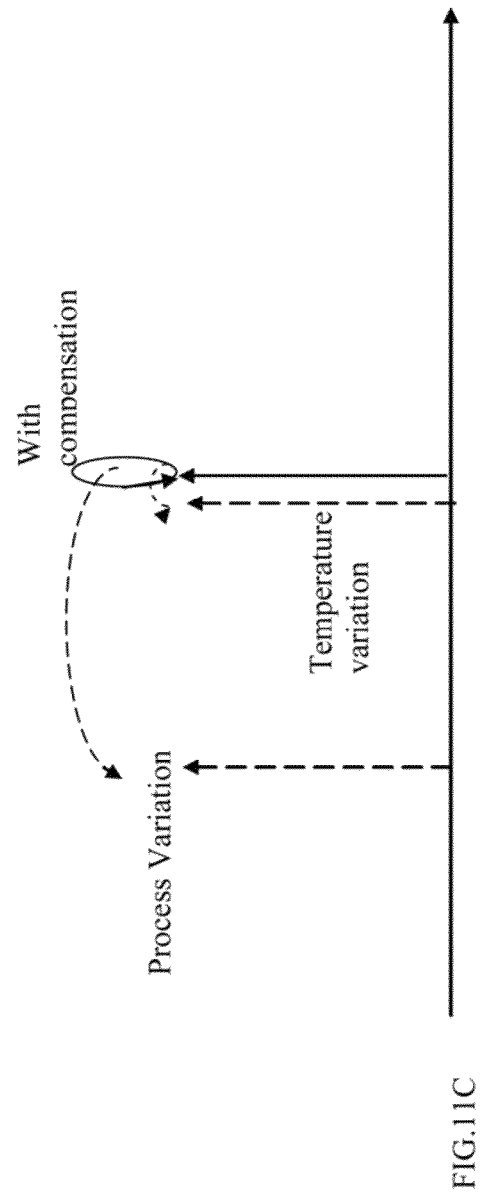
FIG.11C

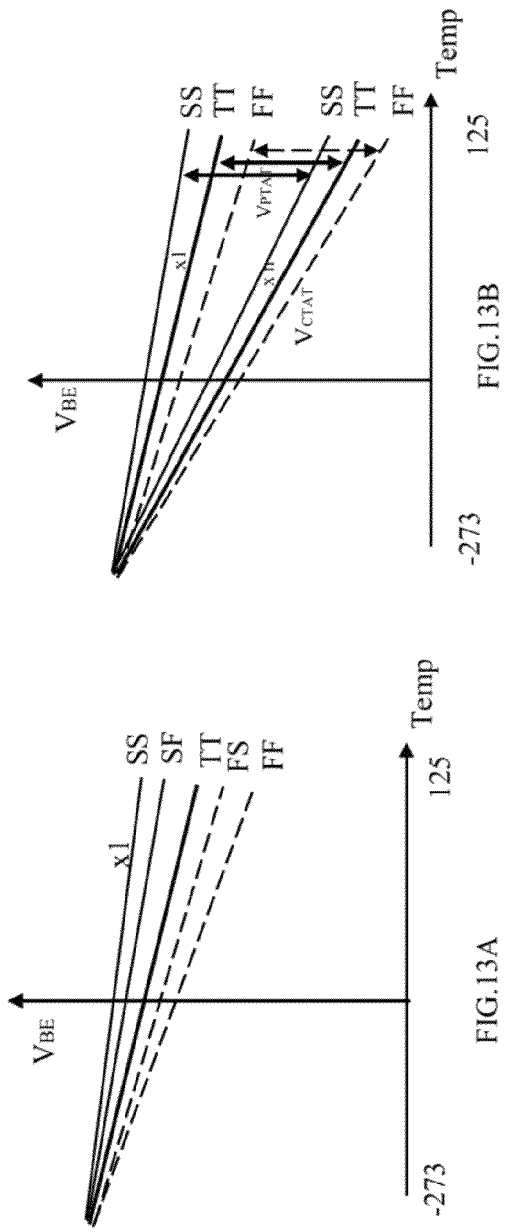
FIG.13A
FIG.13B
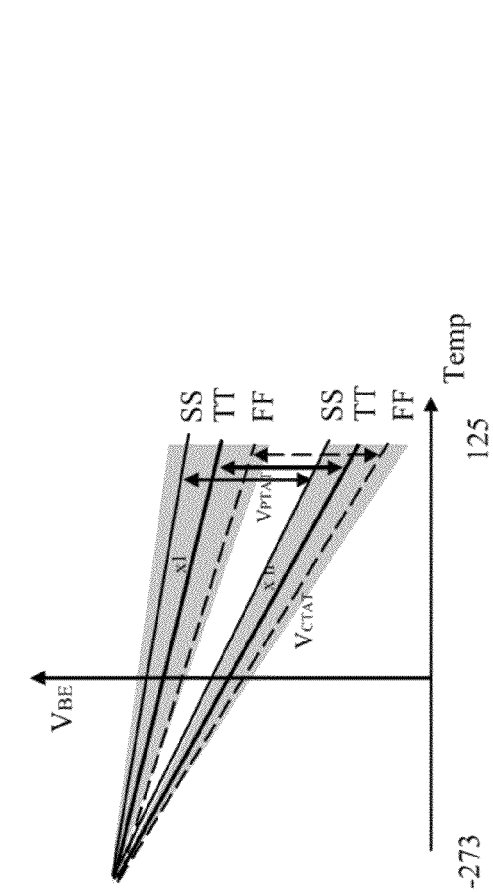
FIG.13C

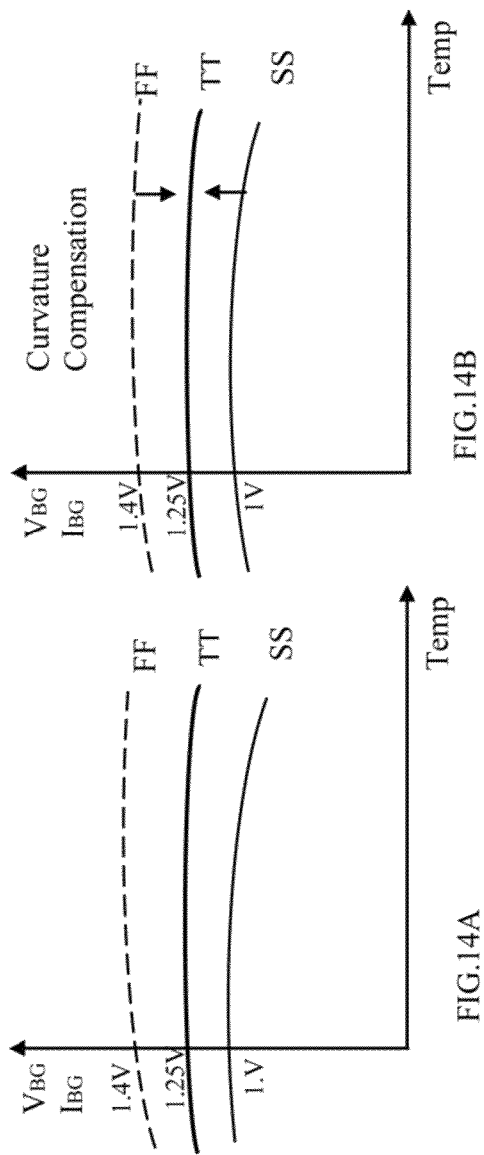
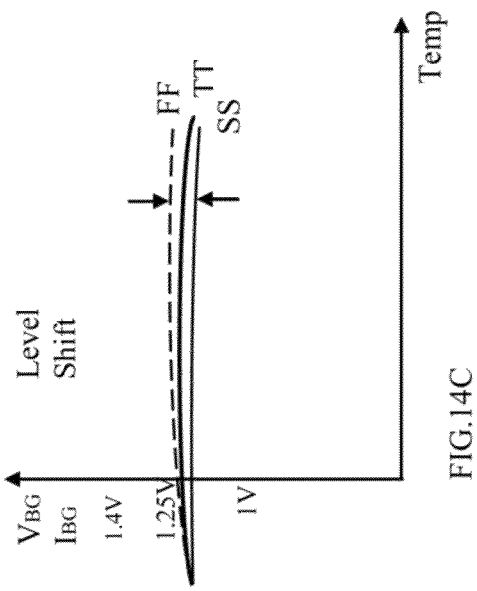
FIG.14A
FIG.14B
FIG.14C

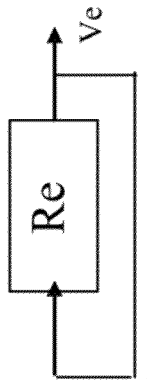
FIG.18A
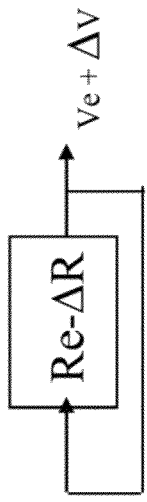
FIG.18B
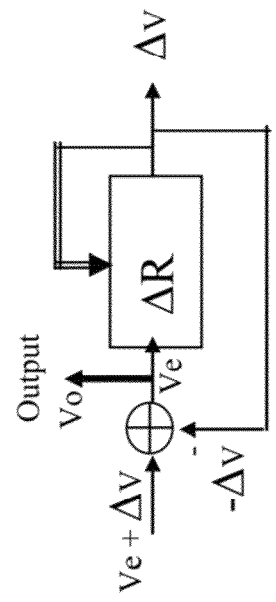
FIG.18C
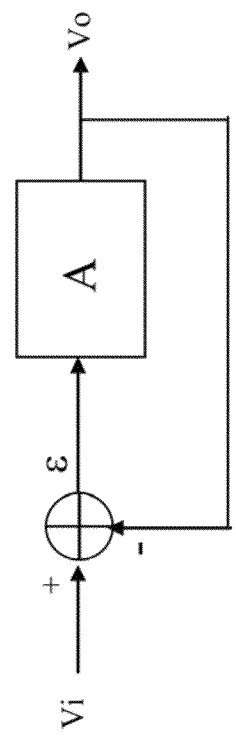
FIG.15
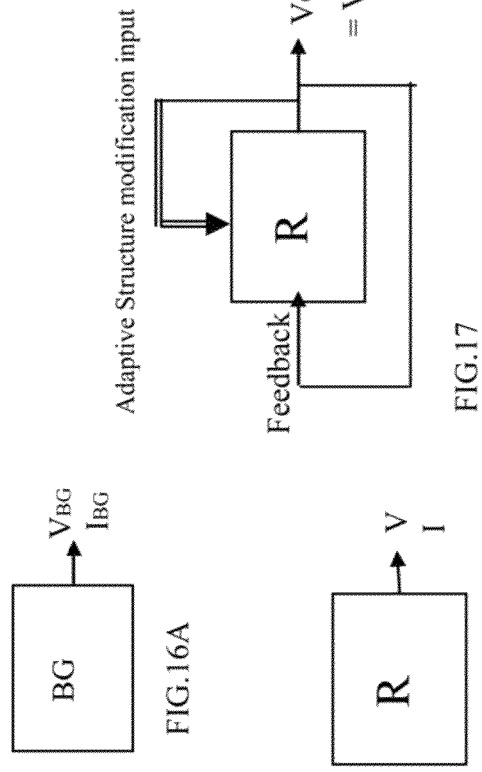
FIG.17
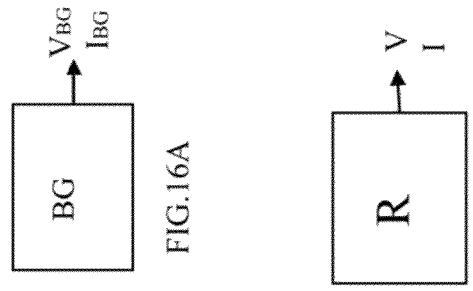
FIG.16A
FIG.16B

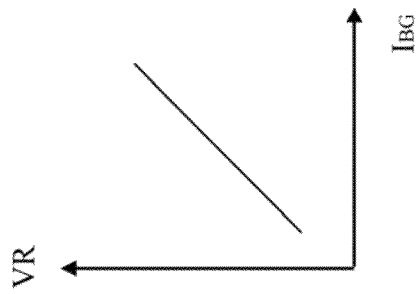
FIG.22C
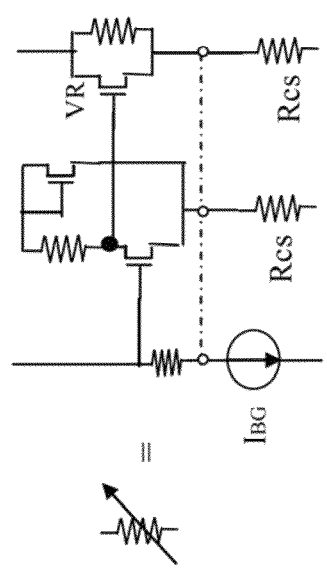
FIG.22A
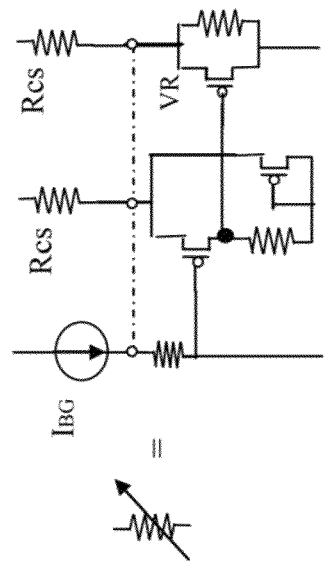
FIG.22B
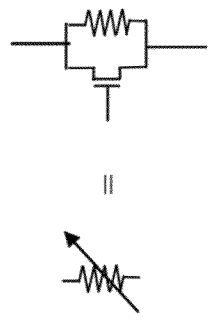
FIG.21A
FIG.21B

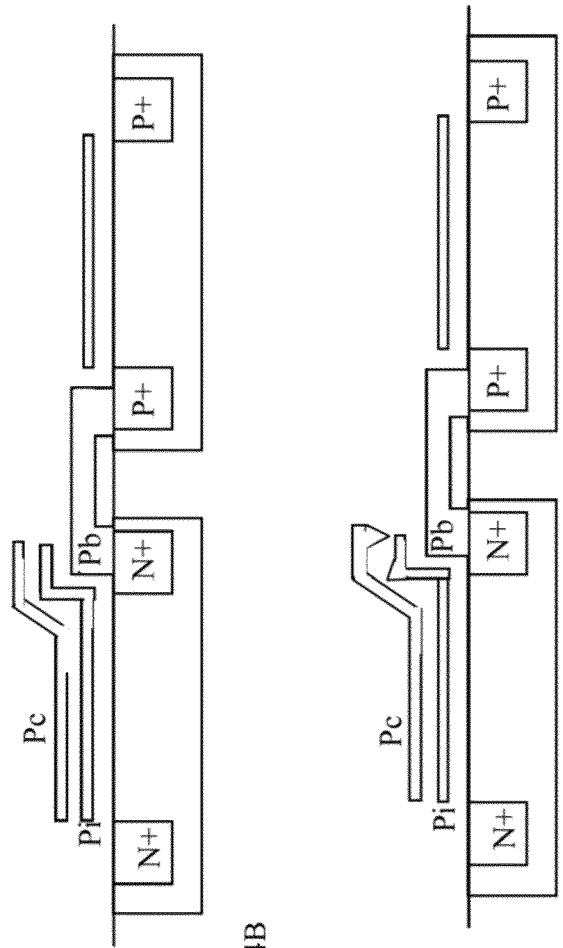
FIG.34B
FIG.34C
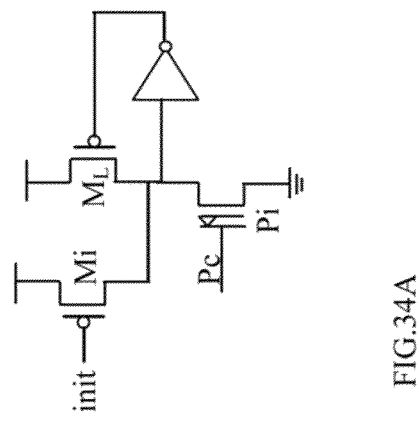
FIG.34A

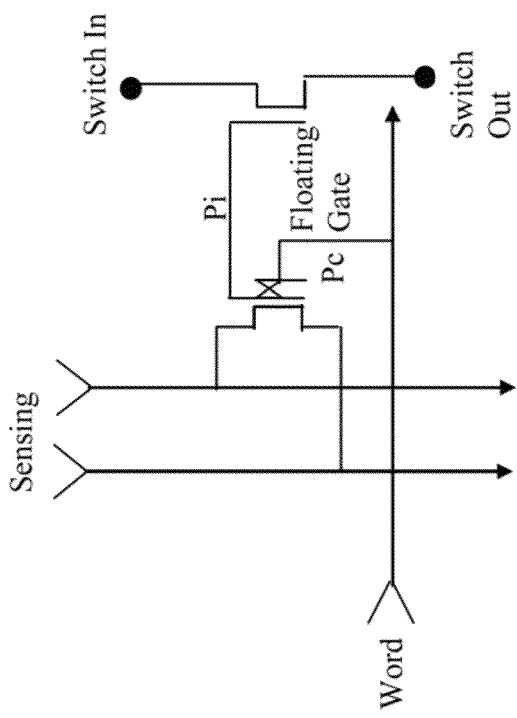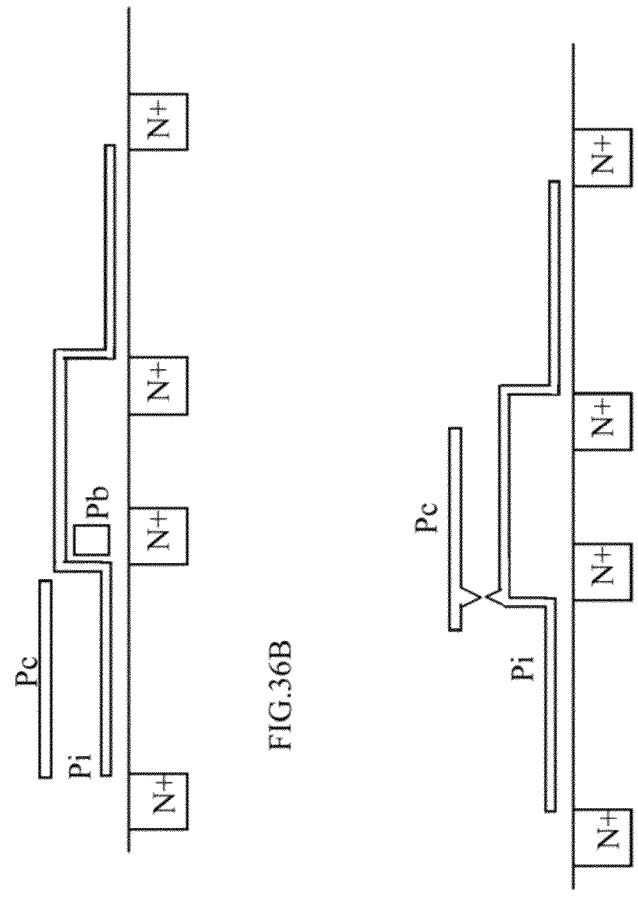
FIG.36B
FIG.36C
FIG.36A

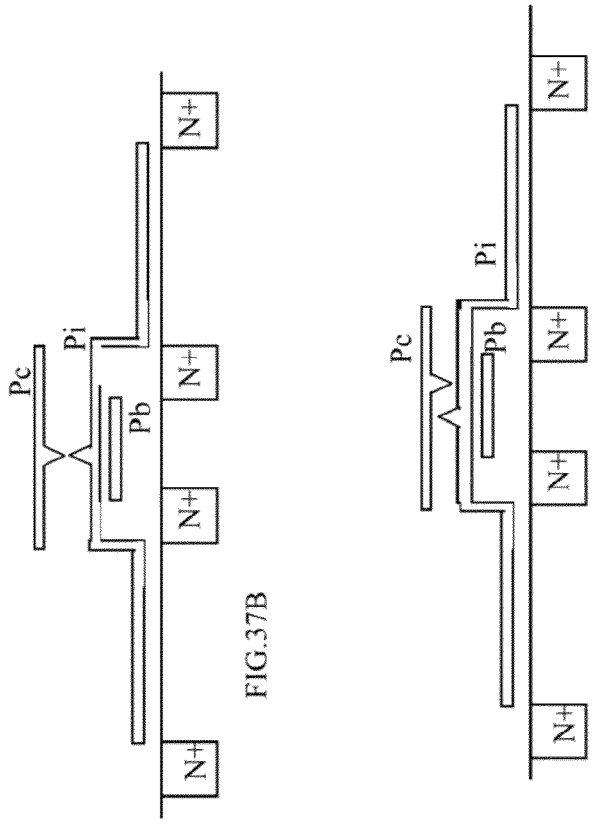
FIG.37B
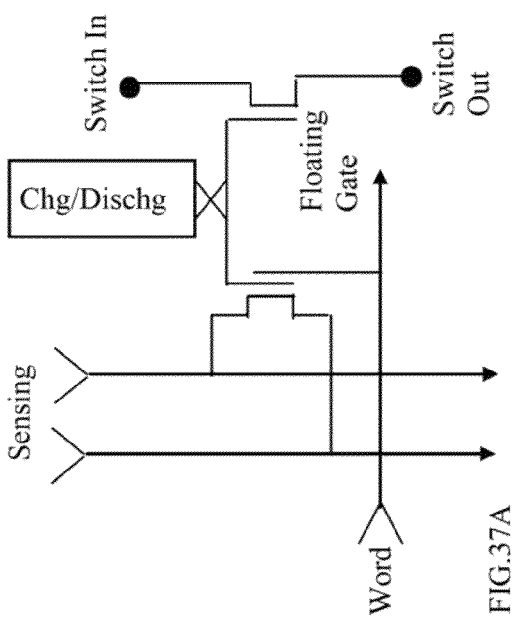
FIG.37A
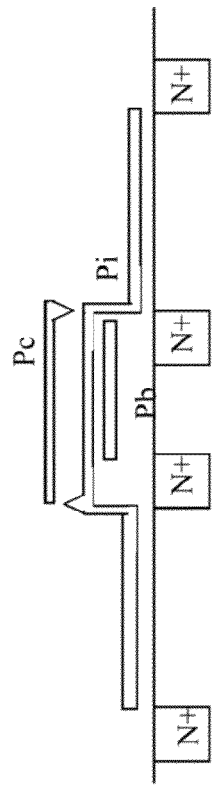
FIG.37C
FIG.37D

FPSC
Single Chip
Single Memory
EEPROM Process
Flash Memory
FPMA Chip

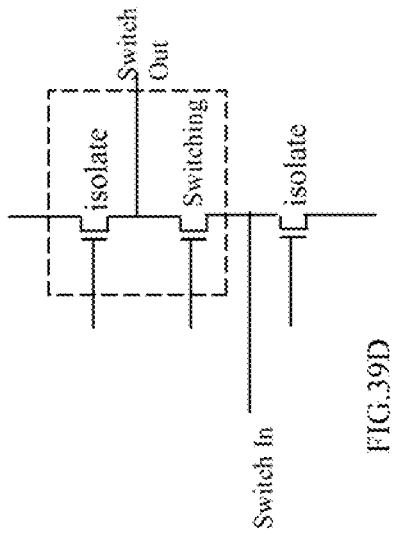
FPSC
Single Chip
Single Memory
CMOS Process
Flash Memory
FPMA Chip
FIG.39A
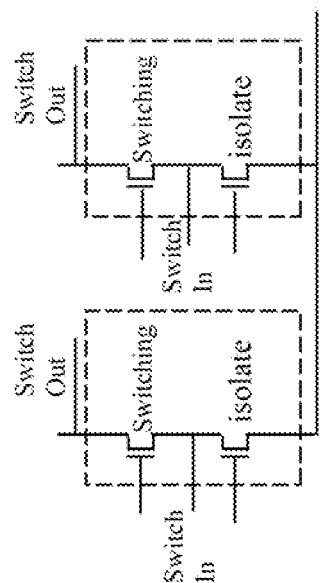
FIG.39B
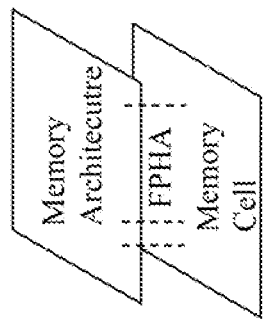
FIG.39C
FIG.39D
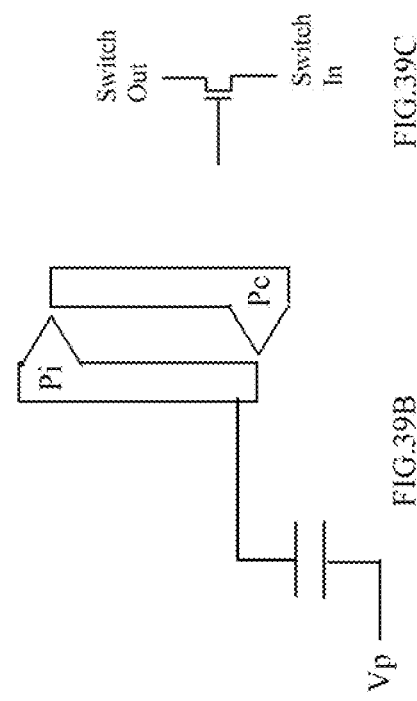
FIG.39E

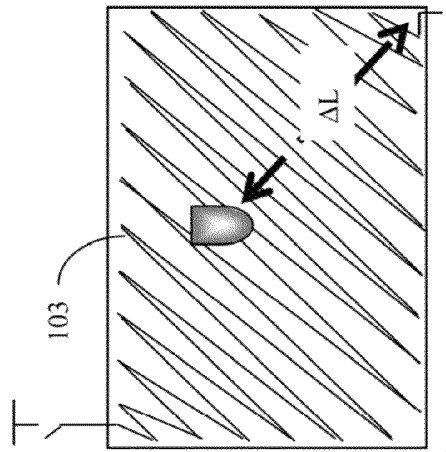
FIG.42F
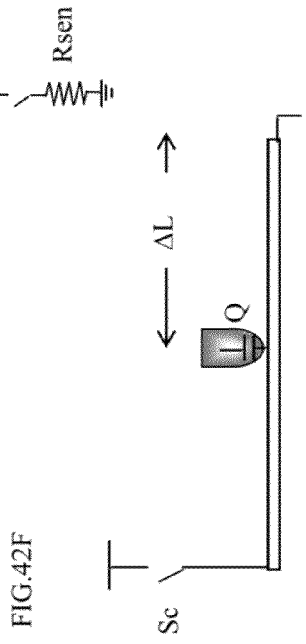
FIG.42G
FIG.42H
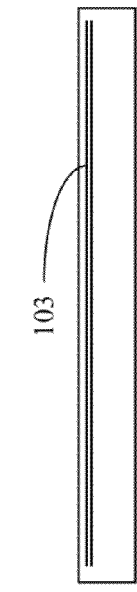
FIG.42C
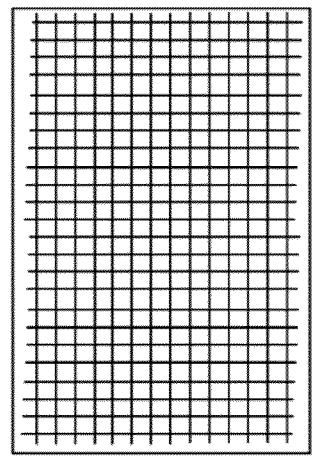
FIG.42D
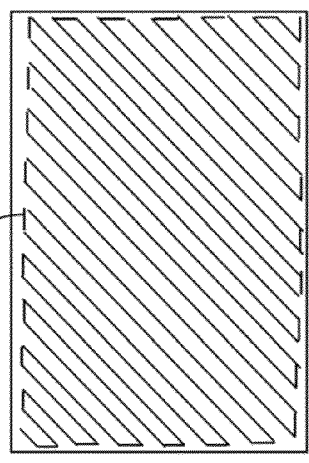
FIG.42E

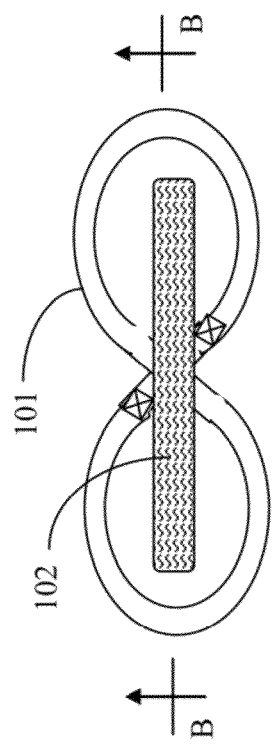
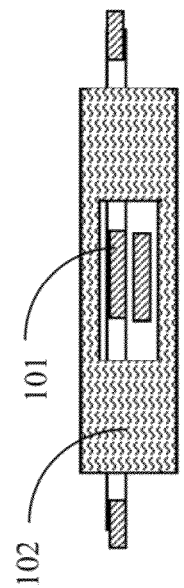
FIG.45A
FIG.45B
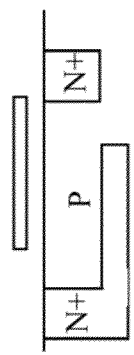
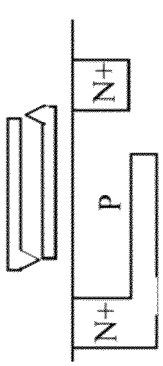
FIG.44A
FIG.44B

SDOC WITH FPHA AND FPXC: SYSTEM DESIGN ON CHIP WITH FIELD PROGRAMMABLE HYBRID ARRAY OF FPAA, FPGA, FPLA, FPMA, FPRA, FPTA AND FREQUENCY PROGRAMMABLE XTALESS CLOCKCHIP WITH TRIMLESS/TRIMFREE SELF-ADAPTIVE BANDGAP REFERENCE XTALESS CLOCKCHIP

RELATED APPLICATIONS

This patent application Ser. No. 12/422,719 filed Apr. 13, 2009 is the $1^{st}$ portion of one whole patent of FPSC patent application to be the parent patent application of the $2^{nd}$ portion of FPSC of U.S. patent application Ser. No. 12/752,121 filed on Apr. 1, 2010, and this is also the Continuation in Part application claims priority of U.S. patent application Ser. No. 12/317,973, filed Dec. 31, 2008, now U.S. Pat. No. 8,089,324 issued on Jan. 3, 2012; U.S. patent application Ser. No. 12/291,984, filed Nov. 12, 2008, U.S. patent application Ser. No. 12/291,618, filed Nov. 12, 2008, now U.S. Pat. No. 7,876,188 issued on Jan. 25, 2011; U.S. patent application Ser. No. 12/288,770, filed Oct. 23, 2008, now U.S. Pat. No. 7,663,349 issued on Feb. 16, 2010; U.S. patent application Ser. No. 12/229,412, filed Aug. 23, 2008, now U.S. Pat. No. 8,089,323 issued on Jan. 3, 2012; U.S. patent application Ser. No. 12/082,601, filed Apr. 12, 2008; U.S. patent application Ser. No. 12/079,179, filed Mar. 25, 2008, now U.S. Pat. No. 8,089,353 issued on Jan. 3, 2012; U.S. patent application Ser. No. 11/593,271, filed Nov. 6, 2006, now U.S. Pat. No. 7,511,589; U.S. patent application Ser. No. 11/500,125, filed Aug. 5, 2006, now U.S. Pat. No. 7,525,392 issued on Apr. 28, 2009; U.S. patent application Ser. No. 892,358, filed Jul. 14, 1997, now U.S. Pat. No. 5,850,093; U.S. patent application Ser. No. 854,800, filed Mar. 23, 1992, now U.S. Pat. No. 5,280,200; U.S. patent application Ser. No. 81,074, filed Jun. 22, 1993, now U.S. Pat. No. 5,793,125; U.S. patent application Ser. No. 577,792, filed Sep. 5, 1990, now U.S. Pat. No. 5,198,691; U.S. patent application Ser. No. 577,791, filed Sep. 5, 1990, now U.S. Pat. No. 5,111,076; which herein incorporated by reference in its entirety.

BACKGROUND FIELD OF INVENTION

The Tang System's "System-Design-On-Chip (SDOC™)" is the system on the Field-Programmable-Hybrid-Array (FPHA™) embedded in a single chip of Field Programmable System Chip(FPSC™). The unified system design environment has the System-Design-On-Chip (SDOC™) and the System-Design-On-Board (SDOB) been unified together in the same system design environment to be the unified system design platform. The Tang System's "System Design on-Chip (SDOC™)" is different from today's conventional "System Design On-Board (SDOB)". After the schematic entry, the System Design On-Board (SDOB) needs to get the components from the different resources and have the vender to manufacture the Printed Circuit Board. After several weeks, the Printed Circuit Board comes back, the designer needs to soldier the components on the PCB, test and debug on it, etc. It takes about half year to finish one system-design-on-board iteration cycle. However, after the schematic entry, the System Design On-Chip (SDOC™) only takes five minutes to finish the download and verify the design. The System Design On-Chip (SDOC™) reduces the design iteration cycle from 6 months to be 5 minutes.

The FPHA embedded in a single chip of Field Programmable System Chip(FPSC™) has the Configurable Module Block (CMB™), Configurable Analog Block (CAB) and Configurable Logic Block (CLB). The supporting platform is constituted of the self-adaptive-Process & Temperature-compensation BandGap reference (SAPTC-BG), the frequency-programmable-Xtaless-Clock (FPXC™), PLLess™ CDR (PLL free Clock Data Recovery), Capless LDVR (Capacitor Less Low Drop Voltage Regulator), Inductorless SMPS (Inductorless Switch Mode Power Supply), etc. The flash switch for the programmable connectivity and the flash memory for the look-up-table (LUT) can reduce the FPHA chip area a lot.

The Frequency Programmable Xtaless Clock (FPXC™) has the following eight characteristics to make the Xtaless clock being implementable.
1. Self-adaptive process-temperature bandgap reference compensation
2. Gain-Boost Amplitude Control resonator
3. Active MOS Parametric Varactor Diode Compensation
4. RL=RC over Process and Temperature for frequency Compensation
5. Toroid Inductor and MIM Cap Temperature (Minor Process) Compensation
6. Double Gain-Boost/Glitch Eliminated LCO (LC Oscillator)
7. Capless LDVR/(Zero Substrat Noise)
8. Frequency Programmable Clock with capacitor array
The frequency can be programmed from MHz to GHz for an Frequency with $C_{OX}$ (Oxide capacitance variance) process and temperature compensation.

The Field Programmable Radio Array FPRA is similar to the high frequency Field Programmable Analog Array FPAA. However, the FPRA has a lot of the on-chip inductors. The conventional on-chip inductor occupies a lot of chip area. It needs the miniature on-chip inductor. The miniature inductor enables the Field Programmable Radio Array (FPRA), Frequency Programmable Xtaless Clock FPXC, PLLess CDR (Clock Data recovery) and Field Programmable Switch Power Array (FPSA) being implementable on chip to have the system design on chip (SDOC) embedded in a single chip of Field Programmable System Chip(FPSC™).

For the high-speed and high frequency streaming data, the FPRA and FPAA are in the pipeline architecture. Not only the digital circuit has the pipeline architecture, to have the long connectivity, there are the pipeline analog buffer and pipeline digital buffer in the connectivity. For the analog buffer and digital buffer themselves, there are the pipeline circuit configurations, too. There are three hierarchical layers of pipeline architecture.

Furthermore, with the SDOC on FPHA embedded in a single chip of Field Programmable System Chip(FPSC™), the hot product of the Automobile Infotainment Center (AIC) is reduced to be the Mobile Infotainment Center (MIC) embedded in a single chip of Field Programmable System Chip(FPSC™).

BACKGROUND—DESCRIPTION OF PRIOR ART

The Field Programmable Gate Array (FPGA) is the digital system design on chip. The FPGA is a successful business. The Field Programmable Analog Array (FPAA) is analog system design on chip. However, the FPAA is a failure business. The granite of the FPAA is small and the operation range is in the KHz range. As the high frequency, high speed and high data rate design pushes the analog front to the GHz range, the FPAA only can operate in the KHz range. Therefore, the FPAA fails to meet the requirement of the analog front design that the FPAA is a failure business.

The system design on chip should be a large device. However, since there is no pipeline technology, the FPAA cannot be the large device due to the RC load of the long connectivity. The RC filter effect of the long connectivity destroys the analog signal. Therefore, the FPAA is limited to the low frequency and small device. However, for the practical analog front design, it is high frequency and large device. Therefore, the FPAA cannot meet the technical requirement of the analog front chip that the FPAA became a failure business.

Without the System Design On-Chip (SDOC) embedded in a single chip of Field Programmable System Chip (FPSC™), the Automobile Infotainment Center is bulky.

OBJECTS AND ADVANTAGES

Using the pipeline architecture and pipeline circuit configuration, the Field Programmable Hybrid Array (FPHA) embedded in a single chip of Field Programmable System Chip(FPSC™) integrates all the most advanced IC technologies such as the Indless SMPS (Inductorless Switch Mode Power Supply), Capless LDVR, PLLess CDR, Sawless LNA, GBQ-LC VCO, EMI-Free inductor, analog pipelined buffer, two-way flash switch, two-way flash memory, self-adaptive bandgap reference and FPXC, etc to provide the system design on chip (SDOC) embedded in a single chip of Field Programmable System Chip(FPSC™). The Frequency Programmable Xtaless Clock (FPXC) has the self-adaptive process-temperature compensation bandgap reference and the field programmable clock frequency capability.

The (1) Capacitorless Low Drop Voltage (Capless LDVR) (2) Inductor less Switch Mode Power Supply (Indless SMPS) (3) Resistorless Current Sensor (Resless CS), (4) Saw Filter Less Low Noise Amplifier(Sawless LNA), (5) Diode Less True Random Number Generator (Dioless TRNG), (6) Crystal Less Clock (Xtaless Clock), (7) PLL Less Clock and Data Recovery (PLLess CDR) and (8) Filmless Touching Screen (FLTS) constitutes the most advanced System Design On Chip (SDOC) on Field Programmable Hybrid Array (FPHA) embedded in a single chip of Field Programmable System Chip(FPSC™) for Mobile Infotainment Center (MIC).

DRAWING FIGURES

FIG. 1(A) is the two-way pipelined signal flow architecture of the field program hybrid array (FPHA) for the system design on chip (SDOC) embedded in a single chip of Field Programmable System Chip(FPSC™); (B) is the FPHA having the Configurable Module Block (CMB), Configurable Analog Block (CAB) and Configurable Logic Block (CLB) embedded in a single chip of Field Programmable System Chip(FPSC™); (C) is the connectivity pattern of the conventional uniform architecture in conventional FPGA; (D) is the connectivity pattern of the pipeline architecture in FPHA embedded in a single chip of Field Programmable System Chip(FPSC™); (E) is the two-way pipeline architecture having the pipelined channels interlaced with the uniform channel layer; (F) is the analog, mixed signal and digital floor planning and layout area partition for the pipeline architecture in FPHA embedded in a single chip of Field Programmable System Chip(FPSC™); (G) is the FPHA embedded in a single chip of Field Programmable System Chip(FPSC™) having the two-way pipeline architecture as shown in FIG. 1E.

FIG. 2(A) is the long pipe; (B) is the architecture of the pipeline being similar to bamboo structure; (C) is the pipeline for the digital circuit in time domain; (D) is the pipeline for the analog circuit in the frequency domain; (E) is the signal transmitting in the long pipe without the pipeline structure; (F) is the signal transmitting in the pipeline structure; (G) as the length of the transmission line/pipe increases, the bandwidth of the transmission line/pipe decreases; (H) the signal spectrum in frequency domain for the long line/pipe transmission as shown in FIG. 2E; (I) the signal spectrum in frequency domain for the pipeline transmission as shown in FIG. 2F.

FIG. 3(A) is the long line connectivity in digital FPGA having the signal dispersion as shown in FIG. 2H; (B) the pipelined digital buffer is inserted for the long line connectivity in FPGA; (C) is the digital buffer having non-overlapping switching mechanism; (D) is the comparisons between the digital buffer having overlapping and non-overlapping switching mechanism.

FIG. 4(A) is the long line connectivity in analog/mixed-signal FPHA embedded in a single chip of Field Programmable System Chip(FPSC™) having the signal distortion as shown in FIG. 2H; (B) the pipelined analog buffer is inserted for the long line connectivity in FPHA as shown in FIG. 2I; (C) is the block diagram of the pipeline analog buffer; (D) is the circuit of the pipeline analog buffer; (E) is the comparison between the bandwidth of the multi-stage amplifier and the pipeline amplifier.

FIG. 5(A) is the FPGA programmability with digital MUX cell having the digital buffer; (B) is the FPGA programmable cell with digital MUX cell having the digital buffer; (C) is the FPHA programmability with analog MUX cell having the pipeline analog buffer; (D) is the FPGA programmable switch with analog MUX cell having the pipeline analog buffer; (E) is the Switch Box SB for the FPHA; (F) is the switch box made of the digital crosspoint switch; (G) is the switch box made of the analog crosspoint switch; (H) is the large Field Programmable Circuit Board (FPCB) made of the Field Programmable Hybrid Array (FPHA) and Field Programmable Switch Box (FPSB) which is made of the digital crosspoint switch and analog crosspoint switch; (I) is the hybrid switch chip (HSC) having the inputs and outputs distributed on the four chip edges; (J) the FPCB or PCB having the digital FPGA and digital switch chip SC needs the analog chips, etc to do the system emulation; (K) the FPCB or PCB having the hybrid FPHA and hybrid switch chip HSC doesn't need the analog chips, etc to do the system emulation.

FIG. 6(A) is the hierarchical optimization algorithm for the high frequency analog signal paths in FPHA embedded in a single chip of Field Programmable System Chip(FPSC™); (B) the hierarchical optimization algorithm is applied to the streaming data flow FPHA to form the pipelined structure; (C) the hierarchical structure of the FPHA embedded in a single chip of Field Programmable System Chip(FPSC™); (D) is the two-way pipeline architecture; (E) is the hierarchical structure for the two-way pipeline architecture.

FIG. 11 is the temperature and process compensation for the LC resonator; (A) is the cross section of the inductor; (B) is the cross section of the capacitor; (C) is the comparisons between the variations due to the process and temperature with and without the self-adaptive compensation for the process and temperature.

FIG. 13(A) is the $V_{BE}$ process variance over the temperature; (B) is the $V_{BE}$ variance having the different area ratio; (C) the process variation over the temperature.

FIG. 14(A) is the bandgap reference of process variation over temperature; (B) is the bandgap reference of process variation having the curvature compensation over the temperature; (C) is the self-adaptive for both the temperature and process.

FIG. 15 is the conventional feedback control system; the output traces the input.

FIG. 16(A) is the bandgap reference generating the reference current and voltage; (B) is the general reference generator R generating the reference voltage V and current I.

FIG. 17 is the self-adaptive reference generator to make the self-adaptive adjustment.

FIG. 18(A) is the self-reference system; (B) is the self-reference system having the variance; (C) is the self-reference system being converted to the conventional input-output feedback system.

FIG. 21(A) is the analog N-type variable resistors; (B) is the analog P-type variable resistors.

FIG. 22(A) is the analog N-type variable resistors applied to the self-adaptive bandgap reference generator; (B) is the analog P-type variable resistors applied to the self-adaptive bandgap reference generator; (C) is the variance of the variable resistor due to the variance of the reference current.

Figure 27B:
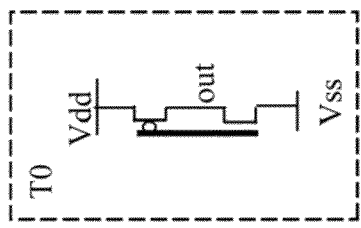
Figure 27C:
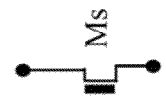
Figure 27A:
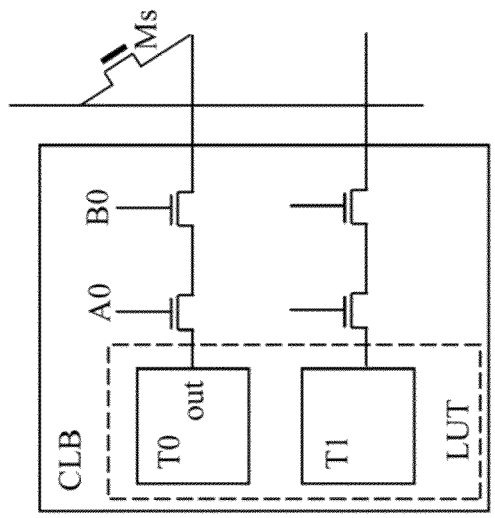

FIG. 27(A) is the flash-type basic structure of look-up-table(LUT) and programmable connectivity switch for the configurable logic block(CLB); (B) is flash-type look-up-table(LUT) memory; (C) is the flash-type switch; (D) is the flash-type look-up-table(LUT) memory with the read-back MOS; (E) is the flash-type switch with the read-back MOS; (F) is the flash-type look-up-table(LUT) memory with the read-back MOS having select gate; (G) is the flash-type switch with the read-back MOS having select gate; (H) is the flash-type look-up-table(LUT) memory with the read-back MOS having the symmetric select gate; (I) is the flash-type switch with the read-back MOS having the symmetric select gate.

Figure 28C:
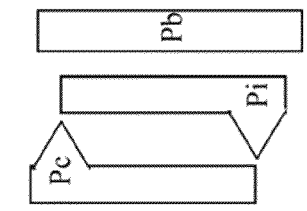
Figure 28B:
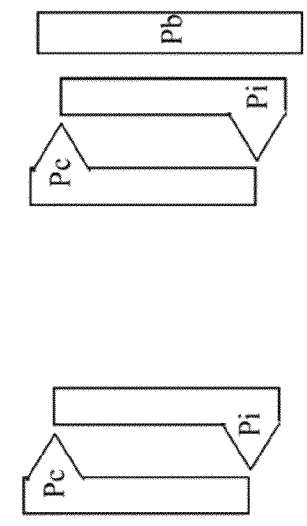
Figure 28A:
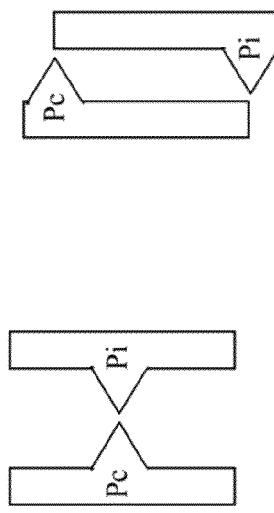

FIG. 28(A) is the two-way floating gate charging and discharging; (B) is the alternative design of the two-way floating gate charging and discharging; (C) is the two-way floating gate charging and discharging with the charge biasing plate.

Figure 29B:
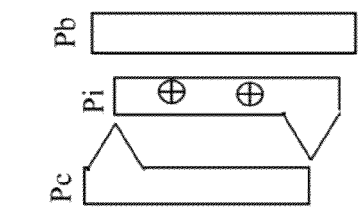
Figure 29A:
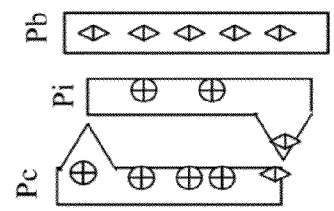

FIG. 29(A) is the discharging process for the floating gate; (B) is positive charge left on the floating gate.

Figure 30B:
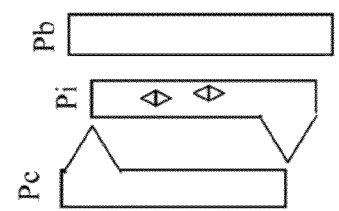
Figure 30A:
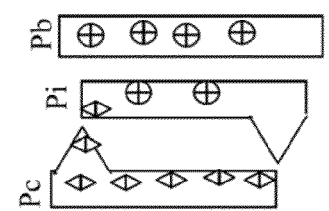

FIG. 30(A) is the charging process for the floating gate; (B) is negative charge left on the floating gate.

Figure 31A:
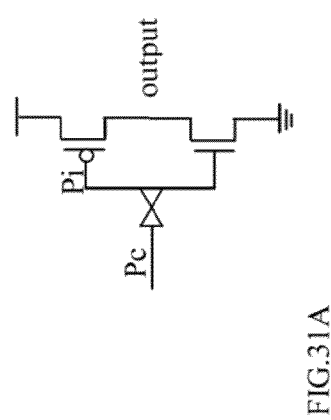

FIG. 31(A) is the inverter type memory having the floating gate; (B) is the section view of the inverter type memory; (C) is the section view of the inverter type memory having the biasing charge plate; (D) is the section view of the inverter type memory with the output node being the biasing charge plate.

Figure 32B:
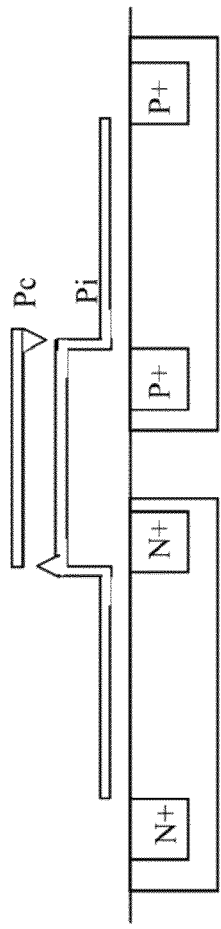
Figure 32C:
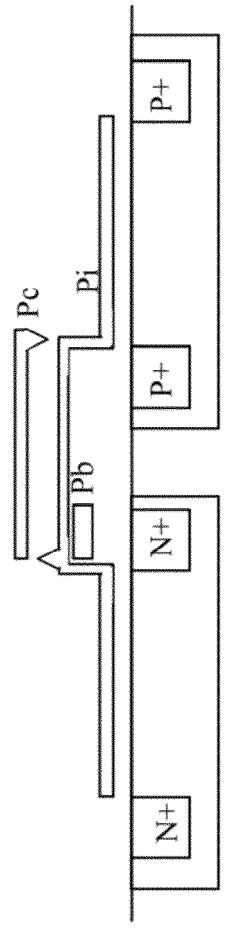
Figure 32D:
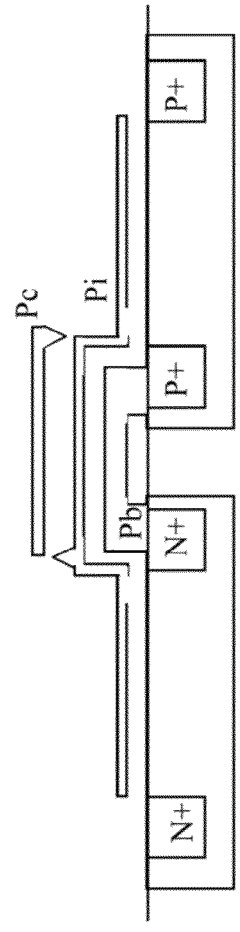
Figure 32A:
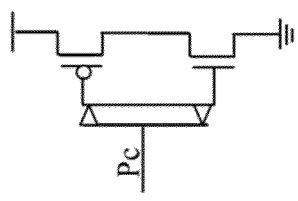

FIG. 32(A) is the inverter type memory having the two-way charging and discharging floating gate; (B) is the section view of the inverter type memory; (C) is the section view of the inverter type memory having the biasing charge plate; (D) is the section view of the inverter type memory with the output node being the biasing charge plate.

Figure 33A:
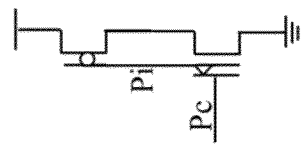
Figure 33B:
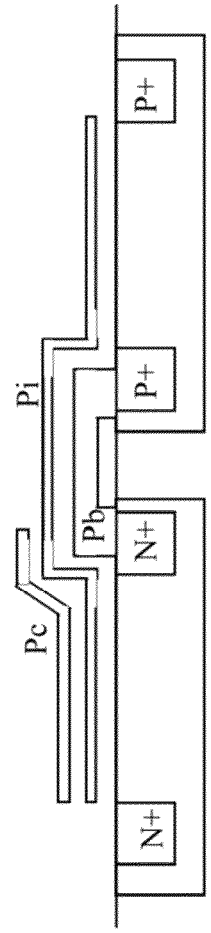
Figure 33C:
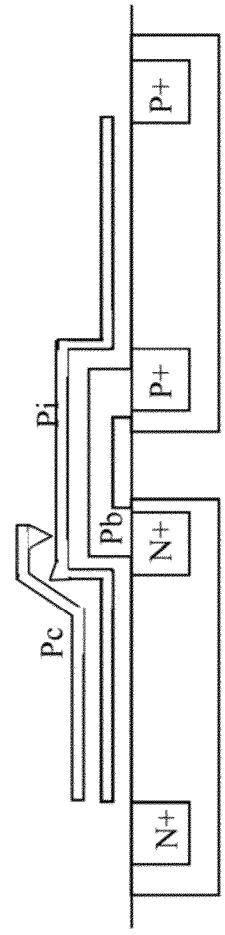

FIG. 33(A) is the inverter type memory having the single side two-way charging and discharging floating gate; (B) is the section view of the inverter type memory; (C) is the section view of the inverter type memory.

FIG. 34(A) is the latch type memory having the single side two-way charging and discharging floating gate; (B) is the section view of the latch type memory; (C) is the section view of the latch type memory.

Figure 35A:
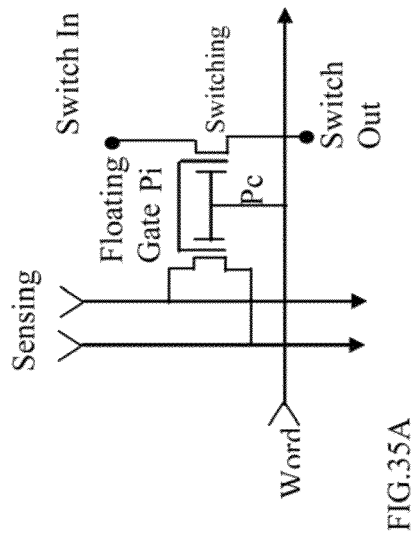

FIG. 35(A) is the flash switch; (B) is section view of the flash switch; (C) is the alternative section view of the flash switch.

FIG. 36(A) is the single-side flash switch; (B) is section view of the single-side flash switch with edges as the two-way charging peaks; (C) is section view of the single-side flash switch with two-way charging peaks.

FIG. 37(A) is the two-way flash switch; (B) is section view of the two-way flash switch; (C) is alternative section view of the two-way flash switch; (D) is the section view having the two way peaks at the ends at the ends of the plate edges.

Figure 38B:
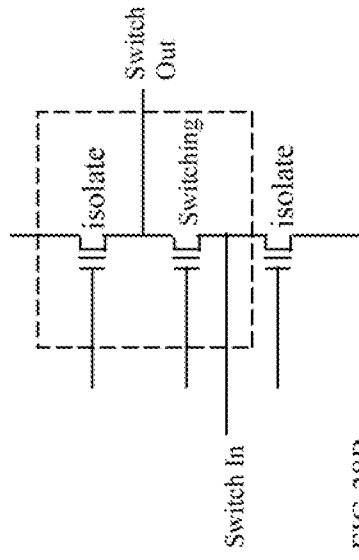
Figure 38C:
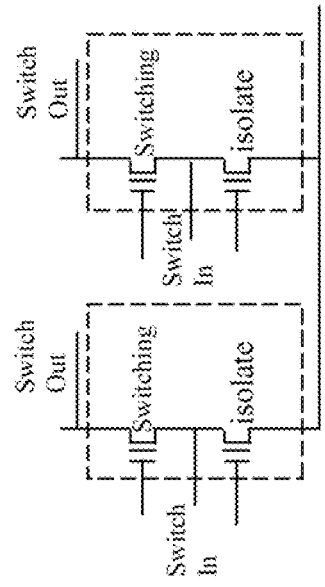
Figure 38A:
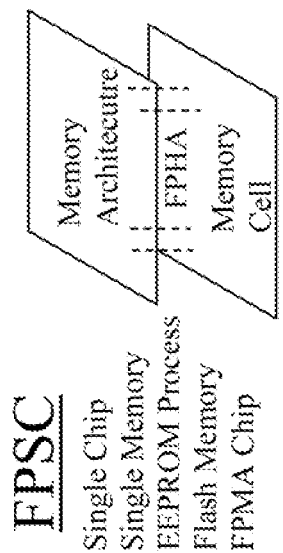

FIG. 38(A) is the Single Chip Single Memory EEPROM Process Flash Memory FPHA Chip embedded in a single chip of Field Programmable System Chip(FPSC™); (B) is the NAND type flash switch; (C) is the NOR type flash switch.

FIG. 39(A) is the Single Chip Single Memory CMOS Process Flash Memory FPHA Chip embedded in a single chip of Field Programmable System Chip(FPSC™); (B) is the charging for the isolated gate; (C) is the CMOS Process Flash switch; (D) is the NAND type flash switch; (E) is the NOR type flash switch.

Figure 40B:
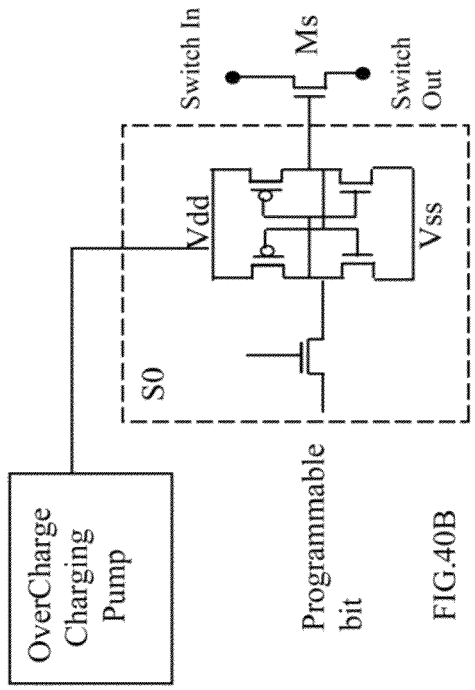
Figure 40C:
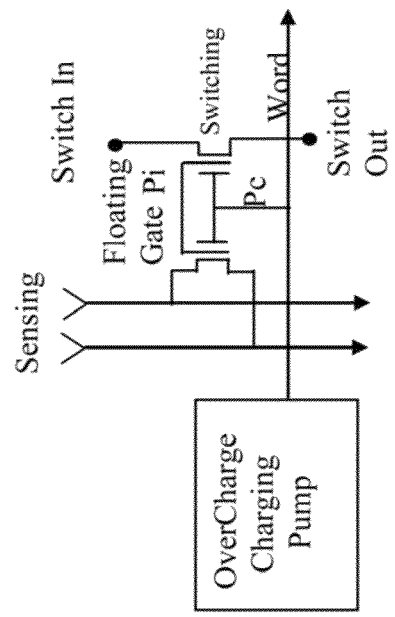
Figure 40A:
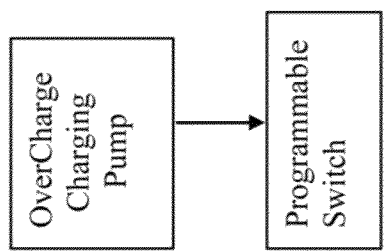

FIG. 40(A) is the general structure to over-charge the programmable switch to reduce the switch-on resistance of the programmable switch; (B) is the over-charge the programmable switch to reduce the switch-on resistance of the programmable SRAM switch; (C) is the over-charge the programmable switch to reduce the switch-on resistance of the programmable flash switch.

Figure 41B:
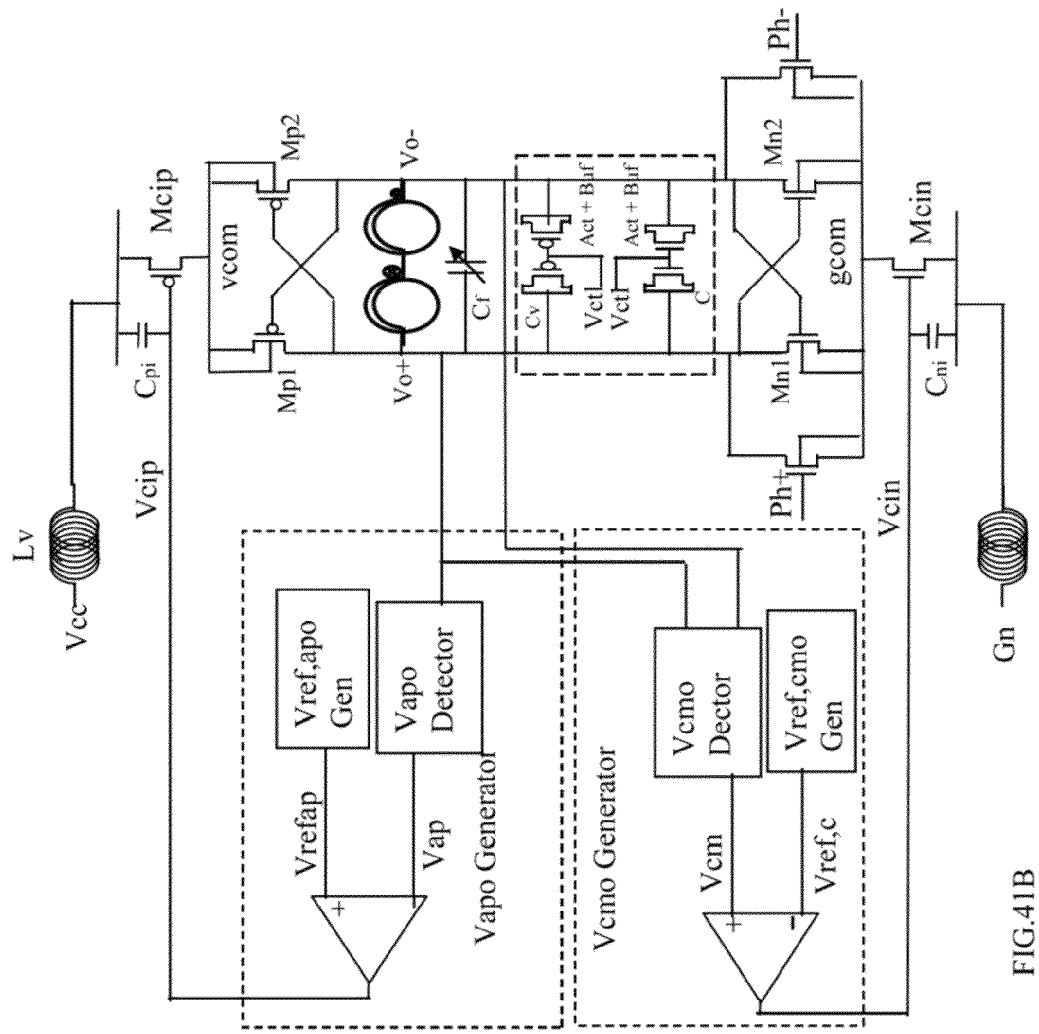
Figure 41A:
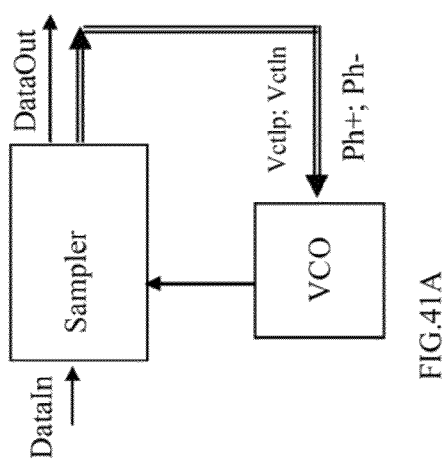

FIG. 41(A) is the PLLess CDR for high speed FPHA embedded in a single chip of Field Programmable System Chip(FPSC™); (B) is the LC VCO having the independent frequency and phase adjustments.

FIG. 42 is the Mobile Infotainment Center designed with the System Design On-Chip embedded in a single chip of Field Programmable System Chip(FPSC™); (A) is the Tang System's System Design On-Chip with the Field Programmable Hybrid Array embedded in a single chip of Field Programmable System Chip(FPSC™); (B) is the block diagram of the Mobile Infotainment Center; (C) is the section view of the capacitive sensitive touch screen; (D) is the top view of the two-dimension capacitive sensitive touch screen; (E) is the top view of the one-dimension capacitive sensitive touch screen; (F) is the alternative of the one-dimension capacitive sensitive touch screen; (G) is the circuit implementation for the one-dimension capacitive sensitive touch screen; as shown in FIG. 4F; (H) is the calculation of the coordinate of touching position with the voltage pulse in the time sequence.

Figure 43B:
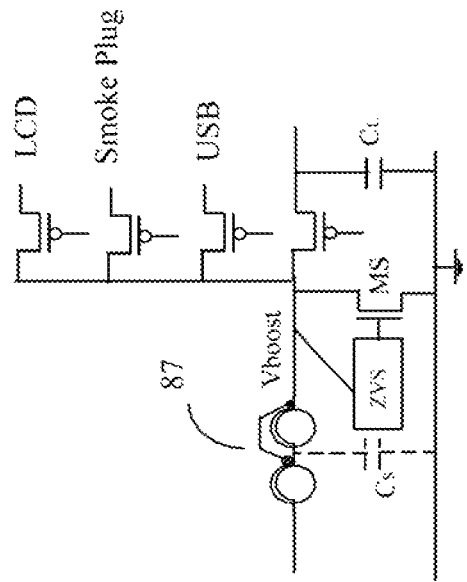
Figure 43A:
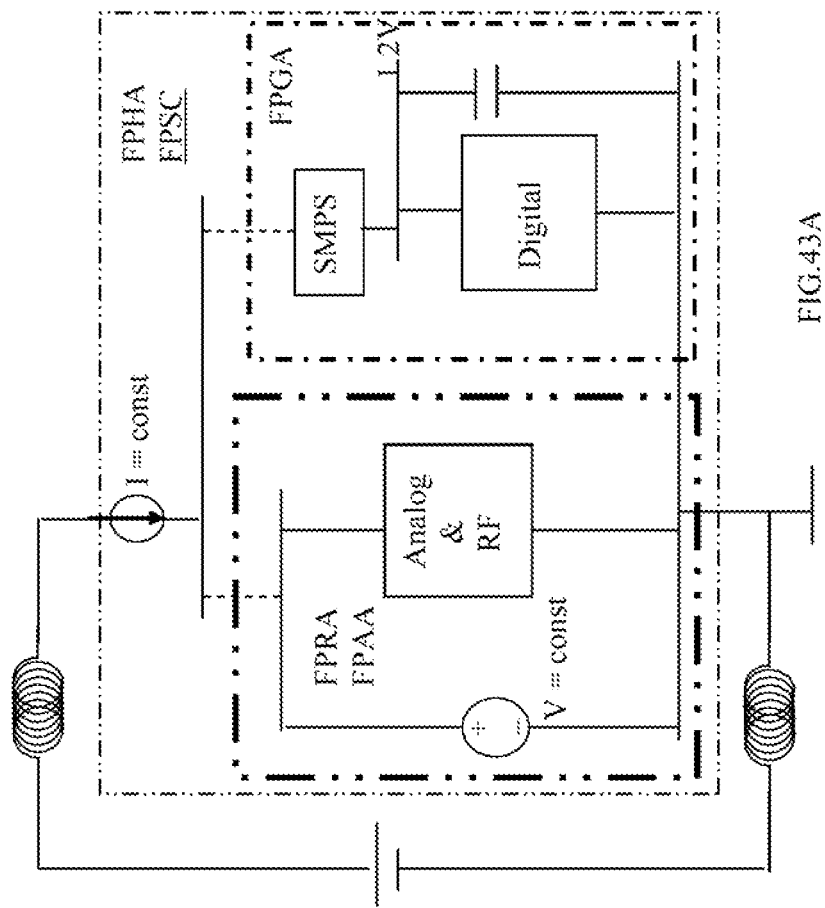

FIG. 43(A) is the power plan for the FPHA to minimize the substrate noise embedded in a single chip of Field Programmable System Chip(FPSC™); (B) is the switch mode power supply.

FIG. 44(A) is the unidirectional device to minimize the ground bounce noise; (B) is the two-way unidirectional flash device to minimize the ground bounce noise.

FIG. 45(A) is the miniature inductor for the FPRA; (B) is the section view of the miniature inductor taken along the B-B section line.

DESCRIPTION AND OPERATION

Figure 1A:
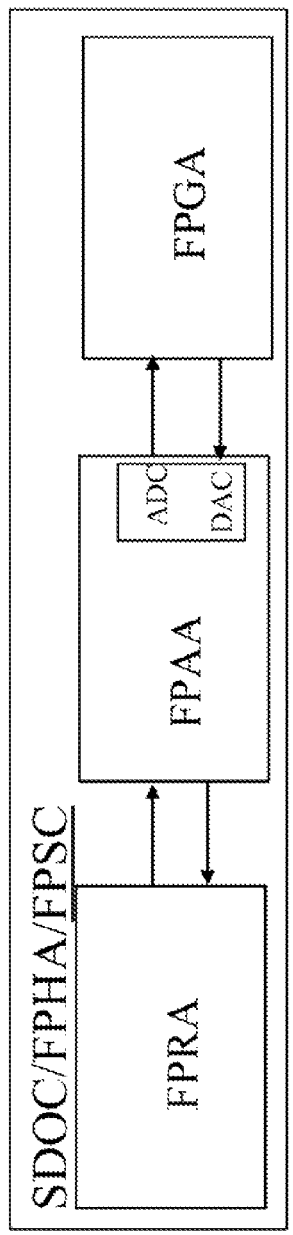
Figure 1B:
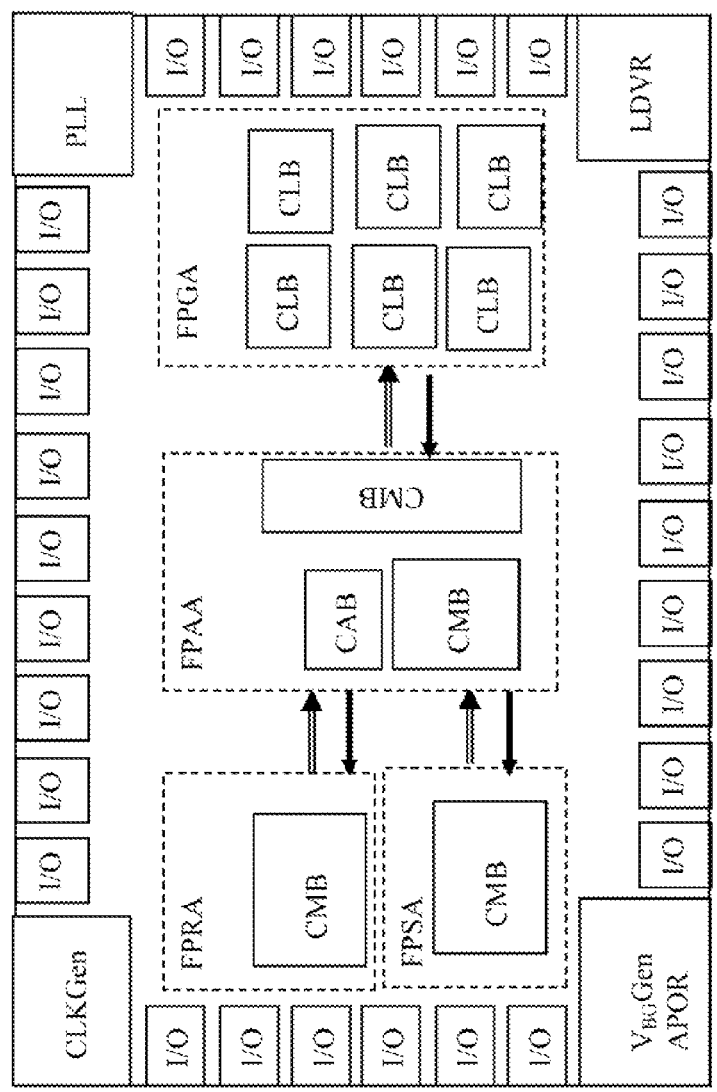
Figure 1E:
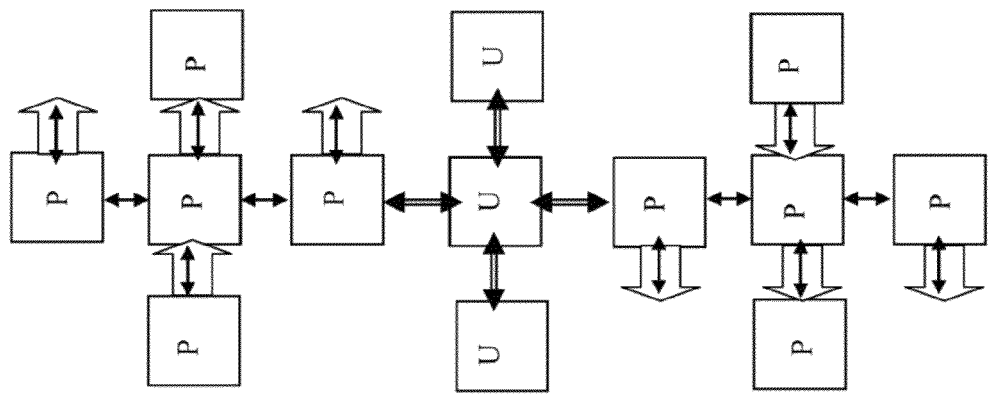
Figure 1C:
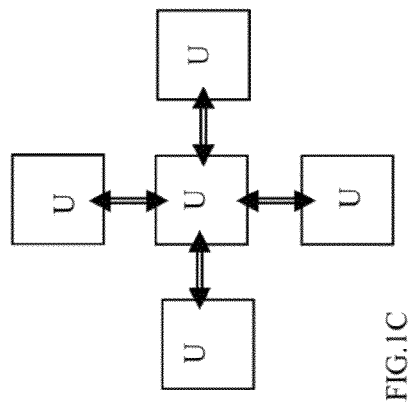
Figure 1D:
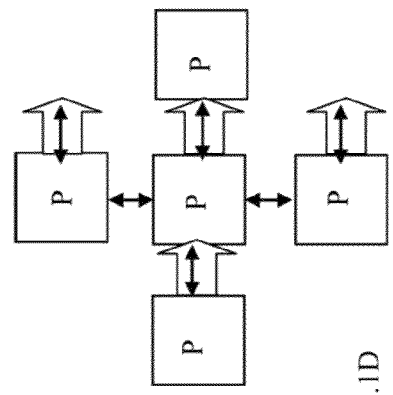
Figure 1G:
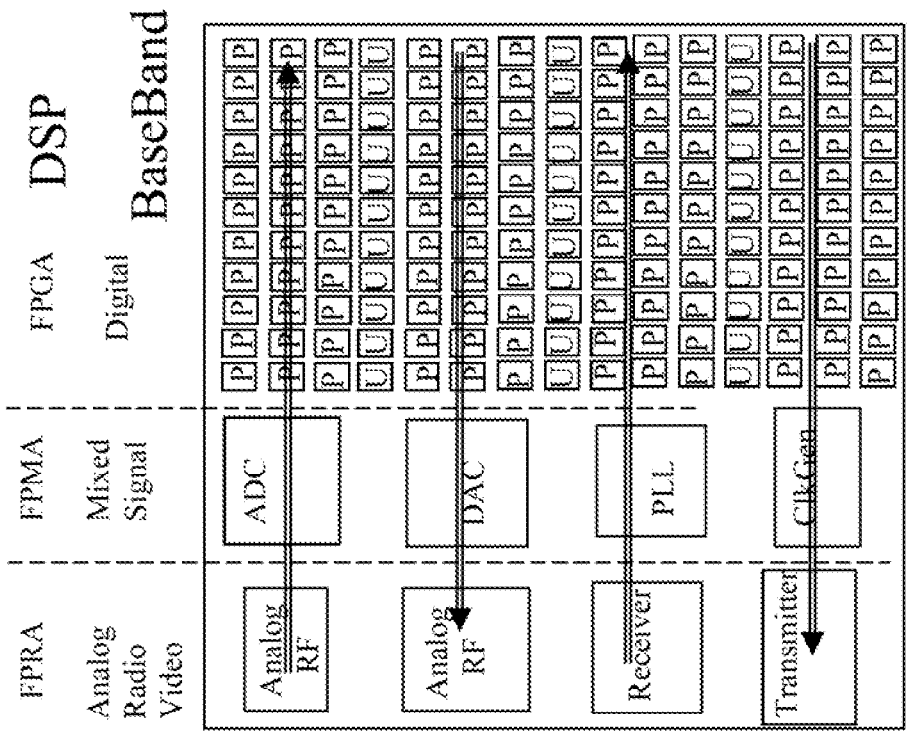
Figure 1F:
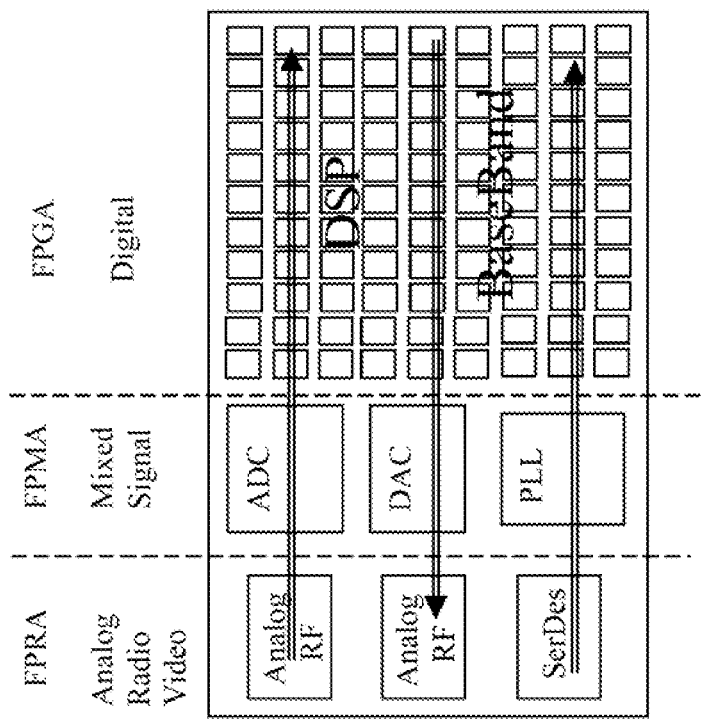

The Field Programmable Hybrid Array(FPHA™) embedded in a single chip of Field Programmable System Chip (FPSC™) is to overcome the low speed and low frequency problem of the Field Programmable Transistor Array(FPTA) and Field Programmable Analog Array(FPAA). For the high frequency and high-speed analog front, the data stream is in pipeline stream. As shown in FIG. 1A, the Field Programmable Radio Array(FPRA), the Field Programmable Analog Array(FPAA) and the Field Programmable Gate Array(FPGA) are in the pipeline structure embedded in a single chip of Field Programmable System Chip(FPSC™). Furthermore, as shown in FIG. 1B, the Field Programmable Hybrid Array (FPHA™) embedded in a single chip of Field Programmable System Chip(FPSC™) is constituted of the Configurable Module Block(CMB), Configurable Analog Block(CAB) and the Configurable Logic Block(CLB). The FPRA and FPAA have the high speed Configurable Module Block (CMB). As shown in FIG. 1C, the conventional CLB of the FPGA has the uniform connectivity pattern. However, as shown in FIG. 1D, for the high-speed and high-frequency data stream, the CLBs have the pipeline unidirectional connectivity pattern. For the high-speed and high-frequency design, the FPHA embedded in a single chip of Field Programmable System Chip(FPSC™) needs to have the pipeline architecture. As shown in FIG. 1E, the two-way pipeline channels having the interlace layer made of the uniform connectivity blocks. As shown in FIG. 1F, with the pipeline architecture, the floor planning and layout region is split to be the analog, mixed signal and digital zones. The separation of zones has the much better noise rejection. This is the application specific integrated circuit ASIC design style being applied to the field programmable integrated circuit FPIC embedded in a single chip of Field Programmable System Chip(FPSC™). As shown in FIG. 1G is the FPHA embedded in a single chip of Field Programmable System Chip (FPSC™) having the two-way pipeline architecture as shown in FIG. 1E. The uniform connectivity blocks serves as the buffer layer between two different directions pipelining channels.

In the field programmable device, the programmable connectivity dominates everything. As shown in FIG. 2A, it is a long pipe without the split mechanism. As shown in FIG. 2B, being similar to the structure of bamboo, the long pipe is split to be the short pipeline segments. As long as there are split mechanism to split the long pipe to be the short segments, we refer it to be the pipeline structure.

As shown in FIG. 2C, for the logic circuit, we use the Flip-Flop FF to be the split mechanism. It is the conventional logic circuit pipeline architecture of the digital circuit to be the pipeline in the time domain.

As shown in FIG. 2E, for the long line connectivity, there are the serious signal distortions in the long line signal transmission. We need to have the pipeline structure for the long line connectivity, too. As shown in FIG. 2D, FIG. 2F, FIG. 3B and FIG. 4B, it is the pipeline architecture for the signal transmission in the frequency domain. For the wire connection, we use the buffer to be the split mechanism. The split of the long wire connection with buffers is to keep the speed or fidelity of the signal.

For the digital circuit connection, to keep the speed, it is well known that it is needed to add the buffers in the long wire. However, for the analog signal connection, to keep the fidelity, it needs the special design of pipeline Analog Buffer. Even the conventional unit gain amplifier is not suitable for the analog signal transmission.

Figure 2G:
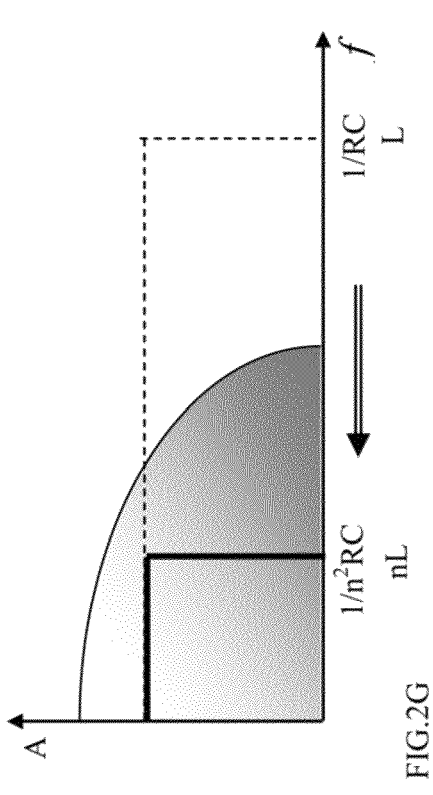

As shown in FIG. 2F, one segment of the pipeline has the length L with the equivalent resistance R and capacitance C. As shown in FIG. 2E, the long pipe has the length (nL) with the equivalent resistance (nR) and capacitance (nC). As shown in FIG. 2E, FIG. 2G, FIG. 2H and FIG. 2I, the on-chip connection is actually a filter having the pole at (1/RC). Both the resistance R and capacitance C are proportional to the connectivity length L. Therefore, the reduction of the bandwidth of the (nL) connectivity RC filter is two-order of the connectivity length ($1/n^2$) as shown in FIG. 2G.

For the high speed and/or the high frequency analog signal, the issue of the RC filter of the passive circuit of the connectivity is much more important. The RC filter of the connectivity will filter out the analog signal. To keep the fidelity of the analog signal, the RC bandwidth of the passive circuit of the connectivity has to be larger than the bandwidth of the analog signal. Being similar to the digital circuit, to keep the speed, the RC filter needs to have the wide bandwidth to keep the high frequency energy.

Figure 2I:
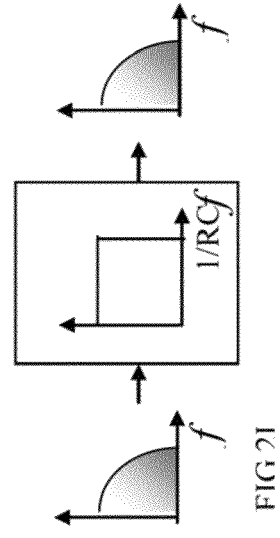
Figure 2H:
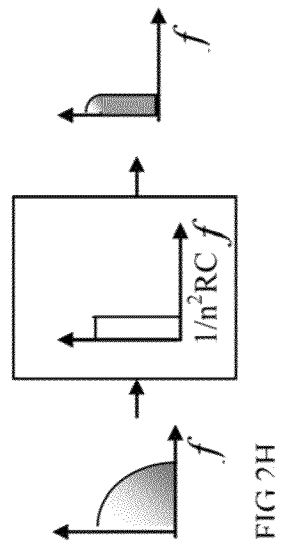

As shown in FIG. 2E and FIG. 2H, for the long connectivity, the high frequency signal is filtered out. So, as shown in FIG. 2F and FIG. 2I, the pipelined buffers are inserted in the long connectivity to break down the long connectivity to be short connectivity to keep the fidelity of the analog signal and the speed of the digital signal.

Figure 3A:
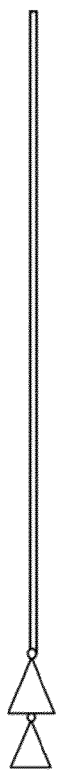
Figure 3B:
Figure 3D:
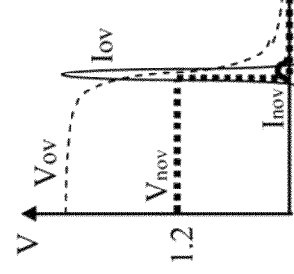
Figure 3C:
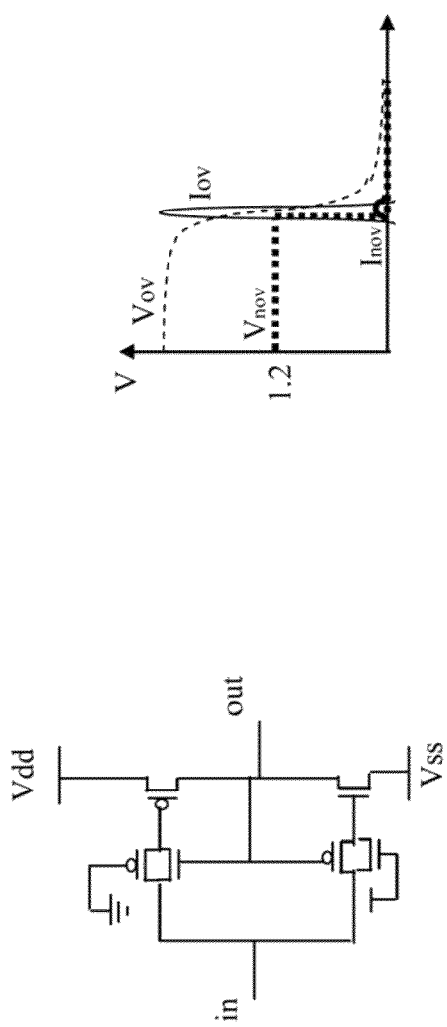

As shown in FIG. 3A and FIG. 2H, for the long digital connectivity in FPGA, the signal loses the speed. As shown in FIG. 3B, the pipelined digital buffer is inserted in the long connectivity to break down the long connectivity to be short connectivity. Furthermore, the digital buffer can re-boost the digital signal to keep the waveform shaping to keep the speed. However, as shown in FIG. 3C, to reduce the crowbar current of the short circuit to save the power, there is non-overlap switch mechanism. The output signal will feedback to change the resistance of the input signal path that the PMOS and NMOS have the different switching time. The PMOS device will switch-off first before NMOS switching on, and vice versa. To save the power, as shown in FIG. 43, the digital power supply is the switch mode power to supply the low voltage power. As shown in FIG. 3D, it is the comparison between the inverter having the non-overlapping switch mechanism with low supply voltage and the inverter having no non-overlapping switch mechanism with the high supply voltage. $V_{ov}$ and $I_{ov}$ are the output voltage and output current of the inverter having no non-overlapping switch mechanism with the high supply voltage. $V_{nov}$ and $I_{nov}$ are the output voltage and output current of the inverter having the non-overlapping switch mechanism with low supply voltage. A lot of power is saved with the non-overlapping switch mechanism having low supply voltage. It means a lot of switching noise is reduced, too. It will be the clean FPHA embedded in a single chip of Field Programmable System Chip(FPSC™).

As shown in FIG. 2G and FIG. 2I, in the transmission phase for the analog signal, we need to have the very wide bandwidth to keep the fidelity of the analog signal. Therefore, as shown in FIG. 2F and FIG. 4B, the passive circuit of the transmission line for the analog signal has to be in the pipeline to be split by the pipeline analog buffer.

For the analog signal, as shown in FIG. 2F, at the final stage, there is a programmable gain amplifier (PGA) to re-boost the signal amplitude level. Therefore, in the transmission of the analog signal, it is a unit gain operation to keep all the frequency contents of the transmitted analog signal. As the analog signal is transmitted to the end terminal, then the analog signal is re-boost the amplitude level with the PGA for the ADC, etc.

As shown in FIG. 2F and FIG. 4B, for the active circuit in the analog signal chain, the analog buffer must have the high bandwidth, too. The active circuit of the analog buffer is a unit gain amplifier. The output signal is equal to the input signal. To make Vo=Vi, the amplifier has to have the high gain. However, for the high frequency analog signal, the bandwidth of the analog buffer must be large.

Furthermore, the ideal specification for the analog buffer is
[$1^{st}$] Single stage bandwidth;
[$2^{nd}$] Two stage amplification gain;
[$3^{rd}$] Dynamic Output Driving Current. Switch to save power
  Io>>0 as Vo!=Vi
  Io=0 as Vo=Vi
[$4^{th}$] the Vo has no feedback impact on Vi(Vi+−Vi−) in other words, Vo doesn't connect with Vi−

To satisfy the above fourth criteria, the pipeline analog buffer is invented as shown in FIG. 4C and FIG. 4D for the FPHA embedded in a single chip of Field Programmable System Chip(FPSC™). The pipeline analog buffer also has the pipeline circuit architecture. To have the output signal voltage to be equal to the input signal voltage, each stage of the analog buffer has to have the pseudo two stages to have the larger gain. However, as shown in FIG. 4E, two-stage amplifier has the narrower bandwidth due to the addition of the extra poles. To have the faster response and large bandwidth, the feedback loop is decoupled to be the pipelining smaller local loops as shown in FIG. 4C.

So, the analog buffer has gain to be two stages, however, the bandwidth is only single stage, $f_{1stage}$. FIG. 4D is one illustrative circuit example for the pipelining analog buffer which is correspondent to the pipeline analog buffer as shown in FIG. 4C.

Before, the FPAA doesn't have the pipelining analog buffer to divide the long connectivity to be the short segments of connectivity. Therefore, the FPAA is small size and the FPAA operates at the low frequency.

With the pipelining analog buffer, the FPHA embedded in a single chip of Field Programmable System Chip(FPSC™) can divide the long connectivity to be the short segments of the connectivity. Therefore, the FPHA embedded in a single chip of Field Programmable System Chip(FPSC™) can be large size and operates at high frequency. With the pipelining analog buffers, for the very long connectivity in FPHA embedded in a single chip of Field Programmable System Chip(FPSC™), the analog signal will travel on the long connectivity and the waveform still keeps the same shape without the loss of the signal fidelity.

The pipeline connection is for the both the high speed digital circuit and the high frequency analog circuit FPHA embedded in a single chip of Field Programmable System Chip(FPSC™). As shown in FIG. 5A, it is the fundamental programmable block being implemented with the digital MUX having the digital buffer to drive the output load. FIG. 5B is the digital switch for FPGA implemented with the digital MUX.

Similarly, as shown in FIG. 5C, it is the fundamental programmable block being implemented with the analog MUX having analog buffer to drive the output load. FIG. 5D is the analog switch for FPAA implemented with the analog MUX.

The digital MUX and analog MUX have the very important application in the FPHA embedded in a single chip of Field Programmable System Chip(FPSC™). As shown in FIG. 5E, the FPHA embedded in a single chip of Field Programmable System Chip(FPSC™) is constituted of the Configurable Module Block(CMB), Configurable Analog Block(CAB), Configurable Logic Block(CLB), Configurable Transistor Block(CTB) and Switch Box (SB). The Switch Box (SB) has the digital MUX, analog MUX, digital buffer or analog buffer to drive the long line which has the large capacitive load.

Figure 5H:
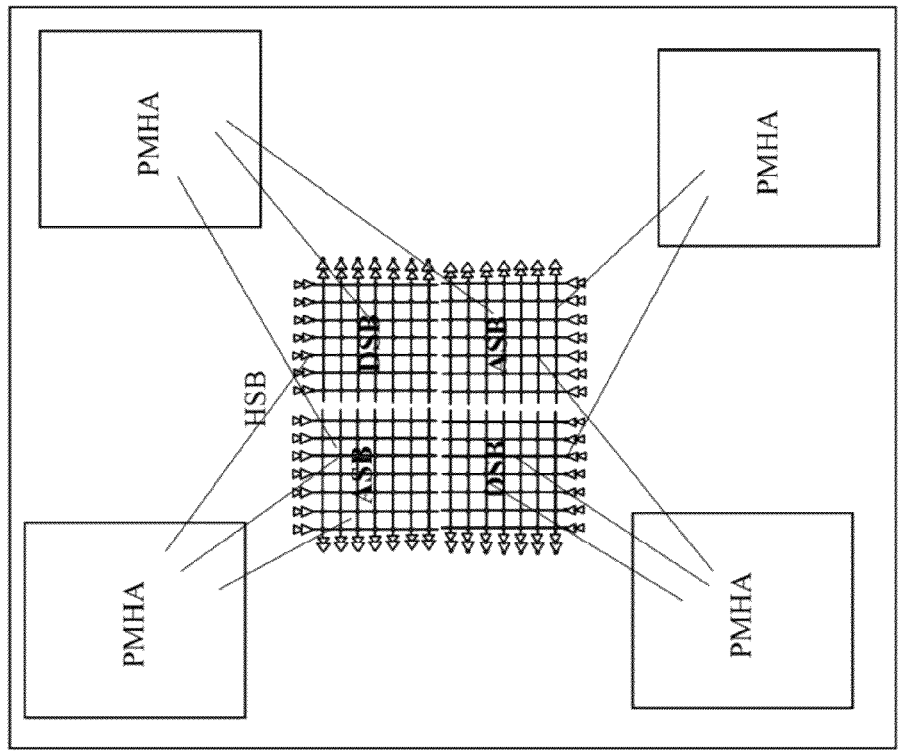
Figure 5F:
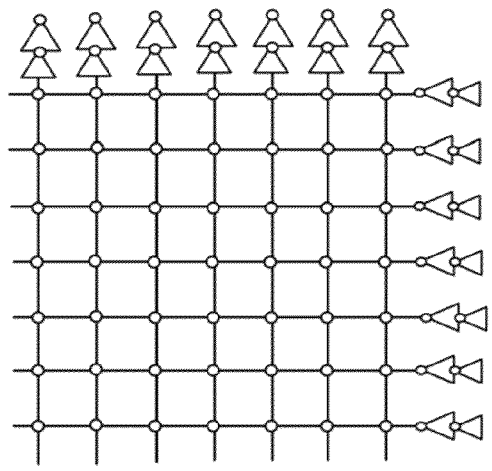

For the large scale Buffered Digital Crosspoint Switch, as shown in FIG. 5F, the n×n switch array can make the switch from any of the n inputs to switch to any of n output. The circle "o" on the cross lines represents the switch. It can be the SRAM switch or flash switch, etc. There are input digital buffer to drive the switch array capacitive load and the output digital buffer to re-boost the signal and drive the output load.

Figure 5G:
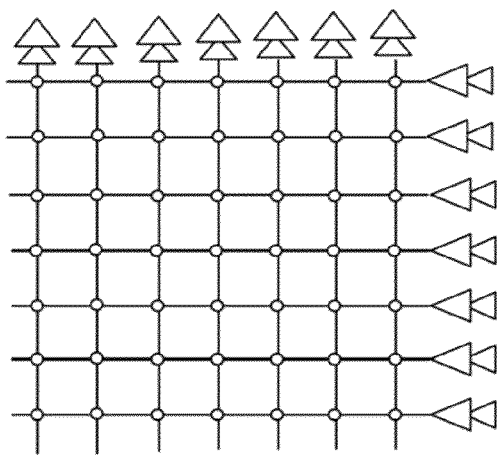

Similarly, for the large scale Buffered Analog Crosspoint Switch, as shown in FIG. 5G, the n×n switch array can make the switch from any of the n inputs to switch to any of n output. There are input analog buffer to drive the switch array capacitive load and the output analog buffer to re-boost the signal and drive the output load.

Figure 5I:
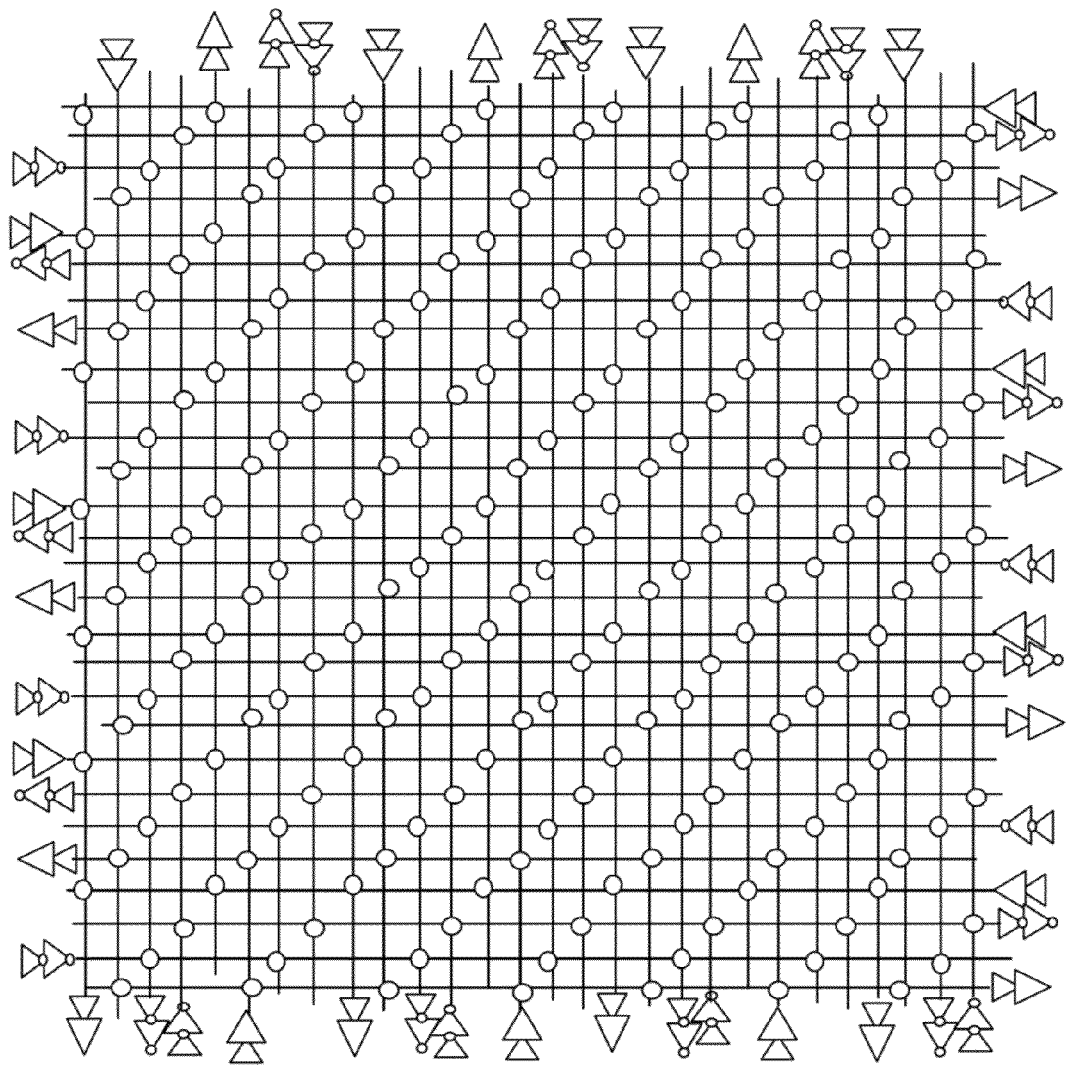
Figure 5K:
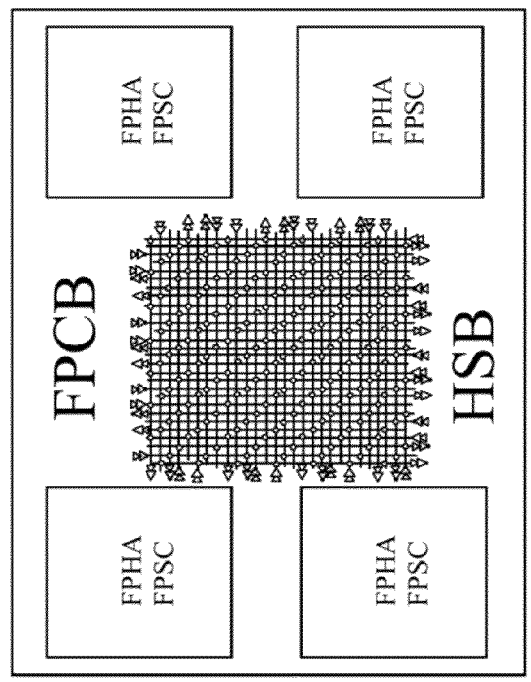
Figure 5J:
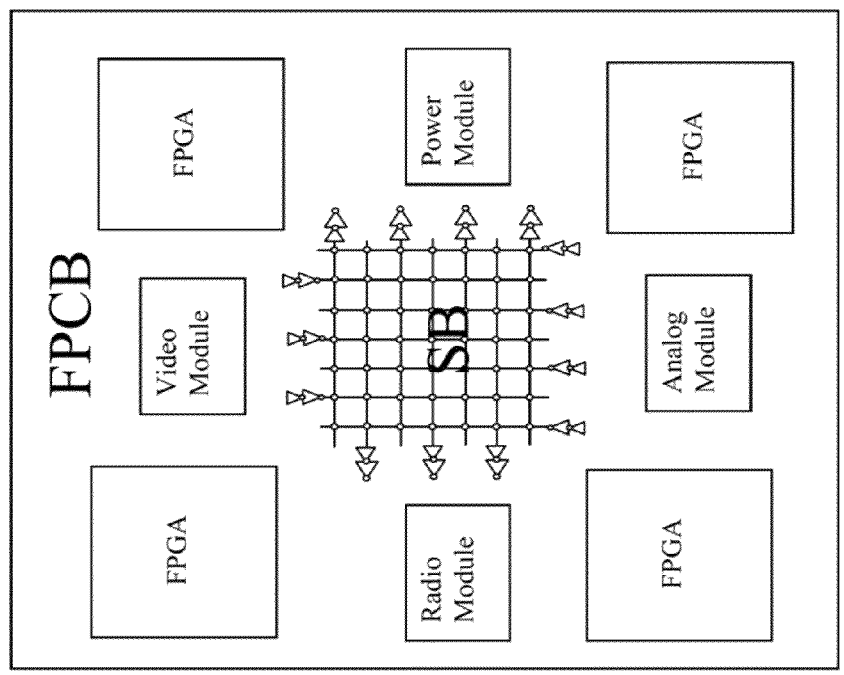

The Buffered Digital Crosspoint Switch and the Buffered Analog Crosspoint Switch have the very important application in the Field Programmable Print Circuit (FPCB) for the system emulation. Before, the FPCB has only the digital FPGA and the Buffered Digital Crosspoint Switch. It has to use the off-shelf analog chips mounted on the daughter board to plug in the FPCB as the daughter board to implement the whole system emulation. As shown in FIG. 5H, the Hybrid Switch Box (HSB) is constitute the digital switch box (DSB) being made of the Buffered Digital Crosspoint Switch and the analog switch box (ASB) being made of the Buffered Analog Crosspoint Switch. With the FPHA embedded in a single chip of Field Programmable System Chip(FPSC™) and the Hybrid Switch Box (HSB) embedded in a single chip of Field Programmable System Chip(FPSC™), the FPCB can emulate the whole system without the off-shelf chips at all. SB is the switch box in FPHA embedded in a single chip of Field Programmable System Chip(FPSC™); HSB embedded in a single chip of Field Programmable System Chip(FPSC™) is the switch chip of PCB. The switch box and switch chip have the dual functions of the switch signal, boost up the signal to increase the speed and keep the fidelity of the signal. A system design has the field programmable hybrid switch made of analog buffer and digital buffer. As shown in FIG. 5I, the hybrid switch chip (HSC) embedded in a single chip of Field Programmable System Chip(FPSC™) has both the digital switch and analog switch overlapping with each other. The analog inputs, analog outputs, digital inputs and digital outputs are even distributed on the four edges of the hybrid switch chip (HSC) embedded in a single chip of Field Programmable System Chip(FPSC™). With the FPHA and HSC, any system can be emulated with the FPCB. With the HSC, the on-board vias are reduced. The routing wires can be in one single layer to be the river router. The speed of the board can increase a lot.

Figure 6A:
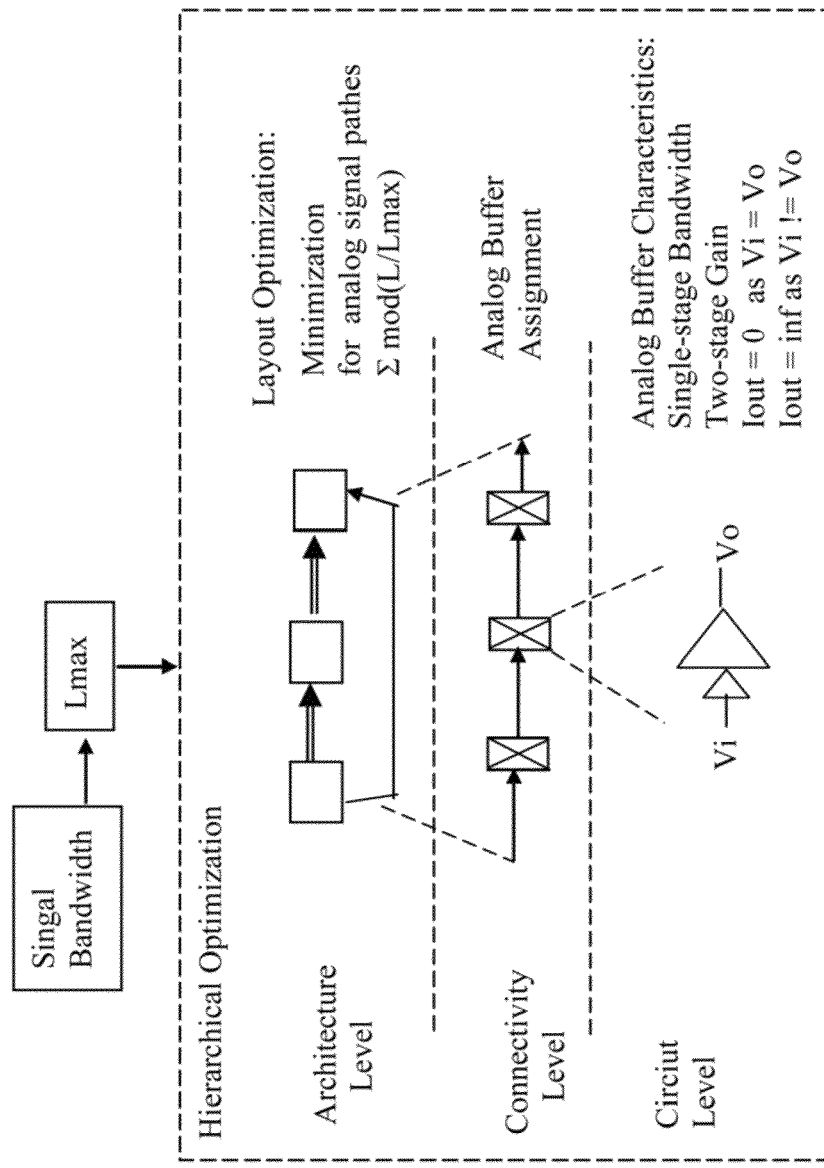

As shown in FIG. 6A, it shows the hierarchical optimum design flow and algorithm for the analog signal paths optimization of FPHA. First, according to the bandwidth of the analog signal to decide the maximum connectivity length of the analog signal. The bandwidth $(1/RC)_{max}$ of the maximum length $L_{max}$ is large or equal to bandwidth of analog signal. Therefore, the highest level of the hierarchical optimization is the Layout Optimization, the Minimization of the analog signal paths $$\min[\Sigma \bmod(L/L_{max})]$$

In the second level optimization is the Analog Buffer Assignment in the Connectivity Level. The bottom level optimization is the optimum circuit design for the Analog Buffer. As shown in FIG. 6A and FIG. 4D, the idealized Analog Buffer Characteristics are as follow.
[1] Single stage Bandwidth: having the bandwidth of single state amplifier
[2] Two stage Gain: having the gain of two-stage amplifier and the dynamic switching driving current capability of
[3] Iout=0 as Vi=Vo
[4] Iout=∞ as Vi!=Vo The same principle can be applied to include the digital connectivity effect with the modification of the objection to be $$\min[\Sigma \bmod(L/L_{max,analog})+c\Sigma \bmod(L/L_{max,digital})]$$

where c is the weighting factor for the digital connectivity.

A system design on chip comprises field programmable hybrid array embedded in a single chip of Field Programmable System Chip(FPSC™) having pipeline architecture with the analog buffer and digital buffer. Applying the hierarchical optimization algorithm to the high speed and high frequency data streaming design, as shown in FIG. 6B, the FPHA embedded in a single chip of Field Programmable System Chip(FPSC™) will be in the pipelining structure of radio/analog/digital structure. As shown in FIG. 6C, the Field Programmable Hybrid Array FPHA embedded in a single chip of Field Programmable System Chip(FPSC™) has the Field Programmable Radio Array FPRA, Field Programmable Analog Array FPAA and Field programmable Gate Array FPGA in the pipelined structure which is consistent with the architecture in FIG. 1. As shown in FIG. 6D, there is two-way pipeline structure. The analog is on one-side; the digital is on the other side. The FPHA chip embedded in a single chip of Field Programmable System Chip(FPSC™) is split to be analog, mixed signal and digital zones with the pipeline architecture. FIG. 6E is the hierarchical structure of the two-way pipeline structure.

The Field Programmable Hybrid Array embedded in a single chip of Field Programmable System Chip(FPSC™) is to unify and integrate all the different field programmable devices such as the FPAA, FPGA, FPLA, FPMA, FPRA, FPTA and Frequency Programmable Xtaless ClockChip with Trimless/Trimfree Self-Adaptive Bandgap Reference Xtaless ClockChip to have the system design on chip(SDOC) embedded in a single chip of Field Programmable System Chip (FPSC™). FPAA is Field Programmable Analog Array; FPGA is Field Programmable Gate Array; FPLA is Field Programmable Logic and Analog; FPMA is Field Programmable Module Array; FPRA is Field Programmable Radio Array; FPTA is Field Programmable transistor Array.

Figures 7A, 7B:
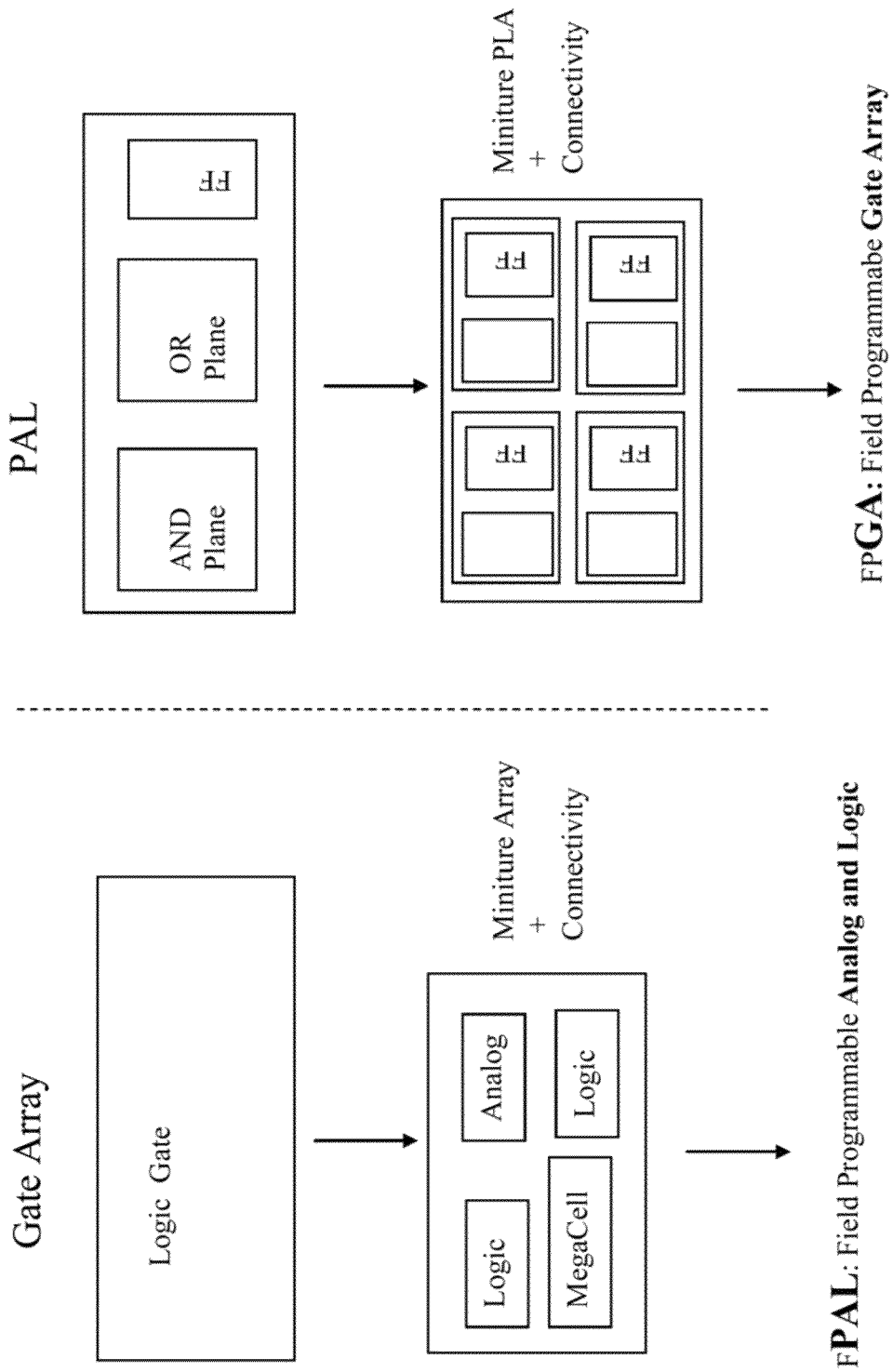
FIG. 7(A) is the evolution of the Field Programmable analog and logic (FPAL) of gate array; (B) is the evolution of the Field Programmable Gate Array (FPGA).

As shown in FIG. 7, we make the brief historical review of the technology evolution of the field programmable integrated circuit FPIC embedded in a single chip of Field Programmable System Chip(FPSC™). FIG. 7A shows the evolution of FPLA from the gate array (GA); FIG. 7B shows the evolution of FPGA from the Program Array Logic (PAL).

As shown in FIG. 7A, the analog module and/or Megacell are added to the regular gate array with the addition of the programmable connectivity, the gate array evolves to be the FPAL: Field Programmable Analog and Logic. As shown in FIG. 7B, the PAL has the logic AND plane, logic OR plan and flip-flop FF. Then as the PAL evolves to be the FPGA, the logic AND plane, logic OR plan are merged and converted to be the Look-Up-Table(LUT) with the addition of the programmable connectivity.

Comparing FIG. 7A with FIG. 7B, ironically, the Gate Array GA evolves to the FPAL; the PAL evolves to be FPGA. The swapping between the FPGA and FPAL is due to the lack of the technical sense. It is the reason why the FPHA embedded in a single chip of Field Programmable System Chip (FPSC™) makes the unification of the field programmable technology to have the system-design on-chip embedded in a single chip of Field Programmable System Chip(FPSC™) capability.

Figure 8B:
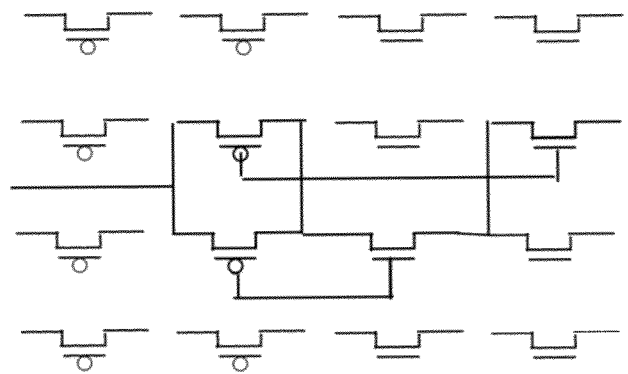
FIG. 8(A) is field programmable transistor array (FPTA) implementing the cascade amplifier; (B) is the field programmable transistor array (FPTA) implementing the logic gate.
Figure 8A:
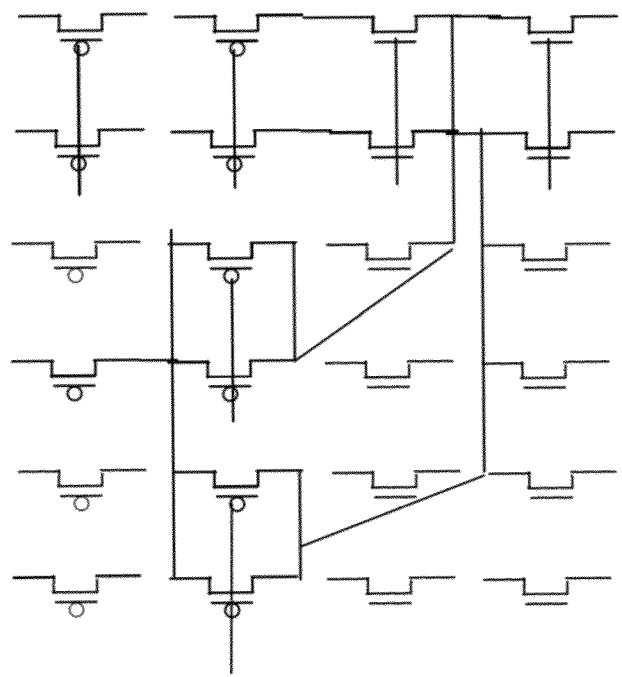

As shown in FIG. 8, it shows the Field Programmable Transistor Array(FPTA). It has the application in the neural network. However, a lot of people think it is the Field Programmable Analog Array(FPAA). As shown in FIG. 8A, the cascade amplifier is implemented with the Field Programmable Transistor Array(FPTA); as shown in FIG. 8B, the logic NAND gate is implemented with the Field Programmable Transistor Array(FPTA). Even doesn't count the programmable connectivity, on the average, active transistor needs 22 background programmable transistors to support. The ratio is too high for the analog circuit. Furthermore, the programmable connectivity resistance is too high for the high performance high frequency analog circuit.

In the FPHA embedded in a single chip of Field Programmable System Chip(FPSC™), there are the analog circuits. The FPHA platform embedded in a single chip of Field Programmable System Chip(FPSC™) needs to have a lot of special functions to support the analog circuit especially in the start-up transition period.

Figure 9A:
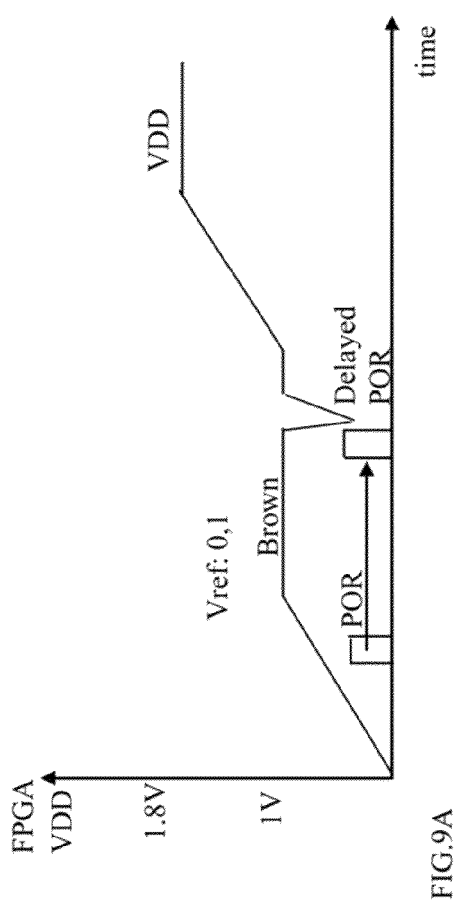
FIG. 9(A) is dangerous power on resent (POR) and power-on-sequence (POS) in the FPGA of the prior art; (B) is the safe analog power on reset (APOR) and power-on-sequence (POS) based on the bandgap reference for analog circuits of FPHA.
Figure 9B:
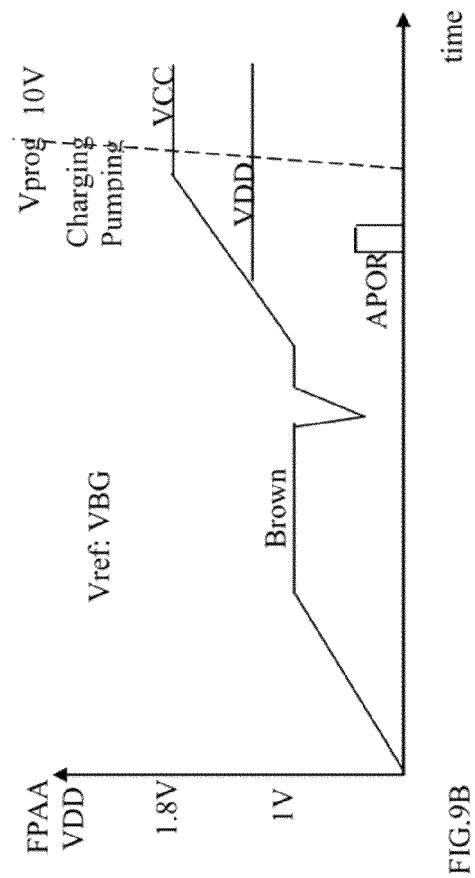

As shown in FIG. 9A, for the digital/logic circuit, there is a Power-On-Reset (POR) circuit to reset the flip-flop FF to be the initial states. As shown in FIG. 9B, for the analog comparator, there is the need for the Analog Power-On-Reset (APOR) circuit to acknowledge the valid of the comparing results. The APOR is generated by the bandgap reference generator. Therefore, the bandgap reference generator is one key analog circuit in the FPHA platform.

Figure 10A:
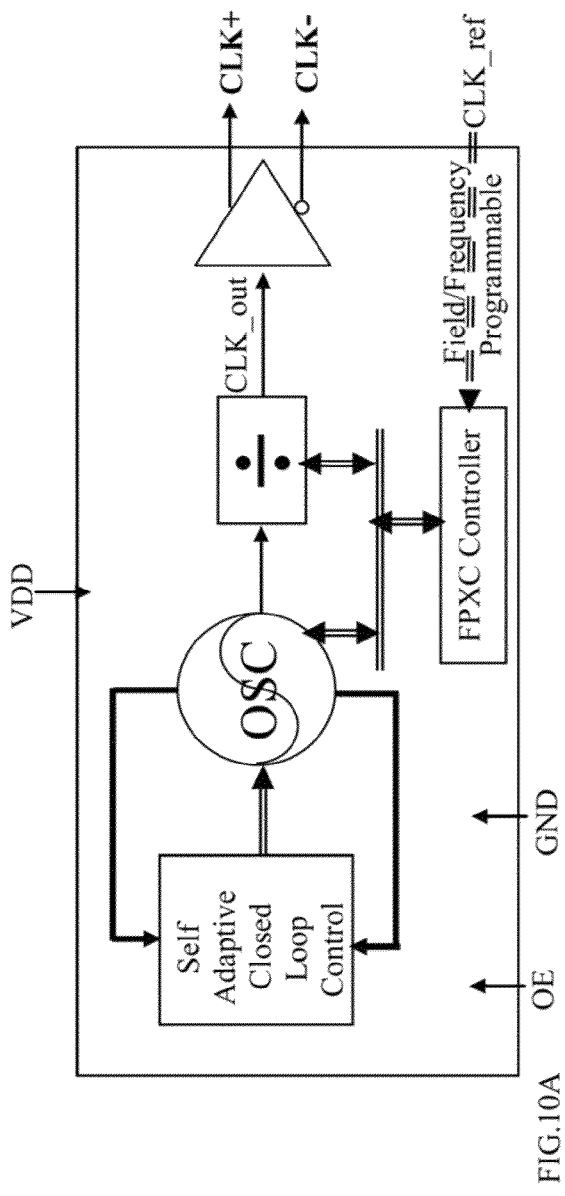
FIG. 10(A) is the frequency programmable xtaless clock (FPXC); (B) is the controller for the process and temperature self-adaptive bandgap for the frequency programmable xtaless clock (FPXC); (C) is the programmer for the frequency programmable xtaless clock (FPXC); (D) is the frequency programmable xtaless clock (FPXC) oscillating at the programming frequency.

Furthermore, all the clock-driven logic circuit needs the accurate clock. As shown in FIG. 10A, the timeless/trimfree Xtaless ClockChip has no external trimming. A system design on chip comprises the frequency programmable clock. The frequency programmable clock comprises programmable frequency controller. As shown in FIG. 10C and FIG. 10D, sending a reference clock signal into the frequency programmable clock, the programmable frequency controller adjusts the self-adaptive resonator to have the oscillator frequency been locked with the reference clock signal.

The Frequency Programmable Xtaless Clock(FPXC) has the Self Adaptive Closed Loop Control for both the process and temperature compensation. The Self Adaptive Closed Loop Control generates the bandgap reference current which is compensated for both the processes variation and the temperature compensation to be constant over the process and temperature variation. The accurate compensated bandgap reference is sent to the oscillator to control the oscillation amplitude and oscillation frequency with the oscillation frequency amplitude control methodology. Then the programmable oscillation frequency can be programmable to be divided to be any frequency in the field as the customer request. As shown in FIG. 10C, the customer just mounts the FPXC on the FPXC programmer and inject the reference clock CLK_ref into the FPXC, the FPXC controller will automatically to tune the output clock to be the frequency of the reference clock CLK_ref. As shown in FIG. 10D, as the FPXC is removed from the FPXC programmer, the FPXC will oscillate at the frequency of the reference clock CLK_ref. The clock frequency of the conventional clock chip is set by the registers to be the frequency specified by the data sheet. However, each chip is different that the clock frequency being set up with the registers might not be accurate and has a lot of deviation. For the frequency programmable clock chip, it is directly programmed to be the clock frequency injected into the clock chip. The field programmed clock frequency is much more accurate.

Figure 10B:
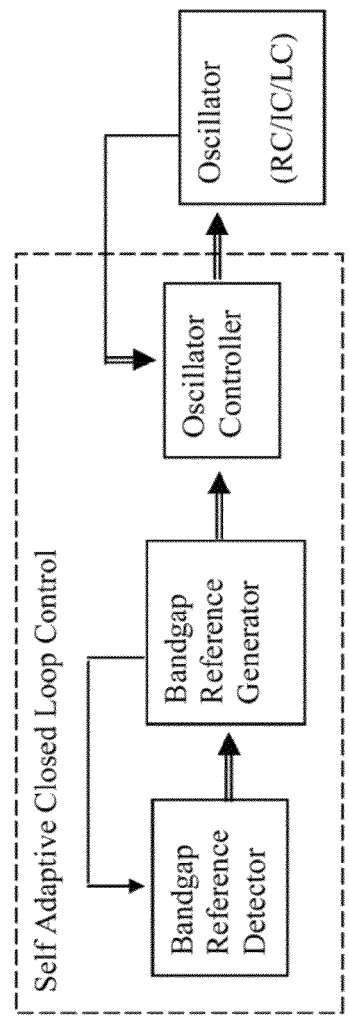
Figure 10D:
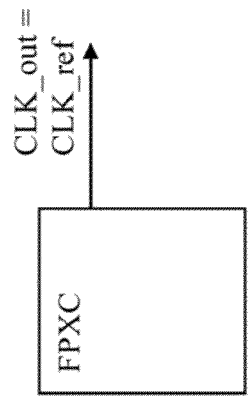
Figure 10C:
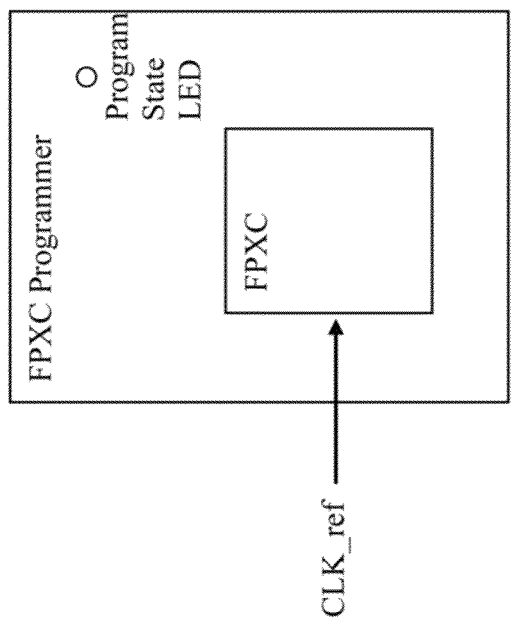

As shown in FIG. 10B, it shows the detailed block diagram of the Self Adaptive Closed Loop Control. The build-in Bandgap Reference Detector detects the variance of the Bandgap Reference Detector and makes the adjustment for the Bandgap Reference Detector. The Bandgap Reference Detector generates the process and temperature compensated reference voltage and current for the Oscillator Controller. Based on the process and temperature compensated reference voltage and current, the Oscillator Controller controls the Oscillator(RC/IC/LC).

A system design on chip means further comprising a self-adaptive process and temperature compensation bandgap reference circuit. The self-adaptive process and temperature compensation bandgap reference circuit generates process-independent and temperature-independent voltage and current from the bandgap reference circuit with process compensation and temperature compensation. FIG. 10B shows the detailed block diagram of the Self Adaptive Closed Loop Control. Even the Bandgap reference generator has the feedback control loop, too. The self-reference bandgap reference generator has the structure to embed the self-reference in the circuit structure. The self-adaptive control of the bandgap reference will pull the bandgap reference back to the equilibrium point. The equilibrium point is the middle point of the process variance and the temperature variance. The temperature compensation and process compensation bandgap reference sends the voltage and current Infotainment to the oscillator control. The oscillator control uses the voltage and current to control the oscillator. The oscillator is also a closed loop feedback loop control. The oscillator can be RC oscillator, IC oscillator or LC oscillator. All of them have the same essential characteristics.

As shown in FIG. 11A and FIG. 11B is the LC resonator having the both the temperature compensation and process compensation. As shown in FIG. 11C, it is the frequency variation due to the process variation and temperature variation. Usually, the process variation is much larger than the temperature variation. However, the process variation will be fixed after the chip is manufactured. Only the temperature variation will be counted in the operation. To compensate the process variation, we have the field programmability to compensate for the process variation. The user will field program the FPXC to be the $f_o$. In the field program process, the $f_o$ due to the process variation will be compensated and corrected. Therefore, as long as the bandgap reference is compensated for temperature and process variation, the LC resonator will have the compensation in temperature and field program to compensate the process variation.

The LC is designed for $$f_o = (L_o C_o)^{-1/2}$$

As the temperature or process variation, $$f_o = [(L_o + \Delta L)(C_o - \Delta C)]^{-1/2}$$
$$= [L_o C_o (1 + \Delta L/L)(1 - \Delta C/C)]^{-1/2}$$
$$= [L_o C_o (1 + \Delta d/d)(1 - \Delta d/d)]^{-1/2}$$
$$= [L_o C_o (1 - (\Delta d/d)^2)]^{-1/2}$$

where $\Delta d/d$ is the variation due to both the temperature and process variation. For the temperature compensation, the variation of the frequency due to $(\Delta d/d)^2$ is at the order of $10^{-10}$ to be neglected.

Figure 12A:
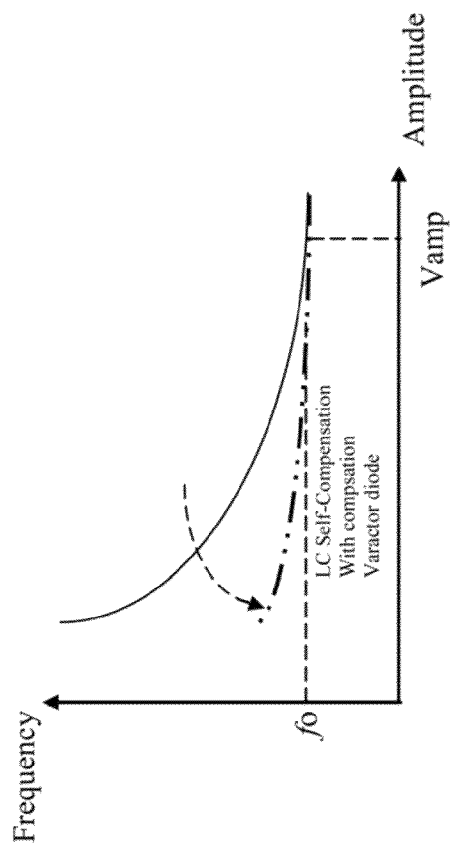
FIG. 12(A) is the frequency variance with and without the process and temperature compensation; the self-adaptive compensation reduces the sensitivity of the oscillation amplitude on the oscillation frequency; (B) is the self-adaptive bandgap current reference over the temperature and process plan.
Figure 12B:
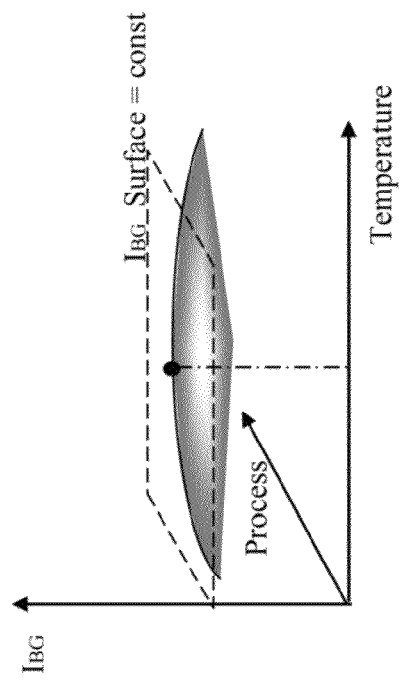

As shown in FIG. 12A, in the design of LC oscillator, we have use the self-compensation technique to reduce the amplitude effect on the variance of frequency. However, there still have the minor effects of the amplitude over the variance. The amplitude control of the LC oscillator, we need the accurate voltage reference which is independent of the process and temperature. To have the accurate control over PVTH (Process, Voltage, Temperature, Humidity) variation for the LC oscillator, as shown in FIG. 12B, we need to have the self-adaptive process-compensation for the bandgap reference generator. The bandgap reference itself has the temperature compensation. However, it doesn't have the process-compensation. The variance of the process will cause more deviation than the temperature. Therefore, we need to develop the self-adaptive process-compensation for the bandgap reference generator. However, this self-adaptive process-compensation also can further improve the curvature temperature compensation for the bandgap reference and reduce or eliminate the curvature of the temperature compensation.

To generate the bandgap voltage reference, we use the $V_{BE}$. As shown in FIG. 13A, the $V_{BE}$ varies over both temperature and process. There are infinite variances of the $V_{BE}$. However, the foundry will supply only five different representative $V_{BE}$ for the design, $V_{BE}(TT)$, $V_{BE}(FF)$, $V_{BE}(SS)$, $V_{BE}(FS)$. $V_{BE}(SF)$ where TT is typical-P-typical-N corner; FF is fast-P-fast-N corner; SS is slow-P-slow-N corner, FS is fast-P-slow-N corner and SF is slow-P-fast-N corner. The smaller $V_{BE}$, the larger the current and the faster the circuit. The larger $V_{BE}$, the smaller the current and the slower the circuit. Therefore, the $V_{BE}(FF)$ is the smallest value and the $V_{BE}(SS)$ is the largest value. Since it has the infinite process variation. There is no way to have the pre-tuned circuit for the infinite process variation. Therefore, the self-adaptive process compensation can automatic fine tune up for the infinite process variance to have the constant bandgap reference value.

$V_{BG}$ is the bandgap voltage of the physical property to be the constant at $-273°$ C. It is the essential characteristics of the self-adaptive compensation. It is the final reference. Without this final reference, the self-adaptive process will not work. The bandgap reference equations are as follows. There are voltage mode and current mode. For the sub-1V bandgap reference generator, it has to use the current mode.

Voltage Mode:

$$V_{BG}(P) = V_{PTAT}(P,T) + V_{CTAT}(P,T) => 1.25V$$

Current Mode:

$$I_{BG}(P) = I_{PTAT}(P,T) + I_{CTAT}(P,T) \Rightarrow I_{BG}(P) * R_{BG} < 1V$$

As shown in FIG. 13B,

PTAT: Proportional To Absolute Temperature

CTAT: Complementary To Absolute Temperature

CTAT is the $V_{BE \times n}$ itself. PTAT is the difference of $V_{BE \times 1} - V_{BE \times n}$.

From the equation, all the process Information is in $I_{BG}(P)$. In the design of the process self-compensation circuit, we should use the $I_{BG}(P)$ as the source of the process Information. It is fundamental mistake to use the $V_{BE}(P,T)$ as the source of the process Information.

Figure 19:
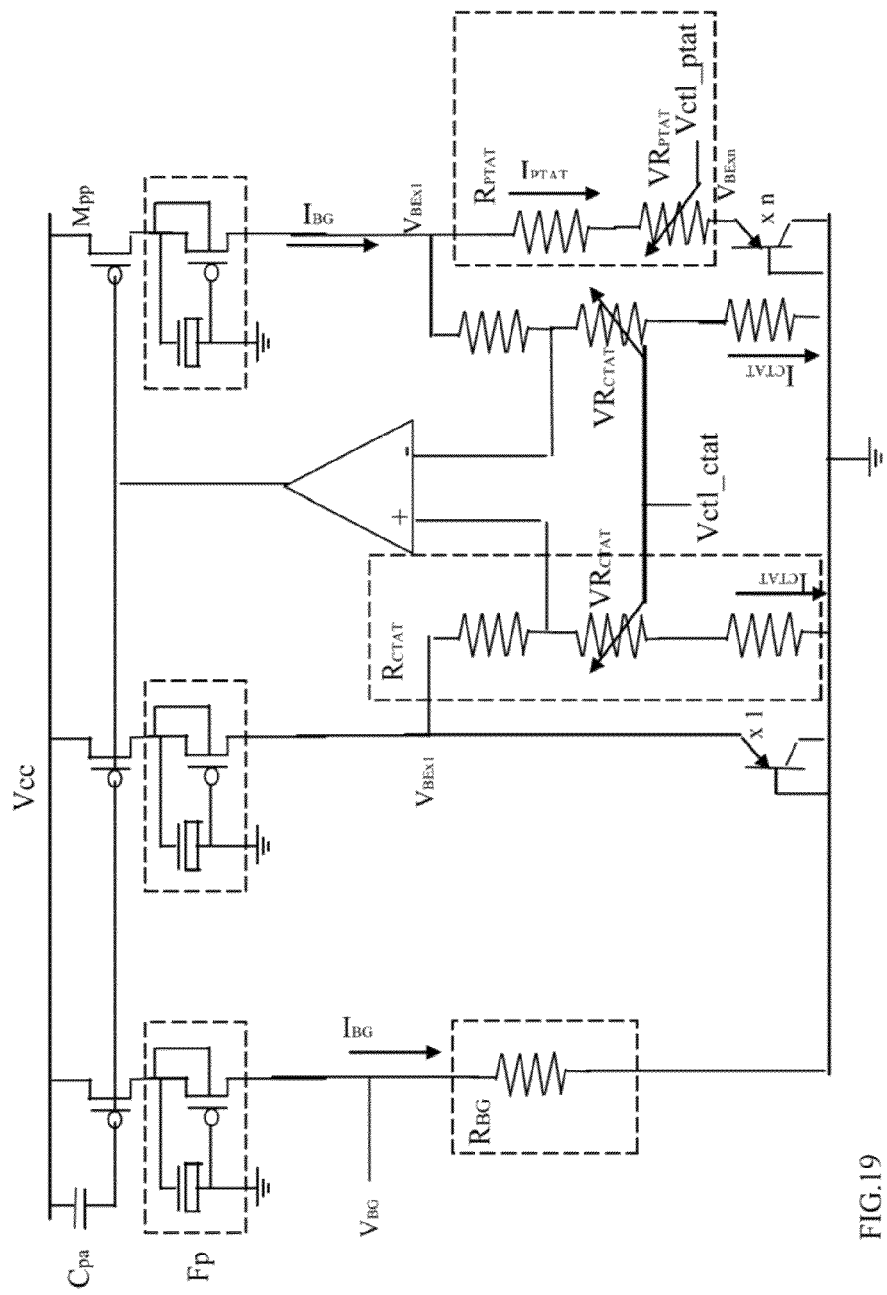
FIG. 19 is the self-adaptive bandgap reference generator.
Figure 20:
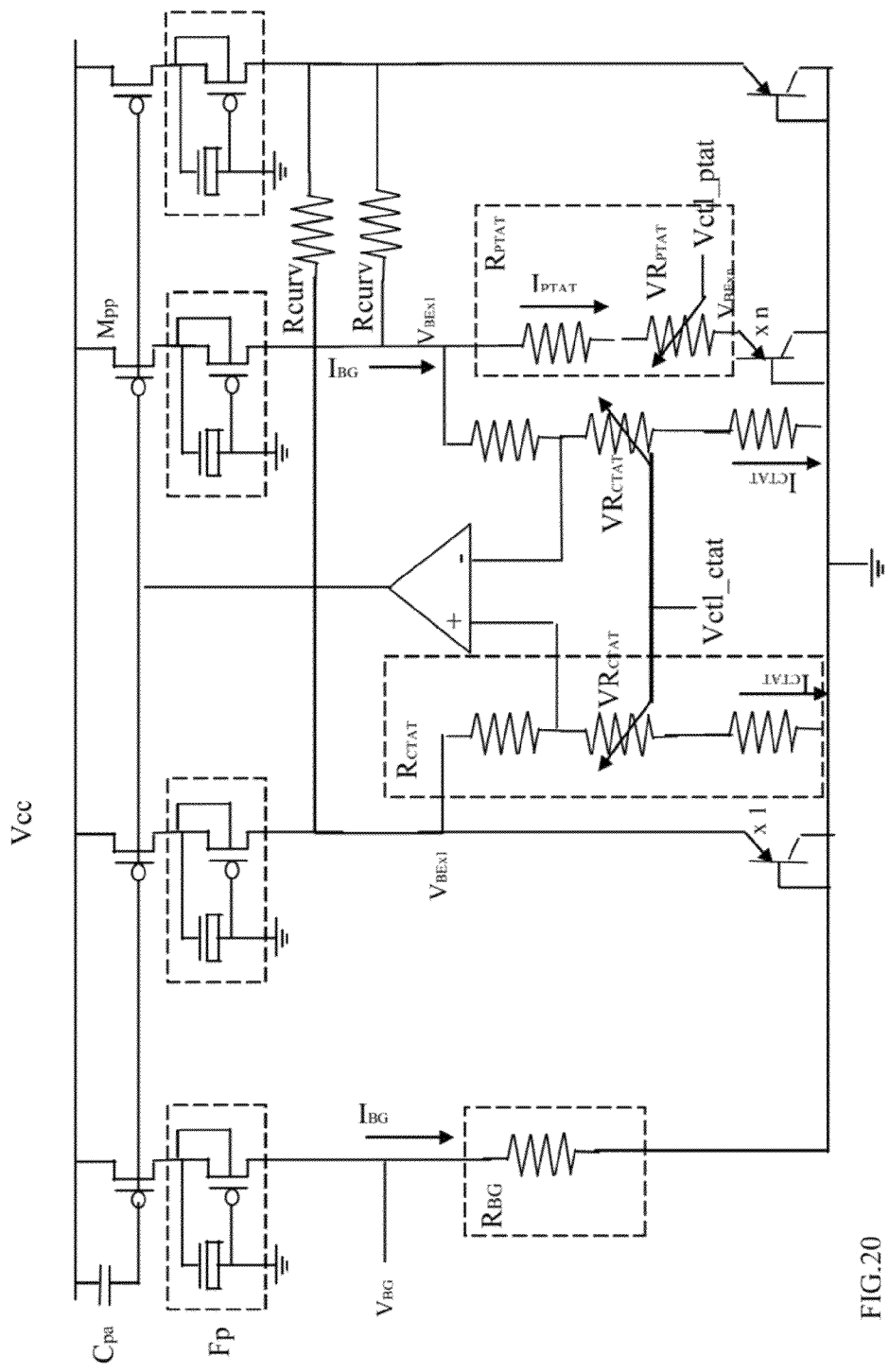
FIG. 20 is the self-adaptive bandgap reference generator having the curvature compensation.
Figure 23A:
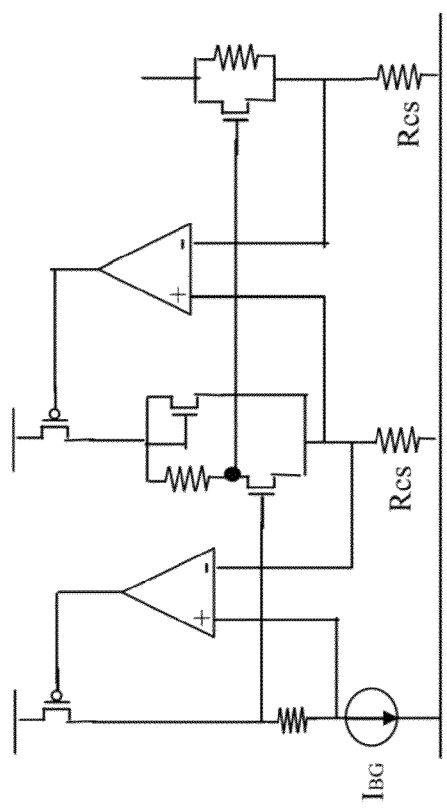
FIG. 23(A) is the variable resistor $VR_{CTAT}$ for the complimentary to absolute temperature (CTAT) as shown in FIG. 20; (B) is the variable resistor $VR_{PTAT}$ for the proportional to absolute temperature (PTAT) as shown in FIG. 20.
Figure 23A:
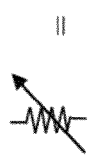
Figure 23B:
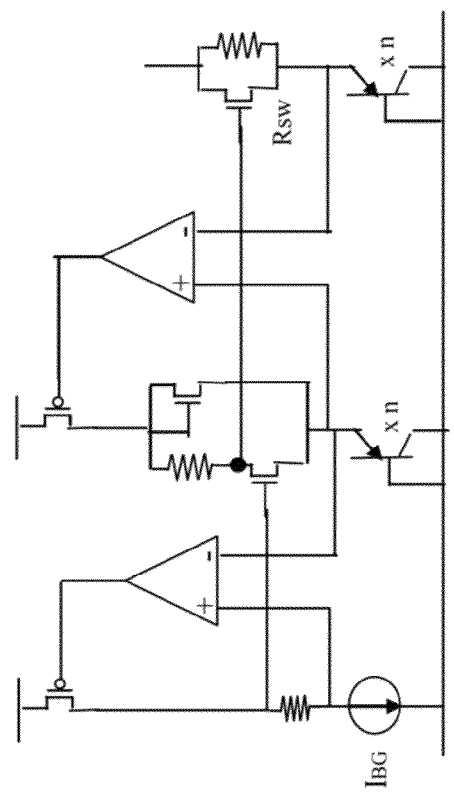
Figure 23B:

The core technology of the self-adaptive control of the LC resonator is to have the process-independent bandgap reference. For the sub-1V bandgap reference, we need to use the current mode $I_{BG}$. Therefore, as shown in FIG. 19 and FIG. 20, we will use the sub-1V bandgap reference generator to discuss the process-compensation. The same technology can be applied to the voltage mode $V_{BG}$.

The conventional approach to the process variation is to find out the type of process. Then program the NVM to record the compensation. It is the digital type approach. There are two defects. First, as shown in FIG. 13C, the process variation is infinite in one band. It is impossible to handle all the variation with the finite digital memory. Today, there are already having the chips which can run having the clock jitter only 25 ppm. However, most of the chip only has 100 ppm. For the 25 ppm, it just happens to have the best-fit tune-up for the process. For the 100 ppm, there is no perfect fit tune up for the digit NVM trimming approach. Second, even with the finite approach of NVM to make the curve fitting for the compensation, it is only has the good approximation from 0 degree to 70 degrees. Beyond the range, the clock frequency becomes weird. However, the bandgap reference actually can tune from −40 degrees to 125 degrees with 4 mv deviation only. Therefore, even with the NVM curve fitting, the fitting range is still limited to the narrow range of 70° C.

Furthermore, for the conventional trimming process, to trim for the process variation, it needs the I²C bus, temperature sensor, ADC, NVM, DAC, etc to make the digital tune-up of the ClockChip. Even worse, it needs the burner to make the temperature compensation. Then, with the need of the burner for test and calibration, it is impossible to have the field/frequency programmable Xtaless Clockchip.

The field/frequency programmable Xtaless Clockchip needs to be able to be programmed at any temperature. Only with the self-adaptive temperature and process compensation, then the Xtaless Clockchip has the field/frequency programmable capabilities.

Therefore, the trimless/trimfree is not only simple not having the digital circuit but also has the superior performance. With the analog tune of the self-adaptive process compensation, it can automatically have the perfect fit for the process variation to have the superior performance with the frequency variance being less 1 ppm.

As shown in FIG. 14A, for the $I_{BG}$(FF) and $I_{BG}$(SS), we need to do both the curvature compensation and level shift.

$$V_{BG,adap} = \text{constant}$$
$$= V_{BG,adap}(TT)$$
$$= V_{BG,adap}(FF)$$
$$= V_{BG,adap}(SS)$$
$$= V_{BG,adap}(FS)$$
$$= V_{BG,adap}(SF)$$

$$I_{BG,adap} = \text{constant}$$
$$= I_{BG,adap}(TT)$$
$$= I_{BG,adap}(FF)$$
$$= I_{BG,adap}(SS)$$
$$= I_{BG,adap}(FS)$$
$$= I_{BG,adap}(SF)$$

Apparently, for the $I_{BG}$(FF) and $V_{BG}$(FF), the $I_{PTAT}$(FF,T) has larger component than the typical case $I_{BG}$(TT,T). For the $I_{BG}$(SS) and $V_{BG}$(SS), the $I_{PTAT}$(SS,T) has smaller component than the typical case $I_{BG}$(TT,T). Modifying the $R_{PTAT}$ to change the $I_{PTAT}$ has the effect on both curvature compensation and level shift of the $I_{BG}$. We treat the curvature compensation as the "differential mode" and the level shift to be the "common mode". In the curvature compensation differential mode, we just change the $R_{PTAT}$ to change the curvature to make the curve to be flat. In the level shift common mode, we need to tune both the $R_{PTAT}$ and the $R_{CTAT}$ to shift the curves to merge.

To calibrate the process, we follow the following systematic procedure

The 1$^{st}$ step: we tune the circuit for $I_{BG}$ for the TT case
Differential Mode
The 2$^{nd}$ step: keep the $R_{CTAT}$ to be constant, we tune $R_{PTAT}$ for $I_{BG}$ for the FF case
The 3$^{rd}$ step: keep the $R_{CTAT}$ to be constant, we tune $R_{PTAT}$ for $I_{BG}$ for the SS case
Common Mode
The 4$^{th}$ step: tune the $R_{CTAT}$ and $R_{PTAT}$ for $I_{BG}$ for the FT case
The 5$^{th}$ step: tune the $R_{CTAT}$ and $R_{PTAT}$ for $I_{BG}$ for the SS case
After the above calibration, we will have the feeling how much we need to tune the circuit to be the process self-compensation for the $I_{BG}$.

The self-adaptive process compensation has the feedback mechanism. However, the self-adaptive process compensation is not the conventional feedback control. As shown in FIG. 15, the conventional input-output feedback control can reduce the output error to follow the signal level of the input signal.

$$Vi - Vo = \epsilon; \; Vo = A\epsilon$$

$$\epsilon = Vi/(A+1) \; Vo = AVi/(A+1) = Vi$$

For the negative feedback system, we can increase the gain A to reduce the error. However, for the self-adaptive process compensation bandgap reference generator does not have such kind luxury. It is not the negative feedback control system. It is the positive state feedback control as shown in FIG. 17. As shown in FIG. 16A, the bandgap reference generator BG has the output reference $V_{BG}$ or $I_{BG}$. As shown in FIG. 16B, the bandgap reference generator BG is modeled to be a system function R, R=BG.

As shown in FIG. 17 and FIG. 18, the self-adaptive process compensation bandgap reference generator is modeled as the feedback control system with the self-adaptive structure modification input.

As shown in FIG. 18A, as the gain of the bandgap reference is Re, $$Ve=ReVe$$

As shown in FIG. 18B, as the structure is Re−ΔR, $$Ve+\Delta V=(Re-\Delta R)Ve$$

It is noted that we intentionally to use the negative sign for (−ΔR). It is to derive the negative feedback system block diagram.

Therefore, we have $$Ve+\Delta V-Ve=(Re-\Delta R)Ve-ReVe$$

we have $$-\Delta V=\Delta R\, Ve$$

The equation needs a little interpretation to generate the correct feedback control block diagram. We move the negative sign of (−ΔV) to the summation symbol, As shown in FIG. 18C, it shows that this is a negative feedback control with low gain ΔR. As long as the structure is changed, the output will run away with new equilibrium point. It is noted that in the new block diagram, the error signal and output signal are just the reverse the conventional feedback control block diagram. ε~Ve and Vo~ΔV. It is the trickiest and confused points of the self-adaptive process compensation mechanism. Substituting the state feedback system with the famous input-output feedback control relations, we have the detected error signal input to be the output of the conventional feedback control block diagram.

For the self-adaptive process compensation Input/feedback control, the output is $$\Delta V=(Ve+\Delta V)\Delta R/[1+\Delta R]$$

The error voltage ΔV is equivalent to the output due to the input of the equivalent voltage Ve.

Making the re-arrangement for the above equation, the equivalent voltage Ve is the self-adaptive process compensation Input Output/feedback control error.

$$Ve=(Ve+\Delta V)/[1+\Delta R]$$

From the above equation, the input of the self-adaptive process compensation becomes the error signal Ve+ΔV. As shown in FIG. 18C, all the feedback control concepts are completely reversed in the transformation from the self-adaptive process compensation to be the conventional input-output feedback control block diagram.

It is noted that with the transformation between the feedback control and the self-adaptive process compensation, the transform mapping is to have (1) the output becomes the input; and
(2) the error/input becomes output, The ΔV is the detected input for the self-adaptive process compensation. The Ve is the output of the self-adaptive process compensation.

Applying this result to the bandgap reference, with the detection of the error ΔV, the bandgap reference can bring the system to be the equivalent voltage Ve. It is just what we want. We prove the system work. It is a small perturbation of the system and the self-adaptive process compensation can bring the perturbation back to the original equivalent point, Ve.

From the fundamental equation, $$Ve+\Delta V-Ve=(Re-\Delta R)Ve-ReVe$$

The structure deviation is approximated with $$(Re-\Delta R-Re)Ve=(Ve+\Delta V-Ve)$$

$$\Delta R=\Delta V/Ve$$

It has the linear function to make the adjustment. So, as we detect the voltage deviation ΔV, we need to adjust the resistor of the bandgap mechanism ΔR which is proportional to the (ΔV/Ve) where Ve is a scaling factor.

Therefore, the self-adaptive process-compensation state feedback loop is completely different from the conventional input-output feedback loop control. With the transformation of self-adaptive process-compensation to the feedback control loop, we can calibrate the self-adaptive process-compensation system.

As ΔR=0, ΔV=0. We need to make the linear adjustment for (Re−ΔR) to be Re. For the internal "state" type "structural" adjustment path, we need to have the high linearity, high resolution that we need the high gain. For the external "I/O" type "systematic" operation path, this is the low gain converging path. As long as the internal state change, the output bandgap reference will shift to the new bandgap voltage to generate the ΔV, then the ΔV changes ΔR to bring the bandgap reference voltage back to Ve. It proves that the self-adaptive process-compensation feedback loop really works.

To select the self-built in Ve, the self-set equilibrium bandgap reference voltage is selected based on the middle point of process variation, i.e., the typical TT case. For the structure internal adjustment dynamic state adjustment, we need high sensitivity to detect the minor deviation of output bandgap reference voltage. To get the high sensitivity, we need have the high gain to have the fine resolution. From the minor deviation bandgap reference, the state control mechanism adjusts the $R_{PTAT}$ and $R_{CTAT}$ proportionally. This is the proportional linear state control.

It is noted that the self-adaption process compensation is not only for the process compensation but also has the curvature compensation for the temperature compensation effect. It will make the temperature curvature much more flat with the highly sensitive sell-adaption process compensation mechanism.

In summary, there are two feedback paths, the system IO path and the structure dynamic state DS path. For the structure dynamic state DS path, we need to have the high resolution and high linearity to adjust the structure state back to be the typical bandgap reference equilibrium point. The self-adaptive process and temperature compensation bandgap reference circuit means comprises the variable resistance. The variable resistance is parallel connection of linear variable resistance switch and resistance.

FIG. 19 is the process-compensation bandgap reference generator. FIG. 20 is the process self-compensation bandgap reference with the exponential nonlinear temperature compensation for much more accurate temperature compensation. A system design on chip has the self-adaptive process and temperature compensation bandgap reference circuit comprises the first diode x1 bipolar and the second diode xn bipolar in series with the variable resistor $R_{PTAT}$. The variable resistor $R_{CTAT}$ is in parallel with the x1 bipolar. Another variable resistor $R_{CTAT}$ is in parallel with the xn bipolar and the variable resistor $R_{PTAT}$. The $R_{PTAT}$ is for adjustment of proportional to absolute temperature PTAT variation. The $R_{CTAT}$ resistors is for complimentary to absolute temperature CTAT variation. The variable resistors $R_{PTAT}$ and $R_{CTAT}$ are proportional to said reference current and voltage.

$$V_{CTAT}(P,T)=V_{BExn}$$

$$V_{PTAT}(P,T)=V_{BEx1}-V_{BExn}$$

$$I_{CTAT}(P,T)=V_{CTAT}(P,T)/R_{CTAT}$$

$$I_{PTAT}(P,T)=V_{PTAT}(P,T)/R_{PTAT}$$

$$I_{BG}(P)=I_{PTAT}(P,T)+I_{CTAT}(P,T)$$

$$V_{BG}(P)=I_{BG}(P)*R_{BG}<1V$$

The $VR_{CTAT}$ is the variable resistor to tune the CTAT current. The $V_{ctl\_ctat}$ is the control voltage for the $VR_{CTAT}$. The $VR_{PTAT}$ is the variable resistor to tune the PTAT current. The $V_{ctl\_ptat}$ is the control voltage for the $VR_{PTAT}$. The general variable resistor VR is as shown FIG. 21.

In the process self-compensation bandgap reference, as shown in FIG. 21, we will use the resistor in parallel with one MOS to emulate the tunable variable resistance. There are two kinds of tunable variable resistors. As shown in FIG. 21A, it is the NMOS type variable resistor. As shown in FIG. 21B, it is the PMOS type variable resistor. The VR is constant during the temperature variation. However, VR will vary according to the variance of the process. We need to trace the source voltage of the MOS and apply the correct gate voltage to keep the $V_{GS}$ to be constant over temperature.

As shown in FIG. 19, the tuning voltage is taken out from the $I_{BG}(P)$ where P is process and $I_{BG}(P)$ is the function of process. In other words, as the $I_{BG}$ is larger, the variable resistor VR is needed to become larger and the MOS should be switched off a little bit. We need to tune the variable resistor VR according to the $I_{BG}$.

As $V_{BE}(SS,T)$ is large, the $I_{BG}(SS)$ is small, where SS is the Slow-P-Slow-N corner and T is temperature. We need to have smaller resistors VR in the core of the bandgap mechanism for Slow-P-Slow-N corner.

As $V_{BE}(FF,T)$ is large, the $I_{BG}(FF)$ is small where FF is the Fast-P-Fast-N corner. We need to have the larger resistors VR in the core of the bandgap mechanism for the Fast-P-Fast-N corner.

Due to the Process-Voltage-Temperature-Humidity (PVTH) design, we have to referring all the voltage and current to $V_{BG}$ or $I_{BG}$. To generate the VR which is proportional to the $I_{BG}$, we need the current or voltage which is conjugate to the $I_{BG}$. As $I_{BG}$ increases, the conjugate current or voltage will decrease. However, as all the voltage or current are referred to $I_{BG}$, it cannot generate the current which is conjugate to $I_{BG}$, In other words, as the $I_{BG}$ increases, all the voltage or current increases. There is no current decreases as IBG increases, or vice versa. Therefore, we need to use the conjugate VR as shown in FIG. 22A or FIG. 22B.

The variable resistance is reverse proportional to the variation of said reference voltage and reference current. The variable resistors is linear switch being parallel with resistor. As the reference voltage and current increase, the linear switch is reverse proportional to linearly switch off to increase the resistance of the variable resistor.

FIG. 22A is the NMOS type VR; FIG. 22B is PMOS type VR. As $I_{BG}$ increases, the variable resistance VR resistance increases as shown in FIG. 22C. The dotted line means the nodes voltage are equal without the physical connection. It will be implemented with the OPAMP feedback comparator circuits.

FIG. 23 shows the actual implementation of the variable resistors. Referring to FIG. 20, as shown in FIG. 23A, it is the $VR_{CTAT}$; as shown in FIG. 23B, it is the $VR_{PTAT}$.

As shown in FIG. 11, for the $fo=1/(LC)^{1/2}$, the self-compensation for the toroid has both process compensation and temperature compensation. However, for the process compensation, we might have the $f_o$ shift due to the variation of the process. We might further need to use the frequency programming with the field programming the divider to compensate for the process compensation.

For the temperature compensation, we are in safe margin $<<1$ ppm. Fortunately, the customer asks for ppm is for the variance of $\Delta f/f$.

The general equation for the LC variation due to the thickness variation of the $SiO_2$ is $$(L+\Delta L)(C+\Delta C)=LC(1+\Delta L/L)(1+\Delta C/C)=LC(1+\Delta d/d)$$
$$(1-\Delta d/d)=1-(\Delta d/d)^2$$

$$[(L+\Delta L)(C+\Delta C)]^{1/2} \sim [1-(\Delta d/d)^2+\tfrac{1}{4}(\Delta d/d)^4]=1-(\tfrac{1}{2})(\Delta d/d)^2$$

$$1/(fo+\Delta f) \sim [1+(\tfrac{1}{2})(\Delta d/d)^2]$$

$$\Delta f/f \sim (\tfrac{1}{2})(\Delta d/d)^2$$

The Properties of Silicon Dioxide (SiO2) Linear Coefficient of Thermal Expansion, $$(\Delta d/d)/\Delta T \text{ (1/deg C) is } 5 \times 10^{-7}.$$

So, for the 100 degrees temperature variation, the $$\Delta f/f \sim (\tfrac{1}{2})(\Delta d/d)^2 = (100 \times 5 \times 10^{-7})^2 = 2.5 \times 10^{-9} < 1$$
$$\text{ppm}=1 \times 10^{-6}$$

Therefore, we don't worry the temperature variation to the LC.

For the process variation, assume $(\Delta d/d)=\tfrac{1}{2}$, then we have $$\Delta f/f \sim (\tfrac{1}{2})(\Delta d/d)^2 = \tfrac{1}{8}$$

It is a lot. Frequency Programming can cover the Process Variation with the Capacitor Array or Divide Ratio.

It is interesting to know how much process variance is allowed for 1 ppm $$\Delta f/f \sim (\tfrac{1}{2})(\Delta d/d)^2 \sim 1 \times 10^{-6}$$

$\Delta d/d \sim 1 \times 10^{-3}$ is allowed for the variance of the process to have the 1 ppm from the idealized $f_o$ If the $f_o$ is allowed to be 1% variance from the idealized $f_o$ $$\Delta f/f \sim (\tfrac{1}{2})(\Delta d/d)^2 \sim 1 \times 10^{-2}$$

$$\Delta d/d \sim 1 \times 10^{-1}$$

only 1 tenth from the idealized thickness.

Therefore, the automatic frequency programming might be developed for the accurate clock.

[1] we can use the programmable divider to divide to the closest frequency what we need.

[2] we can use the frequency programming techniques to adjust the C array to have the frequency what we need, too.

Input the reference clock, the counter automatic programs the capacitor array and divide ratio. With the automatic frequency programming, we might have the field programmable and frequency-programmable frequency Xtaless ClockChip.

Since the self-adaptive process and temperature, the Frequency Programmable Xtaless ClockChip (FPXC) is independent of the variation of the process and temperature. Therefore, the Frequency Programmable Xtaless ClockChip (FPXC) can be the field and frequency programmable at any temperature without the burner.

Figure 24:
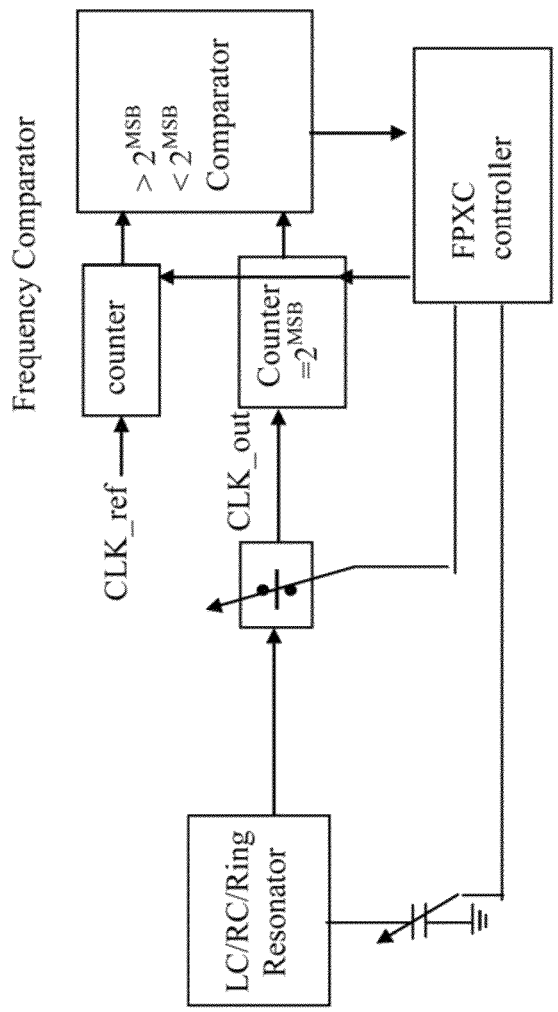
FIG. 24 is the block diagram for the frequency programmable xtaless clock.
Figure 25:
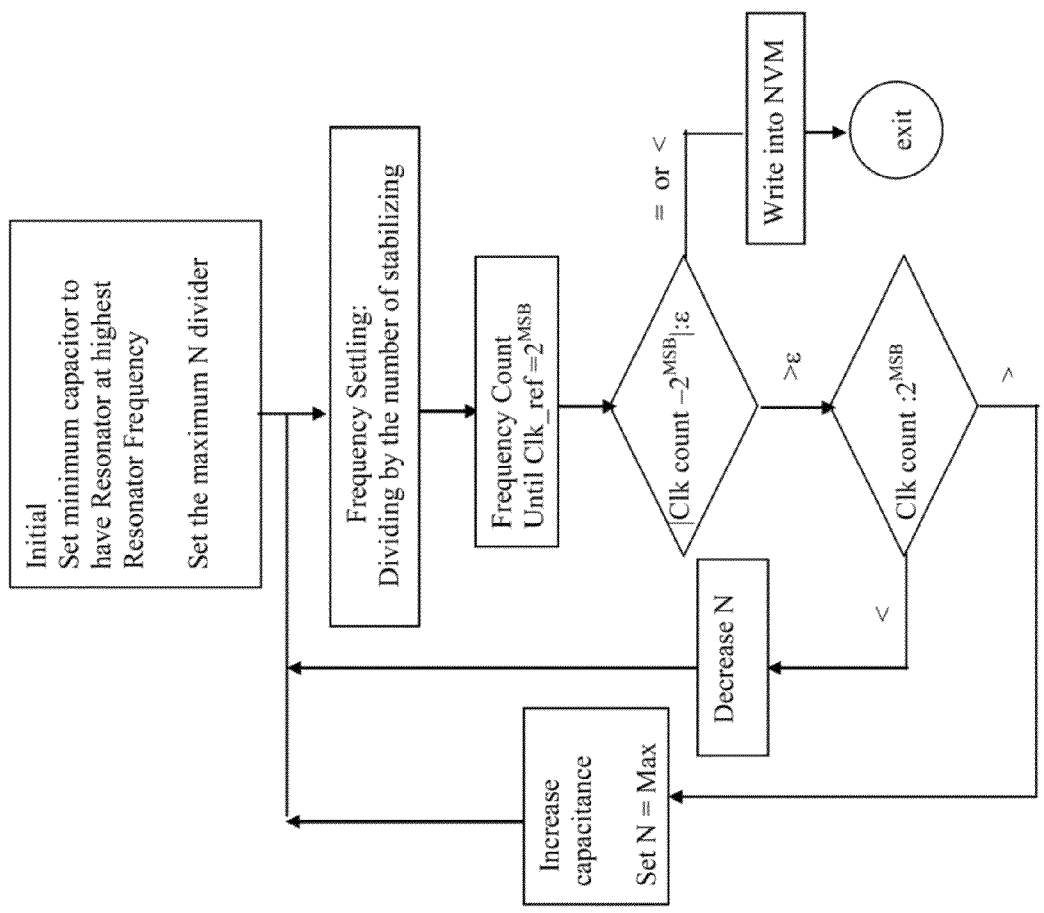
FIG. 25 is the flow diagram of the frequency programmable xtaless clock.

As shown in FIG. 24, the FPXC controller can make the adjustment of the frequency with adjusting capacitor $C_f$ and/or the divider ratio to have the clock frequency of the CLK_out being equal to the clock frequency of the CLK_ref. The flow chart of the algorithm is shown in FIG. 25. The principle of the algorithm is the VCO having much more numbers of bits to have the fine control for the oscillation frequency. The larger the divider is, the smaller jitter will be. Therefore, the algorithm will find the largest divider then make the fine tune for the resonant frequency. In FIG. 24, the FPXC controller executes the heuristic algorithm as shown in FIG. 25 until the optimum CLK_out is found. As the optimum CLK_out frequency is found, the set for the oscillator capacitor array and the set for the divider will be stored in the Non-Volatile Memory NVM. The FPXC NVM and the FPHA NVM can share the same NVM programming mechanism.

Figure 26B:
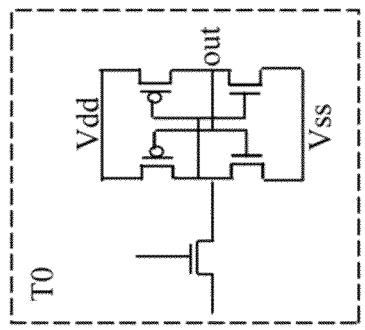
FIG. 26(A) is the SRAM-type basic structure of look-up-table (LUT) and programmable connectivity switch for the configurable logic block (CLB); (B) is SRAM-type look-up-table (LUT) memory; (C) is the SRAM-type switch.
Figure 26C:
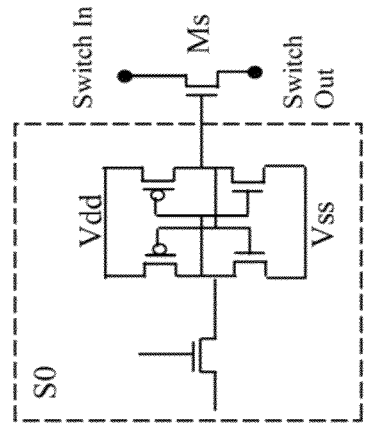
Figure 26A:
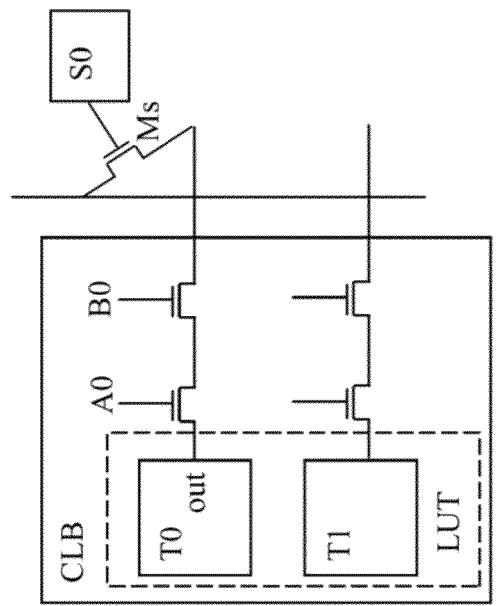

As shown in FIG. 26A, it is the SRAM type FPHA embedded in a single chip of Field Programmable System Chip (FPSC™). The Configurable Logic Block(CLB) has the Look-Up-Table LUT T0, T1, etc and the connectivity switch S0, etc are made of the SRAM. As the system is powered up, the controlling bits are downloaded from the NVM chip. It is the two-chip solution. As shown in FIG. 26B, it is the memory bit in the Look-Up-Table T0. The output sends out the value of the Look-Up-Table of the logic table as the corresponding logic value is selected. As shown in FIG. 26C, it is the SRAM switch. The programmable bit is stored in the SRAM and the SRAM bit turns on or turn off the switch.

As shown in FIG. 27, it is to show the circuit device configuration of the flash type FPHA embedded in a single chip of Field Programmable System Chip(FPSC™). A system design on chip comprises the flash switch. The flash switch has the isolated gate to store charges. The flash switch further comprises a charging and discharging plate. The electron charges are able to transfer from or transfer to the charging and discharging plate to the isolated gate.

The same methodology can be extended from the flash switch to the flash memory. A system design on chip comprises flash memory. The flash memory comprises PMOS and NMOS in inverter connection. The gates are isolated to store charges. The flash memory further comprises a charging and discharging plate. The electron charges are able to transfer between the charging and discharging plate and the isolated gate.

The detailed structures of the flash device are illustrated from FIG. 28 to FIG. 39 and FIG. 44. The Configurable Logic Block(CLB) has the Look-Up-Table LUT T0, T1, etc and the connectivity switch Ms, etc are made of the flash device. As the system is powered down, the controlling bits are still there. It is the single-chip solution. As shown in FIG. 27B, it is the memory bit in the Look-Up-Table T0. The output sends out the value of the Look-Up-Table of the logic table as the corresponding logic value is selected. As shown in FIG. 27C, it is the flash switch. The programmable bit is stored in the flash bit itself and the flash bit turns on or turn off the switch. The memory is stored in the isolation gate. All the gates are connected together to be an isolated node.

For the flash switch of flash memory, the charging plate Pc comprises a peak; the isolated gate Pi comprises another peak means. The charging plate peak transfers electron charges from charging plate means to isolated gate means. The isolated gate peak transfers charges from the isolated gate to said charging plate Pc. The peaks also can be edges of charging plate means and isolated gate.

The flash switch and flash memory further comprises a sensing device. The sensing device has the isolated gate been in common with the isolated gate of the flash switch and flash memory. The sensing device senses the state of the flash switch or flash memory.

Figure 27H:
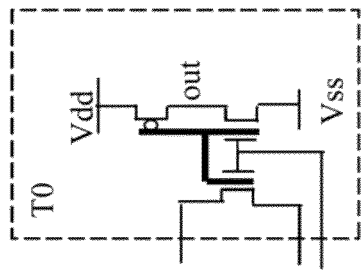
Figure 27I:
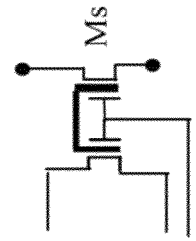
Figure 27F:
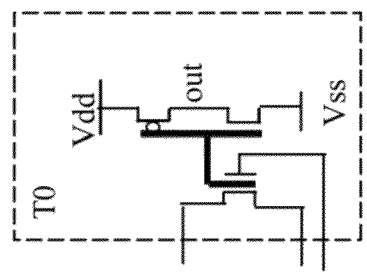
Figure 27G:
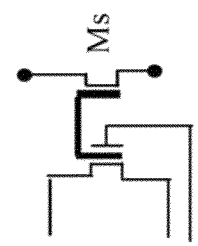
Figure 27D:
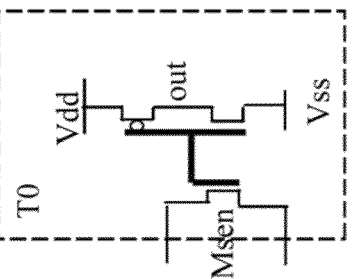
Figure 27E:
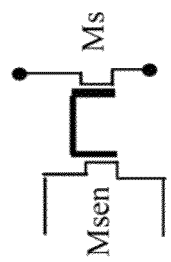

FIG. 27D is the content of the flash memory can be read back. The state of the memory can be read back with the sense MOS Msen. FIG. 27E is the flash switch having the sense MOS Msen for read back. FIG. 27F is the flash memory being able to be selected to read back and write in. FIG. 27G is the flash switch being able to be selected to read back and write in. FIG. 27H is the flash memory being able to be selected to read back and write in symmetrically. FIG. 27I is the flash switch being able to be selected to read back and write in symmetrically.

As shown in FIG. 28A, it is the two-way charging and discharging mechanism. Both plates have the peak to discharge the electrons. As shown in FIG. 28B, the peak of charging plate Pc and the peak of the isolation plate Pi are at different locations. The edges can serve as the peaks, too. As shown in FIG. 28C, there is another bias plate Pb to help the two-way charging and discharging process.

The flash switch and flash memory further comprises a bias plate. The isolated gate is between the bias plate and the charging plate. The bias plate helps the two-way charge transferring between the isolated gate and charging plate.

As shown in FIG. 29A, it is the charging process. The bias plate Pb is at the negative potential. The charging plate Pc is at the positive potential. The electrons of the isolation plate Pi inject into the charging plate. As shown in FIG. 29B, as the external voltage resources are removed, the positive charges are left on the isolated plate Pi.

As shown in FIG. 30A, it is the discharging process. The bias plate Pb is at the positive potential. The charging plate Pc is at the negative potential. The electrons of the charging plate Pc inject into the isolated plate Pi. As shown in FIG. 30B, as the external voltage resources are removed, the negative charges are left on the isolation plate Pi.

Figure 31B:
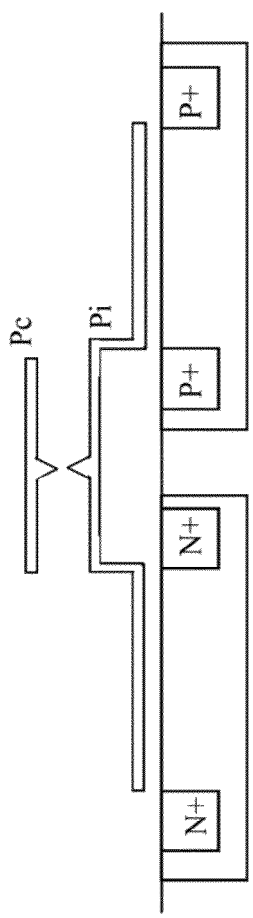
Figure 31C:
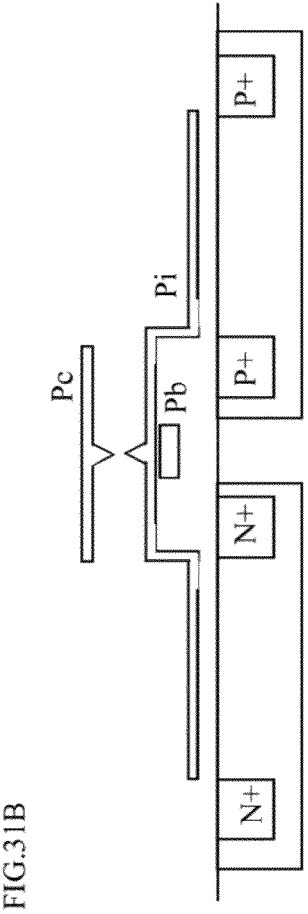
Figure 31D:
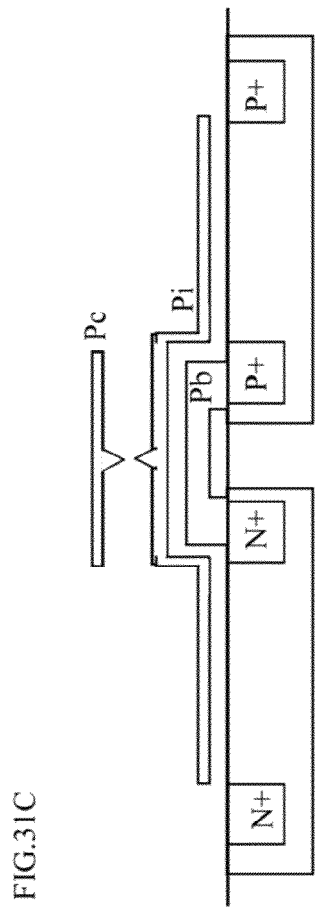

As shown in FIG. 31A, it is the inverter type flash memory. FIG. 31B is the section view of the inverter type flash memory. The gate is corresponding to the isolated plate Pi. The external connection is corresponding to the charging plate Pc. FIG. 31C is the inverter type flash memory having the biasing plate Pb. FIG. 31D is to have the output node to serve as the biasing plate Pi.

As shown in FIG. 32A, it is the inverter type two-way flash memory. FIG. 32B is the section view of the inverter type two-way flash memory. The gate is the corresponding to the isolated plate Pi. The external connection is corresponding to the charging plate Pc. FIG. 32C is the inverter type two-way flash memory haying the biasing plate Pb. FIG. 32D is to have the output node to serve as the biasing plate Pi.

As shown in FIG. 33A, it is the inverter type single-side two-way flash memory. FIG. 32B is the section view of the inverter type single-side two-way flash memory. The gate is the corresponding to the isolated plate Pi. The external connection is corresponding to the charging plate Pc. The edges serve as the peak. FIG. 32C is the inverter type single-side two-way flash memory having the biasing plate Pb. There are peaks to have more electrons charging and discharging effect.

The flash switch can be further modified to be a NVM memory. As shown in FIG. 34A, it is the inverter type single-MOS two-way flash memory. The NVM comprises an inverter, a lock P device $M_L$ initial P device Mi to be a flash memory. The inverter means reads the output of the flash switch and controlling the lock P device $M_L$. Cooperating with said flash switch, it locks the state of the flash memory. The initial P device Mi initializes the state of the flash memory. FIG. 32B is the section view of the inverter type single-MOS two-way flash memory. The gate is corresponding to the isolated plate Pi. The external connection is corresponding to the charging plate Pc. The edges serve as the peak. FIG. 32C is the inverter type single-MOS two-way flash memory having the biasing plate Pb. There are peaks to have more electron charging and discharging effect.

Figure 35B:
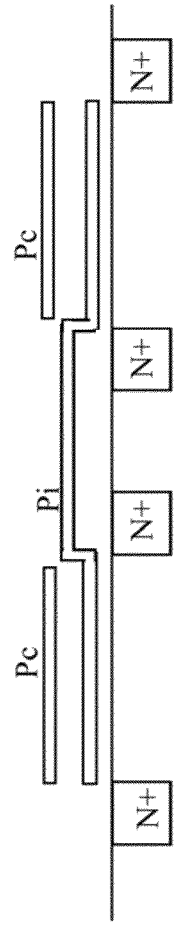
Figure 35C:
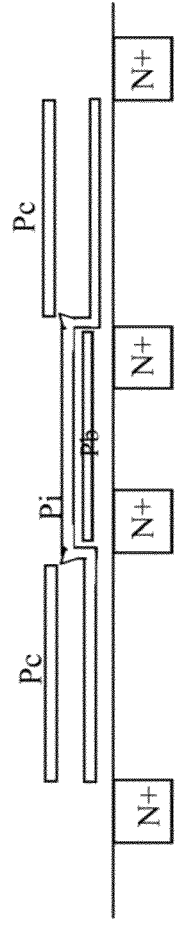

As shown in FIG. 35A, it is the two-way symmetric flash switch. FIG. 35B is the section view of the two-way symmetric flash switch. The gate is corresponding to the isolated plate Pi. The external connection is corresponding to the charging plate Pc. The edges serve as the peak. FIG. 35C is the two-way symmetric flash switch having the biasing plate Pb. There are peaks to have more electron charging and discharging effect.

As shown in FIG. 36A, it is the two-way symmetric flash switch. FIG. 36B is the section view of the two-way symmetric flash switch. The gate is the corresponding to the isolated plate Pi. The external connection is corresponding to the charging plate Pc. FIG. 36C is the two-way symmetric flash switch having the biasing plate Pb. There are peaks to have more electron charging and discharging effect. In FIG. 36D, the edges serve as the peak.

As shown in FIG. 37A, it is the two-way symmetric flash switch with selection. FIG. 37B is the section view of the two-way symmetric flash switch with selection. The gate is corresponding to the isolated plate Pi. The charging plate Pc injecting charges to charge and discharge the isolation plate Pi. The peaks are two-way charging and discharging peaks. The two-way symmetric flash switch having the biasing plate Pb. There are peaks to have more electrons charging and discharging effect. FIG. 37C is the two-way peaks are interlaced located at the different position. FIG. 37D is the two-way peaks are located at the ends of the charging plate Pc and isolation plate Pi separately with the edges being the peaks, too.

FIG. 38A is the Single Chip Single Memory EEPROM Process Flash Memory FPHA Chip embedded in a single chip of Field Programmable System Chip(FPSC™). In the upper level, it is the flash switch in the flash Memory Architecture. In the lower level, it is the flash memory cells and flash switches. FIG. 38B is the NAND cell type structure. The switching switch and the isolate switch are interlaced in the NAND flash memory. The isolated switch is in the unconnected state after the programming. FIG. 38C is the NOR cell type flash switch structure. The switching switch and the isolate switch are interlaced in the NOR flash memory. The isolated switch is in the unconnected state after the programming.

FIG. 39A is the Single Chip Single Memory CMOS Process Flash Memory FPHA Chip embedded in a single chip of Field Programmable System Chip(FPSC™). The gate of the CMOS Process flash memory is isolated gate. As shown in FIG. 39B, to inject the charge into the isolated gate, there are several different ways such as charging capacitors and/or charging peaks. In the upper level, it is the flash Memory Architecture. In the lower level, it is the flash memory cells of flash switch. As shown in FIG. 39C, the flash switch can be as simple as a flash device. As shown in FIG. 39D, it is the NAND cell type structure. FIG. 39E is the NOR cell type structure. The isolated switch is in the unconnected state after the programming.

To reduce the on-resistance of the programmable switch, as shown in FIG. 40A, the charging pump supplies the extra-high voltage to the programmable switch to reduce the on-resistance of the programmable switch. FIG. 40B is the charging pump supplies the high voltage to the SRAM to supply the high voltage to the programmable NMOS switch to reduce the on-resistance of the programmable NMOS switch. FIG. 40C is the charging pump supplies the extra high voltage to the flash switch to supply the extra high voltage to the programmable flash switch to reduce the on-resistance of the programmable flash switch.

The FPHA (Field Programmable Hybrid Array) are for the SDOC(System Design On Chip) of the high frequency and high-speed data embedded in a single chip of Field Programmable System Chip(FPSC™). The high frequency needs the pipeline ADC(Analog to Digital Converter) and synchronization. The high-speed SerDes (Series and De-Series) data needs the synchronization to sample the data. Both of them need the PLL to recover the data. However, there is one characterization for the data recovery problem. There is the information about what the data frequency is. It is no need for the blind search of the frequency. Without the blind search, then there is no need for PLL. PLL is for the blind search.

The LC resonator has the characteristics that it can serve as the CDR(Clock Data Recovery) without the blind search. Therefore, the CDR with LC resonator is a PLLess CDR, i.e., the CDR without PLL. As shown in FIG. 41A, it is the PLLess CDR. The VCO sends the clock to the sampler to sample the data. According to the sampling results, the control signals are sent back to the VCO to adjust the phase and frequency of the VCO. As shown in FIG. 41B, the VCO is made of the LC resonator. The great of the LC resonator is the phase and frequency can be controlled separately. The phase and frequency become the orthogonal properties being able to adjust independently. In the conventional PLL, the phase and frequency cannot be adjusted independently. The phase is the integration of the frequency. The integration relation between the phase and the frequency causes the oscillatory phenomena and long settling time problems of the CDR.

A system design on chip comprises a PLLess CDR. The PLLess CDR comprises a sampler sampling data and getting early and late information. The early and late information feedbacks to the self-adaptive resonator to adjust the phase and frequency of the self-adaptive resonator. The self-adaptive resonator can adjust phase and frequency separately. As shown in FIG. 41A and FIG. 41B, the control signals Ph+ and Ph− are to adjust the phase; the control signals $V_{ctlp}$ and $V_{ctln}$ are to adjust the frequency. It is instant lock for the first phase with the LCO phase adjustment. The second phase difference is due to the difference of the frequency. Then the frequency control will be triggered to make the fine tune of the capacitor array or varactor diode for the frequency adjustment. Furthermore, with the LC resonator to lock at the standard specified frequency initially, the LC resonator has the fast start-up ramping time to start with the correct oscillation frequency. It doesn't need the traditional dual loop PLL to lock with the external crystal clock to start at the correct frequency. The LC resonator is automatically to start with the default correct frequency. Then, only with a minor correction of the frequency and phase with the sampling Information such as sampling early and sampling late, then the LC VCO can fast lock to recover the clock and data.

Furthermore, with the Field Programmable Frequency Programming capability of the FPXC to have the Output Programming clock, the LC VCO can be specified The previous setup frequency of the LCO can be adjusted for different standards in the field. It is great for the FPXC to apply in the FPHA's SDOC platform) embedded in a single chip of Field Programmable System Chip(FPSC™).

Figure 42A:
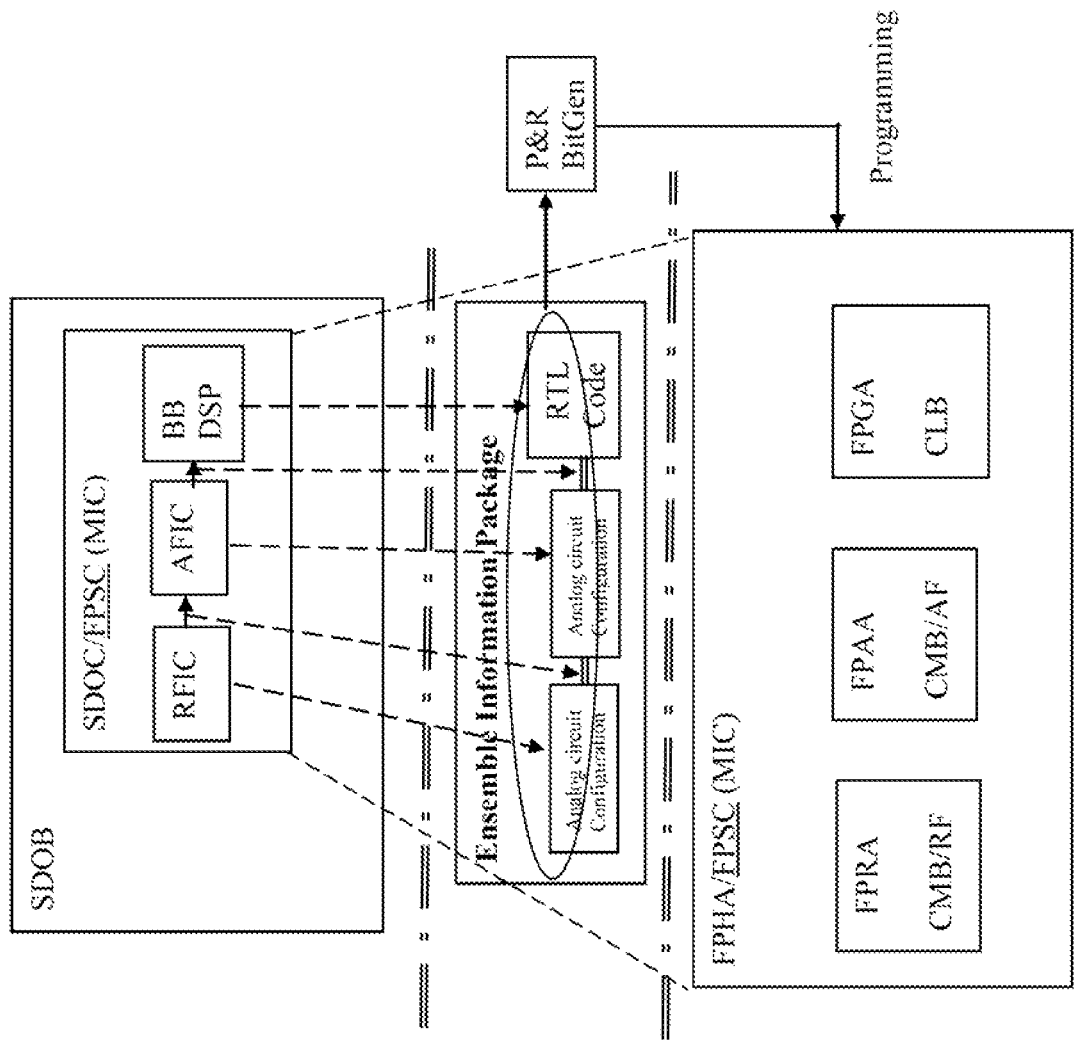
Figure 42B:
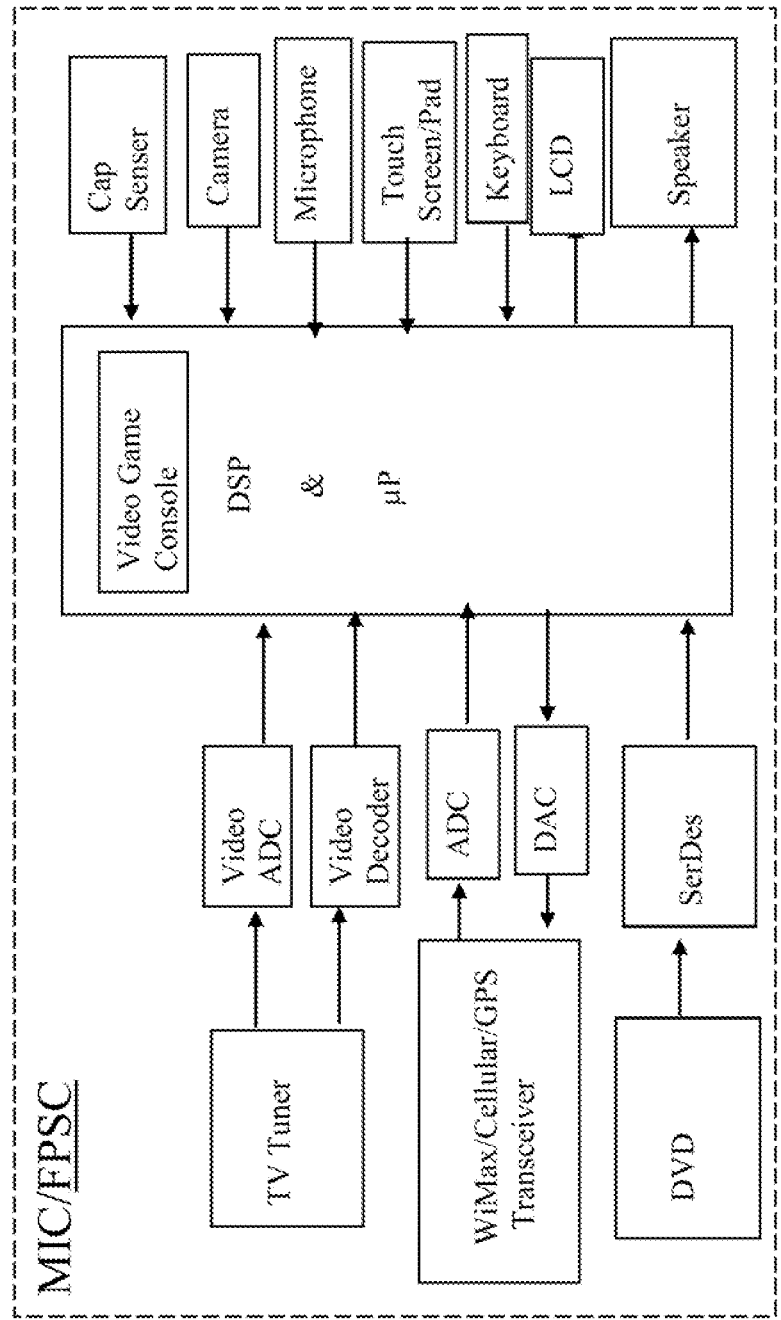

To illustrate the Tang System's System Design On Chip with the Field Programmable Hybrid Array(FPHA)) embedded in a single chip of Field Programmable System Chip (FPSC™), as shown in FIG. 42A, the Automobile Infotainment Center(AIC) is adopted. Without the FPHA embedded in a single chip of Field Programmable System Chip (FPSC™), the AIC is bulky. With the FPHA, the AIC is converted to be the cute MIC(Mobile Infotainment Center). The Automobile Infotainment Center(AIC) is the product for after-sale market. After the customer buy the car, the customer buys the AIC to install in the car. With the AIC, the customer can view the TV, surf the Internet, etc in the car. However, with the system design on board (SDOB), the AIC is bulky in two boxes. To reduce the AIC size, the only way is to use the SDOC on FPHA embedded in a single chip of Field Programmable System Chip(FPSC™). With the SDOC on FPHA embedded in a single chip of Field Programmable System Chip(FPSC™), the site of the Automobile Infotainment Center(AIC) is reduced that the AIC becomes the Mobile Infotainment Center(MIC). The customer can carry the MIC around for personnel entertainment and information center during his business trip, etc. As shown in FIG. 42B, the Automobile Infotainment Center(AIC) has the TV, Internet, Video Game, Cellular Phone, Camera, Karaoke, etc multiple entertainment and communication functions. The complex functions needs to make the optimum partition between the chips and FPHAs embedded in a single chip of Field Programmable System Chip(FPSC™). A system design on chip embedded in a single chip of Field Programmable System Chip(FPSC™) comprises a system design on chip methodology being compatible with a system design on board methodology. As shown in FIG. 42A, the unified system design environment includes both the SDOB and SDOC. With the same design environment, as the components are outside the SDOC/FPHA, they are chips. As the components are inside the SDOC/FPHA embedded in a single chip of Field Programmable System Chip(FPSC™), they are modules. The SDOC is the software design platform which is compatible with the SDOB design environment. FPHA embedded in a single chip of Field Programmable System Chip(FPSC™) is the hardware chip which is compatible with the other chips in the PCB hardware environment. This is the unified SDOC/SDOB design and FPHA/PCB hardware platform. The software will make the automatic check to see whether the components can be loaded FPHA and located in the SDOC embedded in a single chip of Field Programmable System Chip(FPSC™). If there are no such compatible module for the component or no resource being allocated to this component, the software will make the red flag for warning.

A system design comprises the filmless touching screen means. The filmless touching screen having conductive layer being deposed in touching screen. To be in one single layer, the conductive layer can be in one dimensional. To detect coordinate of touching position of the touching screen, the single layer one dimensional capacitance detector means comprises a charging switch and a discharging switch at the two ends of the conductive layer. The charging switch charges the conductive layer. The discharging switch discharges the conductive layer to detect the voltage variance over time to detect the coordinate of touching position.

As shown in FIG. 42B, there is the capacitive sensor detector circuit. To avoid the scratch and bubbles, etc problems of the covering film, the conductive layer has been better to be embedded in the screen directly to be the filmless touch screen. As shown in FIG. 42C is the capacitive sensor having the conductive layer being shallow doped in the screen plate directly. As shown in FIG. 42D, the conductive layer is the two-dimensional array. It needs the accurate depth control for the two layers doping. As shown in FIG. 42E, the conductive layer is the one-dimension capacitive sensor detector. It doesn't have the accurate depth control problem. However, the coordinate decoding needs to have the calculation algorithm to calculate the coordinate. FIG. 42F is the alternative design of the one-dimension capacitive sensor detector. There are many different ways to detect the coordinates of the touching position. FIG. 42F, FIG. 42G and FIG. 42H show one way of the capacitance sensing implementation. As shown in FIG. 42F, the finger, etc touches on the screen. The total zigzag linear distance between the sensing corner and the touching position is $\Delta L$. As shown in FIG. 42G, the charging switch Sc first closes to charge up the one-dimensional conductor layer to a constant level of voltage. Then the charging switch Sc opens and the discharge switch Sd closes to discharge the charge stored in the one-dimensional conductor layer. The charges flows through the sensing resistor Rsen. As shown in FIG. 42H, as the finger charge flows through the Rsen, there is a voltage bump at time difference $\Delta T$ due to the extra large amount charge stored at the linear distance $\Delta L$. The time difference $\Delta T$ is correspondent to the distance $\Delta L$. From the distance $\Delta L$ and the zigzag pattern of the conductive layer, we can calculate the coordinate of the finger touching position.

The FPHA SDOC embedded in a single chip of Field Programmable System Chip(FPSC™) is the large mixed signal chip of Radio, Analog and Digital signal. The analog and radio signal is very sensitive to the substrate noise. We need to have very good isolation technique for the switching noise of the digital signal. As shown in FIG. 43A, to minimize the substrate noise, the global power planning for noise isolation is very important. The P-type LDVR having I=const current source is very important to have $L(di/dt)=0$. To keep the constant voltage for analog circuit, the N-type LDVR voltage V=const voltage source is important. To minimize the digital circuit power consumption, the digital power is reduced to be 1.2V only. As shown in FIG. 43A and FIG. 43B, to increase the power efficiency, the on-chip inductorless switch mode power supply (Indless SMPS) using the on-chip inductor as shown in FIG. 45 to covert the power from 3V to 1.2V.

The I/O portion power supply is separated from the global chip power and supply and is not connected to the substrate. The I/O has the serious ground bounce and power surge problem due to the crowbar shorting current. To minimize the ground bounce in I/O, as shown in FIG. 44A, the unidirectional device is only way to minimize the ground bounce. As shown in FIG. 44B, the two-way unidirectional flash device is used to minimize the FPHA ground bounce embedded in a single chip of Field Programmable System Chip(FPSC™).

As shown in FIG. 45, the miniature Inductor is very important for the Field Programmable Radio Array (FPRA), Frequency Programmable Xtaless Clock (FPXC) and Field Programmable Power Supply(FPPS). The miniature Inductor doesn't have the Electromagnetic Interference EMI to other circuits on the same chip and the occupied chip area is tiny. As shown in FIG. 43A, FIG. 43B and FIG. 45, the Inductorless Switch Mode Power Supply (Indless SMPS) is implemented with the miniature Inductor. With the miniature inductor, the switch inductor circuit will play much more important role than the switch capacitor circuit.

In summary, the SDOC on FPHA embedded in a single chip of Field Programmable System Chip(FPSC™) is for the high speed and high frequency streaming data type products. It is the technology revolution for the next century. While the invention has been particularly shown and described with reference to the preferred embodiments thereof, it will be understood by those skilled in the art that various changes in form and details may be made therein without departing from the spirit and scope of the invention.

We claim:

1. A Field Programmable System Chip (FPSC) comprising Field Programmable Hybrid Array (FPHA) means being a single chip having hierarchical pipeline structure constitutes of analog/RF front, field programmable pipelining, array means, analog and digital converter means for high speed signal processing, said analog/RF front converting analog/RF signal to be analog signal and forwarding to said analog and digital converter means and receiving analog signal from said analog and digital converter means and converting to be analog/RF signal;

said analog and digital converter means making conversion between analog signals and digital signals for said high speed signal processing, said pipelining array means having arrays in pipelined structure to make the faster high-speed signal processing with a pipelining signal flow for said high speed signal processing;

said analog and digital converter means transmitting digital signal to said pipelining array means and receiving high speed digital data from said pipelining array means, said pipelining array means, analog and digital converter means having field programmable capabilities to reconfigure circuits;

said hierarchical pipeline structure having pipeline structures in architecture, system, connection and circuit levels.

2. A Field Programmable System Chip (FPSC) comprising Field Programmable Hybrid Array (FPHA) means being a single chip according to claim 1 further comprising switch box means to switch and transmit signals, said switch box means connecting analog signals and digital signals from nodes to other nodes, said switch box means being made of said analog buffers, digital buffers and programmable connections to be switch box for analog signals and digitals signals.

3. A Field Programmable System Chip (FPSC) comprising Field Programmable Hybrid Array (FPHA) means being a single chip according to claim 1 further comprising field programmable switching means for switching a plurality of switch means with field programming;

said field programmable switching means being programmed to have field programmable connections of said analog signals and digital signals for said pipelining array means, analog and digital converter means.

4. A Field Programmable System Chip (FPSC) comprising Field Programmable Hybrid Array (FPHA) means being a single chip according to claim 3 of which said field programmable switching means being flash device means, said flash device means comprising a first isolated gate storing charge to switch said switch means;

a charging transfer means transferring charges to said first isolated gate means.

5. A Field Programmable System Chip (FPSC) comprising Field Programmable Hybrid Array (FPHA) means being a single chip according to claim 4 of which said field programmable switching means further comprising sharp peak means between said first isolated gate means and charging transfer means;

said sharp peak means generating strong local electrical field;

with said strong local electrical field, electrical charges being much easier transferred through said sharp peak means between said first isolated gate means and charging transfer means.

6. A Field Programmable System Chip (FPSC) comprising Field Programmable Hybrid Array (FPHA) means being a single chip according to claim 5 further comprising bias plate means;

said first isolated gated gate means being located between said bias plate means and said charging transfer means; said bias plate means being in opposite charging state of said charging transfer means;

with electrical field between said bias plate and charging transfer means, electrical charges being transferred from and to said first isolated gate means with much lower programming voltages.

7. A Field Programmable System Chip (FPSC) comprising Field Programmable Hybrid Array (FPHA) means being a single chip according to claim 5 further comprising sensing device means for sensing state of said field programmable switch means, said sensing device means having a second isolated gate means being connected to said first isolated gate means to read back programming data being stored in said first isolated gate means of said flash device means.

8. A Field Programmable System Chip (FPSC) comprising Field Programmable Hybrid Array (FPHA) means being a single chip according to claim 1 further comprising self-adaptive bandgap reference generators;

said self-adaptive bandgap reference generator providing temperature and process compensated reference current and temperature and process compensated reference voltage to said analog and digital converter means, said self-adaptive bandgap reference generator adopting self-adaptive dynamic system further comprising dynamic state structure;

adjusting said dynamic state structure, said temperature, process compensated reference current and temperature, and process compensated reference voltage being varied to adapt to temperature and process variance.

9. A Field Programmable System Chip (FPSC) comprising Field Programmable Hybrid Array (FPHA) means being a single chip according to claim 8 of which said dynamic state structure of said self-adaptive bandgap reference generator being varying resistance resistors in said self-adaptive bandgap reference generator, said varying resistance resistors being able to adjust resistance according to control.

10. A Field Programmable System Chip (FPSC) comprising Field Programmable Hybrid Array (FPHA) means being a single chip according to claim 9 of which said varying resistors being located in the branches of CTAT and PTAT currents;

said varying resistor being controlled by feedback of self-adaptive bandgap reference current.

11. A Field Programmable System Chip (FPSC) comprising Field Programmable Hybrid Array (FPHA) means being a single chip according to claim 8 further comprising a self-adaptive clock generator to provide temperature and process compensated reference clock to said analog and digital converter means and said pipelining array means, said self-adaptive clock generator further comprising self-adaptive bandgap reference generator and oscillator means, said self-adaptive bandgap reference generator sending self-adaptive voltage reference and self-adaptive voltage reference to said oscillator means to generate said temperature and process compensated reference clock;

said self-adaptive clock generator using said temperature and process compensated reference current and temperature and process compensated reference voltage to generate temperature and process compensated clock with clock frequency being compensated over temperature and process.

12. A Field Programmable System Chip (FPSC) comprising Field Programmable Hybrid Array (FPHA) means being a single chip according to claim 11 of which said oscillator means generating an oscillator to lock with outside reference clock, varying controlling parameters of said oscillator means to lock with said external clock, said controlling parameters being stored in memory means.

13. A Field Programmable System Chip (FPSC) comprising Field Programmable Hybrid Array (FPHA) means being a single chip according to claim 1 further comprising memory means to store programming and configurable data.

14. A Field Programmable System Chip (FPSC) comprising Field Programmable Hybrid Array (FPHA) means being a single chip according to claim 13 of which said memory means being flash device means.

15. A Field Programmable System Chip (FPSC) comprising Field Programmable Hybrid Array (FPHA) means being a single chip according to claim 1 further comprising SerDes (Serializer and DeSerializer) means;

Said SerDes means further comprising CDR (Clock Data Recovering) to recover clock and data from said high-speed digital data stream.

16. A Field Programmable System Chip (FPSC) comprising Field Programmable Hybrid Array (FPHA) means being a single chip according to claim 15 of which said CDR being PLLess CDR, Said PLLess CDR recovering clock and data without phase lock loop(PLL).

17. A Field Programmable System Chip (FPSC) comprising Field Programmable Hybrid Array (FPHA) means being a single chip according to claim 16 of which said PLLess CDR further comprising an oscillator means, said oscillator means being LC resonator having oscillation phase and frequency being independently adjusted according to controlling signals, said LC resonator being preferred to have both amplitude control and common-mode control.

18. A Field Programmable System Chip (FPSC) comprising Field Programmable Hybrid Array (FPHA) means being a single chip according to claim 1 further comprising on-chip multiple level switching power supply to supply power high voltage to program said flash device means, said on-chip multiple level switching power supply being preferred to use on-chip inductor having magnetic guiding shield.

19. A Field Programmable System Chip (FPSC) comprising Field Programmable Hybrid Array (FPHA) means being a single chip according to claim 4 further comprising touch screen, said analog and digital converter means detecting the abrupt rising voltage change of discharging current or abrupt dropping voltage of charging current to detect finger position, said touch screen being preferred to be single layer filmless touch screen.

20. A Field Programmable Hybrid Array (FPHA) means constitutes of a field programmable pipelining array means, and an analog and digital converter means for high speed signal processing, said analog and digital converter means making conversion between analog signals and digital signals for said high speed signal processing, said pipelining array means having arrays in pipelined structure to make the faster high-speed signal processing with a pipelining signal flow for said high speed signal processing;

said analog and digital converter means transmitting digital signal to said pipelining array means and receiving high speed digital data from said pipelining array means, said pipelining array means and analog and digital converter means having field programmable capabilities to reconfigure circuits, analog buffer means to transmit said analog signals, said analog buffer being in pipelined structure comprises a clamping voltage generator and an output clamping driver;

said clamping voltage generator generating a clamping voltage for said output clamping driver to clamp an output of said analog buffer, wherein as an output voltage of said analog buffer becomes equal to an input of said analog buffer, said clamping voltage disabling an output driving means of said output clamping driver, wherein said analog buffer means consumes much less power.

* * * * *